US009812587B2

(12) United States Patent
Yamazaki

(10) Patent No.: US 9,812,587 B2
(45) Date of Patent: Nov. 7, 2017

(54) SEMICONDUCTOR DEVICE AND MANUFACTURING METHOD THEREOF

(71) Applicant: Semiconductor Energy Laboratory Co., Ltd., Atsugi-shi, Kanagawa-ken (JP)

(72) Inventor: Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/001,834

(22) Filed: Jan. 20, 2016

(65) Prior Publication Data

US 2016/0218225 A1    Jul. 28, 2016

(30) Foreign Application Priority Data

Jan. 26, 2015   (JP) .................................. 2015-012200
Jan. 26, 2015   (JP) .................................. 2015-012530

(51) Int. Cl.
*H01L 21/00*    (2006.01)
*H01L 29/786*    (2006.01)
(Continued)

(52) U.S. Cl.
CPC .... *H01L 29/78696* (2013.01); *H01L 27/1225* (2013.01); *H01L 27/1251* (2013.01);
(Continued)

(58) Field of Classification Search
CPC ........... H01L 29/78696; H01L 29/4908; H01L 29/66969
See application file for complete search history.

(56) References Cited

U.S. PATENT DOCUMENTS 5,731,856 A    3/1998   Kim et al.
5,736,435 A    4/1998   Venkatesan et al.
(Continued)

FOREIGN PATENT DOCUMENTS

EP    1737044 A    12/2006
EP    2226847 A    9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Laura Menz
(74) *Attorney, Agent, or Firm* — Fish & Richardson P.C.

(57) ABSTRACT

A miniaturized transistor is provided. A transistor with low parasitic capacitance is provided. A transistor with high frequency characteristics is provided. A semiconductor device including the transistor is provided. A miniaturized semiconductor device includes an oxide semiconductor, the first conductor, the second conductor, the third conductor, the first insulator, and the second insulator. The first conductor is embedded in a region between the second conductor and the third conductor with the first insulator positioned between the first conductor and the region.

7 Claims, 35 Drawing Sheets

(51) Int. Cl.
   *H01L 27/12* (2006.01)
   *H01L 29/45* (2006.01)
   *H01L 29/49* (2006.01)
   *H01L 29/66* (2006.01)

(52) U.S. Cl.
   CPC .......... *H01L 27/1259* (2013.01); *H01L 29/45* (2013.01); *H01L 29/4908* (2013.01); *H01L 29/66969* (2013.01); *H01L 29/7869* (2013.01)

(56) References Cited

U.S. PATENT DOCUMENTS

| | | | |
|---|---|---|---|
| 5,744,864 | A | 4/1998 | Cillessen et al. |
| 6,291,278 | B1 | 9/2001 | Xiang et al. |
| 6,294,274 | B1 | 9/2001 | Kawazoe et al. |
| 6,333,229 | B1 | 12/2001 | Furukawa et al. |
| 6,563,174 | B2 | 5/2003 | Kawasaki et al. |
| 6,673,683 | B1 | 1/2004 | Sheu et al. |
| 6,727,522 | B1 | 4/2004 | Kawasaki et al. |
| 6,841,831 | B2 | 1/2005 | Hanafi et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,101,762 | B2 | 9/2006 | Cohen et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,524,752 | B2 | 4/2009 | Tsutsue |
| 7,674,650 | B2 | 3/2010 | Akimoto et al. |
| 7,732,819 | B2 | 6/2010 | Akimoto et al. |
| 7,989,334 | B2 | 8/2011 | Tsutsue |
| 8,237,166 | B2 | 8/2012 | Kumomi et al. |
| 8,372,198 | B2 | 2/2013 | Seo et al. |
| 8,389,417 | B2 | 3/2013 | Yamazaki et al. |
| 8,421,068 | B2 * | 4/2013 | Yamazaki ........... H01L 27/1225 257/43 |
| 8,421,069 | B2 * | 4/2013 | Yamazaki ............. H01L 21/84 257/43 |
| 8,432,187 | B2 | 4/2013 | Kato et al. |
| 8,501,564 | B2 | 8/2013 | Suzawa et al. |
| 8,547,771 | B2 | 10/2013 | Koyama |
| 8,779,479 | B2 | 7/2014 | Yamazaki et al. |
| 8,809,853 | B2 | 8/2014 | Saito et al. |
| 8,809,854 | B2 | 8/2014 | Isobe et al. |
| 8,823,074 | B2 | 9/2014 | Suzawa et al. |
| 8,916,868 | B2 | 12/2014 | Isobe et al. |
| 8,994,400 | B2 | 3/2015 | Kato et al. |
| 8,995,174 | B2 | 3/2015 | Koyama |
| 9,048,265 | B2 | 6/2015 | Hondo et al. |
| 9,048,323 | B2 | 6/2015 | Yamazaki et al. |
| 9,059,219 | B2 | 6/2015 | Sasagawa et al. |
| 9,064,967 | B2 | 6/2015 | Suzawa et al. |
| 9,209,795 | B2 | 12/2015 | Okamoto et al. |
| 9,455,349 | B2 * | 9/2016 | Suzawa ............. H01L 29/78648 |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 * | 2/2008 | Takechi ............. H01L 29/4908 438/151 |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068037 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2011/0101331 | A1 | 5/2011 | Yamazaki et al. |
| 2011/0114945 | A1 | 5/2011 | Yamazaki et al. |
| 2011/0133177 | A1 * | 6/2011 | Suzawa ............. H01L 27/1225 257/43 |
| 2011/0187410 | A1 | 8/2011 | Kato et al. |
| 2012/0025191 | A1 * | 2/2012 | Yamazaki ........... H01L 21/0237 257/57 |
| 2012/0032163 | A1 * | 2/2012 | Yamazaki ......... H01L 21/02554 257/43 |
| 2012/0248544 | A1 | 10/2012 | Yokoyama |
| 2012/0261734 | A1 | 10/2012 | Saito |
| 2013/0161621 | A1 * | 6/2013 | Isobe ................... H01L 29/78 257/57 |
| 2013/0277676 | A1 * | 10/2013 | Yamazaki ......... H01L 29/78693 257/57 |

(56) References Cited

U.S. PATENT DOCUMENTS

| | | | |
|---|---|---|---|
| 2013/0285050 A1* | 10/2013 | Yamazaki | H01L 29/7869 257/43 |
| 2013/0320332 A1 | 12/2013 | Hondo et al. | |
| 2014/0004656 A1 | 1/2014 | Sasagawa et al. | |
| 2014/0312346 A1 | 10/2014 | Yamazaki et al. | |
| 2014/0339540 A1 | 11/2014 | Takemura | |
| 2014/0361293 A1* | 12/2014 | Yamazaki | H01L 29/78696 257/43 |
| 2015/0008428 A1* | 1/2015 | Yamamoto | H01L 29/7869 257/43 |
| 2015/0011046 A1* | 1/2015 | Tanaka | H01L 29/66969 438/104 |
| 2015/0011048 A1* | 1/2015 | Tanaka | H01L 29/4234 438/104 |
| 2015/0021596 A1* | 1/2015 | Yamazaki | H01L 29/78693 257/43 |
| 2015/0060846 A1* | 3/2015 | Yamamoto | H01L 21/28194 257/43 |
| 2015/0171115 A1* | 6/2015 | Yamazaki | H01L 27/1225 257/43 |
| 2015/0187898 A1 | 7/2015 | Miyairi | |
| 2015/0221754 A1 | 8/2015 | Hondo et al. | |
| 2015/0270402 A1 | 9/2015 | Endo et al. | |
| 2015/0280003 A1 | 10/2015 | Yamazaki et al. | |
| 2015/0280013 A1 | 10/2015 | Yamazaki et al. | |
| 2015/0318359 A1* | 11/2015 | Shimomura | H01L 29/24 257/43 |
| 2015/0348997 A1* | 12/2015 | Sasagawa | H01L 29/78651 257/43 |
| 2015/0349127 A1* | 12/2015 | Kurata | H01L 27/1225 257/43 |
| 2015/0349130 A1* | 12/2015 | Tanemura | H01L 29/7869 257/43 |
| 2015/0372146 A1* | 12/2015 | Shishido | H01L 29/7869 257/43 |
| 2016/0013321 A1* | 1/2016 | Kobayashi | H01L 29/045 257/43 |
| 2016/0043110 A1* | 2/2016 | Atsumi | H01L 27/1225 257/43 |
| 2016/0056179 A1* | 2/2016 | Toriumi | H01L 29/7869 257/43 |
| 2016/0064424 A1* | 3/2016 | Umezaki | H01L 29/7869 257/43 |
| 2016/0149055 A1* | 5/2016 | Yamazaki | H01L 27/10805 257/43 |
| 2016/0155759 A1* | 6/2016 | Yamazaki | H01L 29/7869 257/43 |
| 2016/0155849 A1* | 6/2016 | Noda | H01L 29/7869 257/43 |
| 2016/0155852 A1* | 6/2016 | Yamazaki | H01L 29/7869 257/43 |
| 2016/0163870 A1* | 6/2016 | Ito | H01L 29/7869 257/43 |
| 2016/0172383 A1* | 6/2016 | Nagatsuka | H01L 27/1225 257/43 |
| 2016/0190330 A1* | 6/2016 | Yamazaki | H01L 29/7869 257/43 |
| 2016/0190331 A1* | 6/2016 | Miyake | H01L 29/7869 257/40 |
| 2016/0190346 A1* | 6/2016 | Kawata | H01L 21/67207 257/43 |
| 2016/0211266 A1* | 7/2016 | Kurokawa | H01L 27/1207 |
| 2016/0218225 A1* | 7/2016 | Yamazaki | H01L 29/78696 |
| 2016/0240682 A1* | 8/2016 | Shimomura | H01L 29/7869 |
| 2016/0240684 A1* | 8/2016 | Yamazaki | H01L 29/7869 |
| 2016/0260837 A1* | 9/2016 | Koezuka | H01L 21/02565 |
| 2016/0276487 A1* | 9/2016 | Yamazaki | H01L 29/7869 |
| 2016/0284854 A1* | 9/2016 | Okazaki | H01L 29/7869 |
| 2016/0284856 A1* | 9/2016 | Shimomura | H01L 29/7869 |
| 2016/0284862 A1* | 9/2016 | Yamazaki | H01L 29/78606 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2008-227165 A | 9/2008 |
| JP | 2012-049514 A | 3/2012 |
| JP | 2012-257187 A | 12/2012 |
| JP | 2014-240833 A | 12/2014 |
| JP | 2014-241407 A | 12/2014 |
| WO | WO-2004/114391 | 12/2004 |

OTHER PUBLICATIONS

Asaoka.Y et al., "29.1 Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for Amoled Back Plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced At Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

(56) References Cited

OTHER PUBLICATIONS

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 578-581.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases For Display Aplication", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "Spinel,YbFe2O4, and Yb2Fe3O7 Types of Structures for Compounds in the In2O3 and SC2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07: SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielecric Layers", J. Electrochem. Soc. (Journal of The Electrochemical Society), 2008, vol. 155, No. 12, pp. H1009-H1014.

Ohara.H et al., "21.3:4.0 In. QVGA AMOLED Display Using In—Ga—Zn-Oxide TFTS With a Novel Passivation Layer", SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

(56) References Cited

OTHER PUBLICATIONS

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-IN. AMOLED Display With Driver Circuit Using Amorphous In—Ga—Zn—Oxide TFTS", IDW '09 : Proceedings of the 16th International Display Workshops, 2009, pp. 689-692.

Son.K et al., "42.4L: Late-News Paper: 4 Inch QVGA AMOLED Driven by the Threshold Voltage controlled amorphous GIZO (GaO3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02: Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Chatterjee.A et al., "Sub-100nm Gate Length Metal Gate NMOS Transistors Fabricated by a Replacement Gate Process", IEDM 97: Technical Digest of International Electron Devices Meeting, Dec. 7, 1997, pp. 821-824.

Yagishita.A et al., "High Performance Damascene Metal Gate MOSFET'S for 0.1 ₋ m Regime", IEEE Transactions on Electron Devices, May 1, 2000, vol. 47, No. 5, pp. 1028-1034.

Hisamoto.D et al., "FinFET.A Self-Aligned Double-Gate MOSFET Scalable to 20 nm", IEEE Transactions on Electron Devices, Dec. 1, 2000, vol. 47, No. 12, pp. 2320-2325.

\* cited by examiner

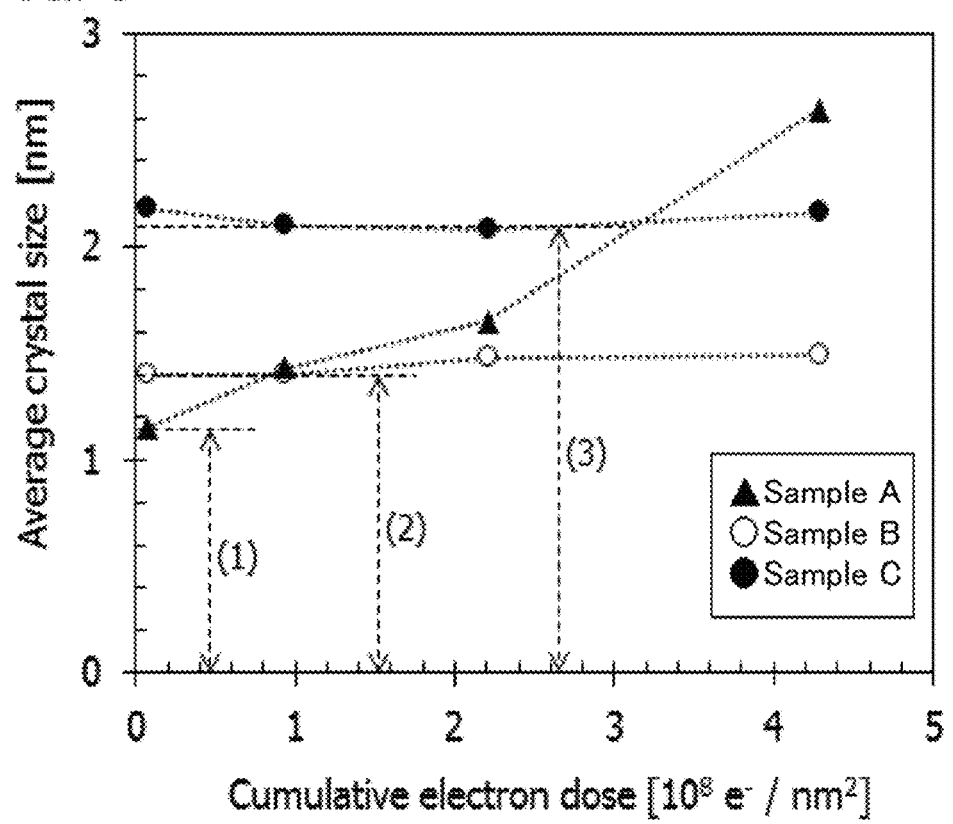

406a, 406b 2100  2200

2100  2200

SEMICONDUCTOR DEVICE AND MANUFACTURING METHOD THEREOF

BACKGROUND OF THE INVENTION

1. Field of the Invention

The present invention relates to a transistor and a semiconductor device, and a manufacturing method thereof, for example. The present invention relates to a display device, a light-emitting device, a lighting device, a power storage device, a memory device, a processor, or an electronic device, for example. The present invention relates to a method for manufacturing a display device, a liquid crystal display device, a light-emitting device, a memory device, or an electronic device. The present invention relates to a driving method of a semiconductor device, a display device, a liquid crystal display device, a light-emitting device, a memory device, or an electronic device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter.

In this specification and the like, a semiconductor device generally means a device that can function by utilizing semiconductor characteristics. A display device, a light-emitting device, a lighting device, an electro-optical device, a semiconductor circuit, and an electronic device include a semiconductor device in some cases.

2. Description of the Related Art

In recent years, a transistor including an oxide semiconductor has attracted attention. An oxide semiconductor can be formed by a sputtering method or the like, and thus can be used for a semiconductor of a transistor in a large display device. In addition, there is an advantage in a transistor including an oxide semiconductor that capital investment can be reduced because part of production equipment for a transistor including amorphous silicon can be retrofitted and utilized.

It is known that a transistor including an oxide semiconductor has an extremely low leakage current in an off state. For example, a low-power CPU and the like utilizing the characteristics that a leakage current of the transistor including an oxide semiconductor is low is disclosed (see Patent Document 1).

A method for manufacturing a transistor including an oxide semiconductor by forming a gate electrode so as to fill an opening is disclosed (see Patent Document 2 and Patent Document 3).

REFERENCE

Patent Document

[Patent Document 1] Japanese Published Patent Application No. 2012-257187
[Patent Document 2] Japanese Published Patent Application No. 2014-241407
[Patent Document 3] Japanese Published Patent Application No. 2014-240833

SUMMARY OF THE INVENTION

An object is to provide a minute transistor. Another object is to provide a transistor with low parasitic capacitance. Another object is to provide a transistor with high frequency characteristics. Another object is to provide a transistor with favorable electrical characteristics. Another object is to provide a transistor with stable electrical characteristics. Another object is to provide a transistor with low off-state current. Another object is to provide a novel transistor. Another object is to provide a semiconductor device including the transistor. Another object is to provide a semiconductor device which can operate at high speed. Another object is to provide a novel semiconductor device. Another object is to provide a module including the semiconductor device. Another object is to provide an electronic device including the semiconductor device or the module.

Note that the descriptions of these objects do not disturb the existence of other objects. In one embodiment of the present invention, there is no need to achieve all the objects. Other objects will be apparent from and can be derived from the description of the specification, the drawings, the claims, and the like.

(1) One embodiment of the present invention is a semiconductor device including an oxide semiconductor, a first conductor, a second conductor, a third conductor, a first insulator, and a second insulator. The first conductor includes a first region, a second region, and a third region. The first region has a region where the first conductor overlaps with the oxide semiconductor with the first insulator positioned therebetween, the second region has a region where the first conductor overlaps with the second conductor with the first insulator and the second insulator positioned therebetween, and the third region has a region where the first conductor overlaps with the third conductor with the first insulator and the second insulator positioned therebetween. The oxide semiconductor includes a fourth region and a fifth region. The fourth region has a region where the oxide semiconductor is in contact with the second conductor, and the fifth region has a region where the oxide semiconductor is in contact with the third conductor. The first insulator has a region thinner than the second conductor and the third conductor.

(2) One embodiment of the present invention is the semiconductor device described in (1) where the first conductor is a stacked film including a conductor that is less likely to allow the passage of oxygen.

(3) One embodiment of the present invention is the semiconductor device described in (1) or (2) where each of the second conductor and the third conductor is a stacked film including a conductor that is less likely to allow the passage of oxygen.

(4) One embodiment of the present invention is the semiconductor device described in any one of (1) to (3) where the oxide semiconductor includes a first oxide semiconductor layer and a second oxide semiconductor layer, and has a region where the first oxide semiconductor layer and the second oxide semiconductor layer overlap with each other.

(5) One embodiment of the present invention is the semiconductor device described in any one of (1) to (4) where the first conductor has a region functioning as a gate electrode of the transistor, and the gate line width of the transistor is greater than or equal to 5 nm and less than or equal to 60 nm.

(6) One embodiment of the present invention is a method for manufacturing a semiconductor device, including the steps of: forming a first oxide semiconductor over a first insulator, forming a second oxide semiconductor over the first oxide semiconductor, forming an island-shaped oxide semiconductor layer including a first oxide semiconductor and a second semiconductor by etching part of the first oxide semiconductor and the second oxide semiconductor, forming a first conductor over the first insulator and the island-shaped oxide semiconductor layer, forming a first conductor layer including the first conductor by etching part of the first conductor, forming a second insulator over the first insulator and the first conductor layer, dividing the first conductor layer into a second conductor layer and a third conductor layer by forming an opening reaching the surface of the first insulator and an opening reaching the surface of the island-shaped oxide semiconductor layer in the second insulator and the first conductor layer, forming a third oxide semiconductor over the second insulator and the island-shaped oxide semiconductor layer, forming a third insulator over the third oxide semiconductor, forming a second conductor over the third insulator, forming a fourth conductor layer including the second conductor by etching part of the second conductor, and forming a fourth insulator over the second insulator and the fourth conductor layer. The third insulator has a region thinner than the second conductor layer and the third conductor layer.

(7) One embodiment of the present invention is a method for manufacturing a semiconductor device, including the steps of: forming a first oxide semiconductor over a first insulator, forming a second oxide semiconductor over the first oxide semiconductor, forming an island-shaped oxide semiconductor layer including a first oxide semiconductor and a second semiconductor by etching part of the first oxide semiconductor and the second oxide semiconductor, forming a first conductor over the first insulator and the island-shaped oxide semiconductor layer, forming a first conductor layer including the first conductor by etching part of the first conductor, forming a second insulator over the first insulator and the first conductor layer, dividing the first conductor layer into a second conductor layer and a third conductor layer by forming an opening reaching the surface of the first insulator and an opening reaching the surface of the island-shaped oxide semiconductor layer in the second insulator and the first conductor layer, forming a third oxide semiconductor over the second insulator and the island-shaped oxide semiconductor layer, forming a third insulator over the third oxide semiconductor, forming a second conductor over the third insulator, forming a fourth conductor layer including the second conductor by etching part of the second conductor, adding oxygen in plasma to the second insulator as excess oxygen by forming a fourth insulator over the second insulator and the fourth conductor layer with use of plasma containing oxygen, transferring the excess oxygen to the second oxide semiconductor by heat treatment, and forming a fifth insulator over the fourth insulator. The third insulator has a region thinner than the second conductor layer and the third conductor layer.

(8) One embodiment of the present invention is the method for manufacturing the semiconductor device described in (6) or (7), including the steps of: forming a third conductor that is less likely to allow the passage of oxygen than the first conductor over the first conductor, and forming a first conductor layer by etching part of the first conductor and the third conductor.

(9) One embodiment of the present invention is the method for manufacturing the semiconductor device described in any one of (6) to (8), including the steps of: forming a fourth conductor that is less likely to allow the passage of oxygen than the second conductor over the second conductor, forming a fifth conductor that is less likely to allow the passage of oxygen than the second conductor under the second conductor, and forming a fourth conductor layer by etching part of the second conductor, the fourth conductor, and the fifth conductor.

(10) One embodiment of the present invention is the method for manufacturing the semiconductor device described in any one of (6) to (9) where the fourth insulator is less likely to allow the passage of oxygen than the first insulator, the second insulator, and the third insulator.

(11) One embodiment of the present invention is the method for manufacturing the semiconductor device described in any one of (6) to (10) where the surface of the second insulator is planarized by chemical mechanical polishing treatment.

(12) One embodiment of the present invention is a semiconductor device including an oxide semiconductor, a first conductor, a second conductor, a third conductor, a fourth conductor, a first insulator, a second insulator, and a third insulator. The first conductor includes a first region, a second region, and a third region. The first region has a region where the first conductor overlaps with the oxide semiconductor with the first insulator positioned therebetween, the second region has a region where the first conductor overlaps with the second conductor with the first insulator and the second insulator positioned therebetween, and the third region has a region where the first conductor overlaps with the third conductor with the first insulator and the second insulator positioned therebetween. The oxide semiconductor includes a fourth region and a fifth region. The fourth region has a region where the oxide semiconductor is in contact with the second conductor, and the fifth region has a region where the oxide semiconductor is in contact with the third conductor. The third insulator is positioned to face the first insulator with the oxide semiconductor positioned therebetween. The fourth conductor has a region overlapping with the oxide semiconductor with the third insulator positioned therebetween. The first insulator has a region thinner than the second conductor and the third conductor.

(13) One embodiment of the present invention is the semiconductor device described in (12) where the first conductor is a stacked film including a conductor that is less likely to allow the passage of oxygen.

(14) One embodiment of the present invention is the semiconductor device described in (12) or (13) where each of the second conductor and the third conductor is a stacked film including a conductor that is less likely to allow the passage of oxygen.

(15) One embodiment of the present invention is the semiconductor device described in any one of (12) to (14) where the fourth conductor is a stacked film including a conductor that is less likely to allow the passage of oxygen.

(16) One embodiment of the present invention is the semiconductor device described in any one of (12) to (15) where the oxide semiconductor includes a first oxide semiconductor layer and a second oxide semiconductor layer, and has a region where the first oxide semiconductor layer and the second oxide semiconductor layer overlap with each other.

(17) One embodiment of the present invention is the semiconductor device described in any one of (12) to (16) where the first conductor has a region functioning as a gate electrode of the transistor, and the gate line width of the transistor is greater than or equal to 5 nm and less than or equal to 60 nm.

(18) One embodiment of the present invention is a method for manufacturing a semiconductor device, including the steps of: forming a second insulator over a first insulator, forming an opening reaching the first insulator in the second insulator, forming a first conductor over the second insulator and the first insulator, forming a second conductor over the first conductor, forming a first conductor layer including the first conductor and the second conductor by removing the second conductor and the first conductor which are positioned above the top surface of the second insulator by chemical mechanical polishing, forming a third insulator over the second insulator and the first conductor layer, forming a first oxide semiconductor over the third insulator, forming a second oxide semiconductor over the first oxide semiconductor, forming an island-shaped oxide semiconductor layer including the first oxide semiconductor and the second oxide semiconductor by etching part of the first oxide semiconductor and the second oxide semiconductor, forming a third conductor over the third insulator and the island-shaped oxide semiconductor layer, forming a second conductor layer including the third conductor by etching part of the third conductor, forming a fourth insulator over the third insulator and the second conductor layer, dividing the second conductor layer into a third conductor layer and a fourth conductor layer by forming an opening reaching the surface of the third insulator and an opening reaching the surface of the island-shaped oxide semiconductor layer in the fourth insulator and the second conductor layer, forming a third oxide semiconductor over the fourth insulator and the island-shaped oxide semiconductor layer, forming a fifth insulator over the third oxide semiconductor, forming a fourth conductor over the fifth insulator, forming a fifth conductor layer including the fourth conductor by etching part of the fourth conductor, etching part of the fifth insulator, etching part of the third oxide semiconductor, and forming a sixth insulator over the fourth insulator and the fifth conductor layer. The fifth insulator has a region thinner than the third conductor layer and the fourth conductor layer.

(19) One embodiment of the present invention is a method for manufacturing a semiconductor device, including the steps of: forming a second insulator over a first insulator, forming an opening reaching the first insulator in the second insulator, forming a first conductor over the second insulator and the first insulator, forming a second conductor over the first conductor, forming a first conductor layer including the first conductor and the second conductor by removing the second conductor and the first conductor which are positioned above the top surface of the second insulator by chemical mechanical polishing, forming a third insulator over the second insulator and the first conductor layer, forming a first oxide semiconductor over the third insulator, forming a second oxide semiconductor over the first oxide semiconductor, forming an island-shaped oxide semiconductor layer including the first oxide semiconductor and the second oxide semiconductor by etching part of the first oxide semiconductor and the second oxide semiconductor, forming a third conductor over the third insulator and the island-shaped oxide semiconductor layer, forming a second conductor layer including the third conductor by etching part of the third conductor, forming a fourth insulator over the third insulator and the second conductor layer, dividing the second conductor layer into a third conductor layer and a fourth conductor layer by forming an opening reaching the surface of the third insulator and an opening reaching the surface of the island-shaped oxide semiconductor layer in the fourth insulator and the second conductor layer, forming a third oxide semiconductor over the fourth insulator and the island-shaped oxide semiconductor layer, forming a fifth insulator over the third oxide semiconductor, forming a fourth conductor over the fifth insulator, forming a fifth conductor layer including the fourth conductor by etching part of the fourth conductor, etching part of the fifth insulator, etching part of the third oxide semiconductor, adding oxygen in plasma to the fourth insulator as excess oxygen by forming a sixth insulator over the fourth insulator and the fifth conductor layer, transferring the excess oxygen to the second oxide semiconductor by heat treatment, and forming a seventh insulator over the sixth insulator. The fifth insulator has a region thinner than the third conductor layer and the fourth conductor layer.

(20) One embodiment of the present invention is the method for manufacturing the semiconductor device described in (18) or (19) where the first conductor is less likely to allow the passage of oxygen than the second conductor.

(21) One embodiment of the present invention is the method for manufacturing the semiconductor device described in any one of (18) to (20), including the steps of: forming a fifth conductor that is less likely to allow the passage of oxygen than the third conductor over the third conductor, and forming the second conductor layer by etching part of the third conductor and the fifth conductor.

(22) One embodiment of the present invention is the method for manufacturing a semiconductor device described in any one of (18) to (21), including the steps of: forming a sixth conductor that is less likely to allow the passage of oxygen than the fourth conductor over the fourth conductor, forming a seventh conductor that is less likely to allow the passage of oxygen than the fourth conductor under the fourth conductor, and forming the fifth conductor layer by etching part of the fourth conductor, the sixth conductor, and the seventh conductor.

(23) One embodiment of the present invention is a method for manufacturing a semiconductor device described in any one of (18) to (22) where the sixth insulator is less likely to allow the passage of oxygen than the third insulator, the fourth insulator, and the fifth insulator.

(24) One embodiment of the present invention is the method for manufacturing a semiconductor device described in any one of (18) to (23) where the surface of the fourth insulator is planarized by chemical mechanical polishing treatment.

Note that in the semiconductor device of one embodiment of the present invention, the oxide semiconductor may be replaced with another semiconductor.

A miniaturized transistor can be provided. A transistor with low parasitic capacitance can be provided. A transistor with high frequency characteristics can be provided. A transistor with favorable electrical characteristics can be provided. A transistor with stable electrical characteristics can be provided. A transistor with low off-state current can be provided. A novel transistor can be provided. A semiconductor device including the transistor can be provided. A semiconductor device which can operate at high speed can be provided. A novel semiconductor device can be provided. A module including the semiconductor device can be provided. Furthermore, an electronic device including the semiconductor device or the module can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

FIG. 8 shows a change in the crystal part of an In—Ga—Zn oxide induced by electron irradiation.

DETAILED DESCRIPTION OF THE INVENTION

Figure 1A:
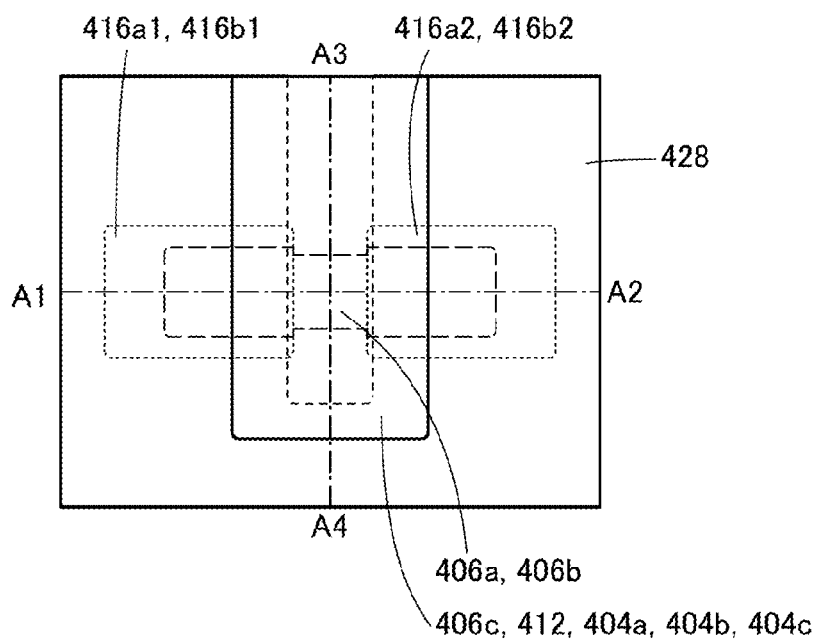
FIGS. 1A and 1B are a top view and a cross-sectional view which illustrate a transistor of one embodiment of the present invention.

Hereinafter, embodiments of the present invention will be described in detail with the reference to the drawings. However, the present invention is not limited to the description below, and it is easily understood by those skilled in the art that embodiments and details disclosed herein can be modified in various ways. Further, the present invention is not construed as being limited to description of the embodiments. In describing structures of the present invention with reference to the drawings, common reference numerals are used for the same portions in different drawings. Note that the same hatched pattern is applied to similar parts, and the similar parts are not especially denoted by reference numerals in some cases.

Note that the size, the thickness of films (layers), or the region in drawings is sometimes exaggerated for simplicity.

In this specification, for example, for describing the shape of an object, the length of one side of a minimal cube where the object fits, or an equivalent circle diameter of a cross section of the object can be interpreted as the "diameter", "grain size (diameter)", "dimension", "size", or "width" of the object. The term "equivalent circle diameter of a cross section of the object" refers to the diameter of a perfect circle having the same area as the cross section of the object.

Note that a voltage refers to a potential difference between a certain potential and a reference potential (e.g., a ground potential (GND) or a source potential) in many cases. A voltage can be referred to as a potential and vice versa.

Note that the ordinal numbers such as "first" and "second" in this specification are used for convenience and do not denote the order of steps or the stacking order of layers. Therefore, for example, the term "first" can be replaced with the term "second", "third", or the like as appropriate. In addition, the ordinal numbers in this specification and the like are not necessarily the same as those which specify one embodiment of the present invention.

Note that a "semiconductor" includes characteristics of an "insulator" in some cases when the conductivity is sufficiently low, for example. Further, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Further, a "semiconductor" includes characteristics of a "conductor" in some cases when the conductivity is sufficiently high, for example. Further, a "semiconductor" and a "conductor" cannot be strictly distinguished from each other in some cases because a border between the "semiconductor" and the "conductor" is not clear. Accordingly, a "semiconductor" in this specification can be called a "conductor" in some cases. Similarly, a "conductor" in this specification can be called a "semiconductor" in some cases.

Note that an impurity in a semiconductor refers to, for example, elements other than the main components of the semiconductor. For example, an element with a concentration of lower than 0.1 atomic % is an impurity. When an impurity is contained, density of states (DOS) may be formed in the semiconductor, the carrier mobility may be decreased, or the crystallinity may be lowered, for example. In the case where the semiconductor is an oxide semiconductor, examples of an impurity which changes characteristics of the semiconductor include Group 1 elements, Group 2 elements, Group 14 elements, Group 15 elements, and transition metals other than the main components; specifically, there are hydrogen (included in water), lithium, sodium, silicon, boron, phosphorus, carbon, and nitrogen, for example. In the case of an oxide semiconductor, oxygen vacancy may be formed by entry of impurities such as hydrogen. Further, in the case where the semiconductor is a silicon film, examples of an impurity which changes characteristics of the semiconductor include oxygen, Group 1 elements except hydrogen, Group 2 elements, Group 13 elements, and Group 15 elements.

Note that the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions do not necessarily have the same value. In other words, a channel width of one transistor is not fixed to one value in some cases. Therefore, in this specification, a channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is increased in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Further, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where electric field mobility, a current value per channel width, and the like of a transistor are obtained by calculation, a surrounded channel width may be used for the calculation. In that case, a value different from one in the case where an effective channel width is used for the calculation is obtained in some cases.

Note that in this specification, the description "A has a shape such that an end portion extends beyond an end portion of B" may indicate, for example, the case where at least one of end portions of A is positioned on an outer side than at least one of end portions of B in a top view or a cross-sectional view. Thus, the description "A has a shape such that an end portion extends beyond an end portion of B" can be read as the description "one end portion of A is positioned on an outer side than one end portion of B in a top view," for example.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "perpendicular" indicates that the angle formed between two straight lines is greater than or equal to 80° and less than or equal to 100°, and accordingly includes the case where the angle is greater than or equal to 85° and less than or equal to 95°.

In this specification, the trigonal and rhombohedral crystal systems are included in the hexagonal crystal system.

<Structure of Transistor>

The structures of transistors included in a semiconductor device of embodiments of the present invention will be described below.

<Transistor Structure 1>

Figure 1B:
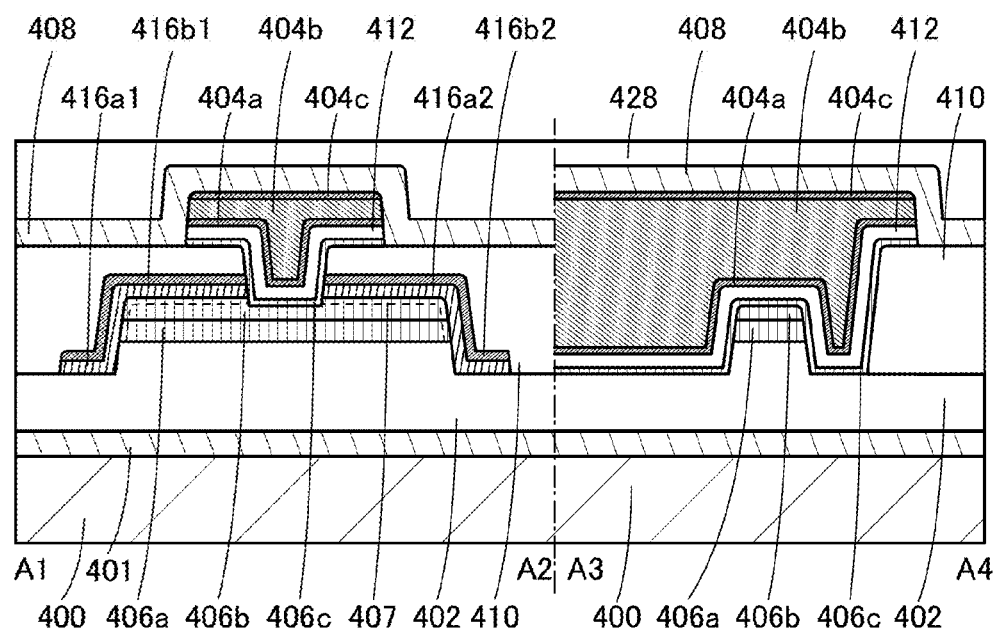

FIGS. 1A and 1B are a top view and a cross-sectional view of a semiconductor device of one embodiment of the present invention. FIG. 1A is the top view. FIG. 1B is the cross-sectional view taken along dashed-dotted line A1-A2 and dashed-dotted line A3-A4 in FIG. 1A. Note that for simplification of the drawing, some components are not illustrated in the top view in FIG. 1A.

In FIG. 1B, the transistor includes an insulator 401 over a substrate 400, an insulator 402 over the insulator 401, an insulator 406a over the insulator 402, a semiconductor 406b over the insulator 406a, a conductor 416a1 and a conductor 416a2 including a region in contact with a top surface and a side surface of the semiconductor 406b and a side surface of the insulator 406a, a region 407 in contact with the conductor 416a1, the conductor 416a2, the top surface and the side surface of the semiconductor 406b, and the side surface of the insulator 406a, a conductor 416b1 over the conductor 416a1, a conductor 416b2 over the conductor 416a2, an insulator 410 in contact with the top surfaces of the conductor 416b1 and the conductor 416b2, an insulator 406c in contact with the top surface of the semiconductor 406b, an insulator 412 over the insulator 406c, a conductor 404a positioned over the semiconductor 406b with the insulator 412 and the insulator 406c positioned therebetween, a conductor 404b over the conductor 404a, a conductor 404c over the conductor 404b, an insulator 408 including a region in contact with the top surface of the insulator 410, the top surface and the side surface of the conductor 404c, the side surface of the conductor 404b, the side surface of the conductor 404a, the side surface of the insulator 412, and the side surface of the insulator 406c, and an insulator 428 over the insulator 408.

In the transistor, the conductors 404a, 404b and 404c each serves as a gate electrode. The conductor 404a and the conductor 404c are less likely to allow the passage of oxygen than the conductor 404b, whereby decrease in conductivity due to oxidation of the conductor 404b can be prevented. The insulator 412 serves as a gate insulator. The conductors 416a1, 416b1, 416a2, and 416b2 serve as a source electrode and a drain electrode. The conductors 416b1 and 416b2 are less likely to allow the passage of oxygen than the conductors 416a1 and 416a2, whereby decrease in conductivity due to oxidation of the conductors 416a1 and 416a2 can be prevented. The resistance of the semiconductor 406b can be controlled by a potential applied to the conductors 404a, 404b, and 404c. That is, conduction or non-conduction between the conductors 416a1 and 416b1 and the conductors 416a2 and 416b2 can be controlled by the potential applied to the conductors 404a, 404b, and 404c.

In the transistor, the conductor 404a includes a region where the conductors 404a and 416b1 overlap with each other with the insulators 412, 406c, and 410 positioned therebetween, and a region where the conductor 404a and the conductor 416b2 overlap with each other with the insulators 412, 406c, and 410 positioned therebetween. The transistor includes the insulators 412, 406c, and 410 between the conductors 404a and 416b1, and between the conductors 404a and 416b2, whereby parasitic capacitance can be reduced. Thus, the transistor has high frequency characteristics.

As illustrated in FIG. 1B, the side surfaces of the insulator 406a and the semiconductor 406b are in contact with the conductor 416a1 and the conductor 416a2. In addition, the insulator 406a and the semiconductor 406b can be electrically surrounded by an electric field of the conductors 404a, 404b, and 404c serving as the gate electrode. A structure of a transistor in which a semiconductor is electrically surrounded by an electric field of a gate electrode is referred to as a surrounded channel (s-channel) structure. Therefore, a channel is formed in the entire semiconductor 406b in some cases. In the s-channel structure, a large amount of current can flow between a source and a drain of the transistor, so that an on-state current can be increased. In addition, since the insulator 406a and the semiconductor 406b are surrounded by the electric field of the conductors 404a, 404b and 404c, an off-state current can be decreased.

In the transistor, the region functioning as a gate electrode is formed in a self-aligned manner so as to fill the opening in the insulator 410 and others. Such a transistor can be also referred to as a self align s-channel FET (SA s-channel FET) or a trench gate s-channel FET.

Note that electrical characteristics of the transistor can be stabilized when the transistor is surrounded by an insulator with a function of blocking oxygen and impurities such as hydrogen. For example, an insulator with a function of blocking oxygen and impurities such as hydrogen may be used as the insulator 401 and the insulator 408.

An insulator with a function of blocking oxygen and impurities such as hydrogen may have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum may be used.

For example, the insulator 401 may be formed of aluminum oxide, magnesium oxide, silicon nitride oxide, silicon nitride, gallium oxide, germanium oxide, yttrium oxide, zirconium oxide, lanthanum oxide, neodymium oxide, hafnium oxide, or tantalum oxide. Note that the insulator 401 preferably includes aluminum oxide or silicon nitride. The insulator 401 including aluminum oxide or silicon nitride can suppress entry of impurities such as hydrogen into the semiconductor 406b, and can reduce outward diffusion of oxygen, for example.

Furthermore, for example, the insulator 408 may be formed of aluminum oxide, magnesium oxide, silicon nitride oxide, silicon nitride, gallium oxide, germanium oxide, yttrium oxide, zirconium oxide, lanthanum oxide, neodymium oxide, hafnium oxide, or tantalum oxide. Note that the insulator 408 preferably contains aluminum oxide. For example, when the insulator 408 is formed using plasma containing oxygen, oxygen can be added to the insulator 410 to be a base layer of the insulator 408 or a side surface of the insulator 412. The added oxygen becomes excess oxygen in the insulator 410 or the insulator 412. When the insulator 408 contains aluminum oxide, entry of impurities such as hydrogen into the semiconductor 406b can be inhibited. In addition, when the insulator 408 contains aluminum oxide, outward diffusion of excess oxygen that is added to the insulator 410 and the insulator 412 can be reduced, for example.

The insulator 402 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, the insulator 402 preferably contains silicon oxide or silicon oxynitride.

Each of the conductors 416a1, 416b1, 416a2, and 416b2 may be formed to have a single-layer structure or a stacked-layer structure including a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. Alternatively, a film of an alloy or compound containing the above element may be used: a conductor containing aluminum, a conductor containing copper and titanium, a conductor containing copper and manganese, a conductor containing indium, tin, and oxygen, a conductor containing titanium and nitrogen, or the like may be used.

Figure 3A:
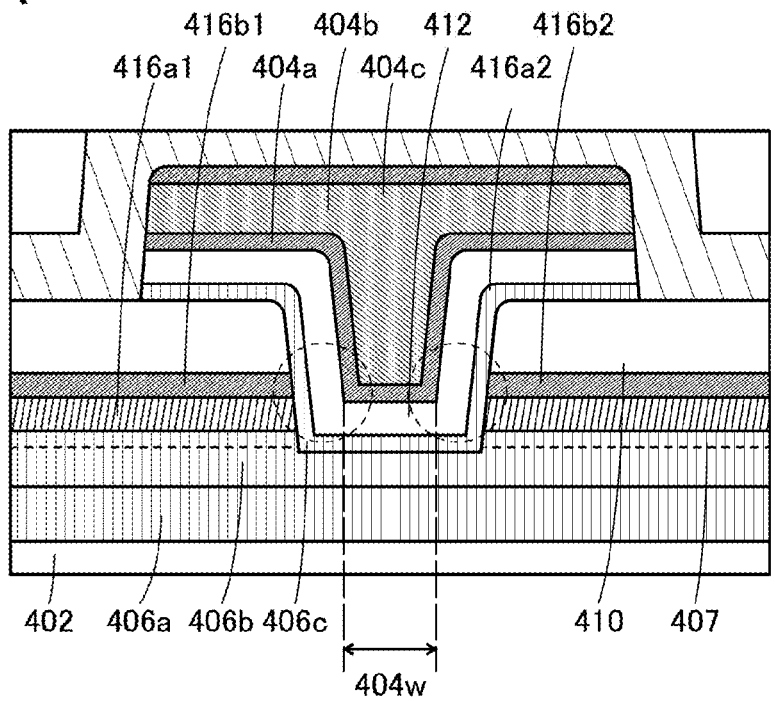
FIGS. 3A and 3B are cross-sectional views each illustrating part of a transistor of one embodiment of the present invention.
Figure 3B:
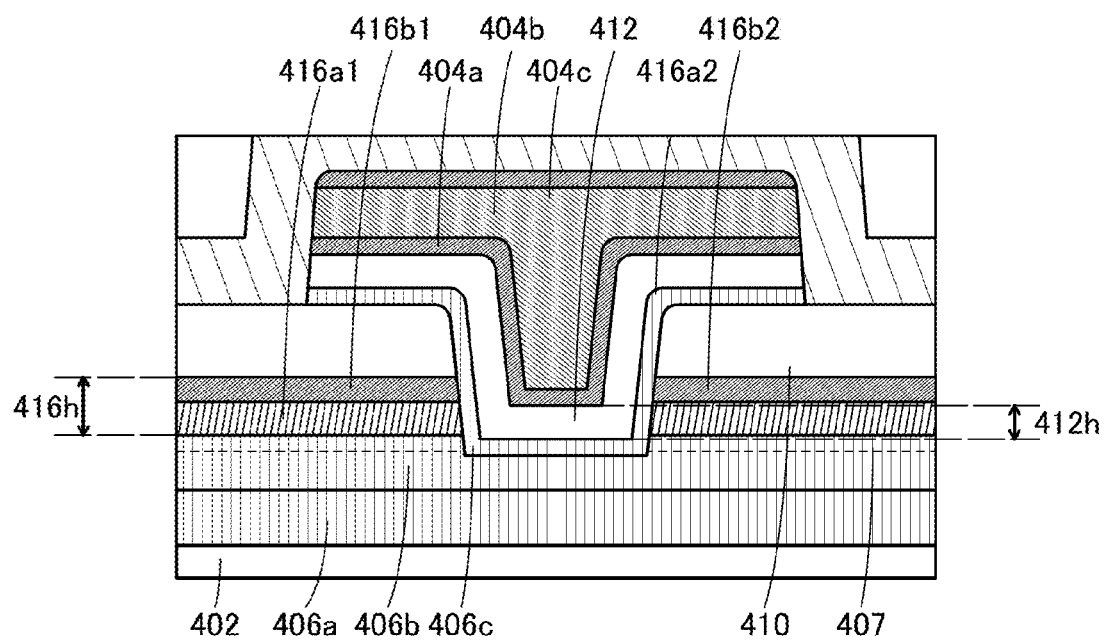

FIGS. 3A and 3B each show an enlarged center portion of the transistor. In FIG. 3A, the length of the region of the bottom surface of the conductor 404a facing the top surface of the semiconductor 406b with the insulator 412 and the insulator 406c positioned therebetween is denoted as a gate line width 404w. In the transistor of one embodiment of the present invention, the gate line width 404w can be smaller than the opening reaching the semiconductor 406b as illustrated in FIG. 3A. That is, the gate line width 404w can be smaller than the minimum feature size. Specifically, the gate line width 404w can be greater than or equal to 5 nm and less than or equal to 60 nm, preferably greater than or equal to 5 nm and less than or equal to 30 nm.

When an electric field of the gate electrode is blocked by other conductors, switching characteristics of the transistor are deteriorated in some cases. In the transistor, the positional relationship between the conductors 404a, 404b, and 404c and the conductors 416a1, 416b1, 416a2, and 416b2 varies on the basis of the thicknesses of the insulator 406c and the insulator 412. That is, the relationship between the thicknesses of the conductors 416a1, 416b1, 416a2, and 416b2 functioning as a source electrode and a drain electrode and the thickness of the insulator 412 serving as a gate insulating film affects the electrical characteristics of the transistor.

In FIG. 3B, the thickness of the insulator 412 in a region between the conductors 416a1 and 416b1 and the conductors 416a2 and 416b2 is referred to as 412h.

The total thickness of the conductors 416a1 and 416b1 or that of the conductors 416a2 and 416b2 is referred to as 416h.

The thickness 412h is preferably smaller than the thickness 416h because an electric field of the gate electrode is applied to the entire channel formation region. The thickness 412h is less than or equal to 30 nm, preferably less than or equal to 10 nm.

The insulator 410 may have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, the insulator 410 preferably contains silicon oxide or silicon oxynitride.

The value of parasitic capacitance formed between the conductor 404a and the conductor 416b1 and between the conductor 404a and the conductor 416b2 is inversely proportional to the thickness of the insulator 410. In the case where the thickness of the insulator 410 is three times or more times, preferably 5 times or more times, as large as the thickness of the insulator 412, for example, parasitic capacitance is negligibly small. Therefore, the parasitic capacitance of the transistor is formed only in the vicinity of the portions shown by dashed circles in FIG. 3A and its value can be small, so that the transistor can have high frequency characteristics.

Note that the insulator 410 preferably includes an insulator with low relative permittivity. For example, the insulator 410 preferably includes silicon oxide, silicon oxynitride, silicon nitride oxide, silicon nitride, resin, or the like. Alternatively, the insulator 410 preferably has a stacked-layer structure of silicon oxide or silicon oxynitride and resin. When silicon oxide or silicon oxynitride, which is thermally stable, is combined with resin, the stacked-layer structure can have thermal stability and low relative permittivity. Examples of the resin include polyester, polyolefin, polyamide (e.g., nylon or aramid), polyimide, polycarbonate, and acrylic.

The insulator 412 may have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, the insulator 412 preferably contain silicon oxide or silicon oxynitride.

The insulator 412 preferably includes an insulator with high relative permittivity. For example, the insulator 412 preferably includes gallium oxide, hafnium oxide, oxide including aluminum and hafnium, oxynitride including aluminum and hafnium, oxide including silicon and hafnium, oxynitride including silicon and hafnium, or the like. Alternatively, the insulator 412 preferably has a stacked-layer structure of silicon oxide or silicon oxynitride and an insulator with high relative permittivity. When silicon oxide or silicon oxynitride, which is thermally stable, is combined with an insulator with high relative permittivity, the stacked-layer structure can have thermal stability and high relative permittivity. For example, when an aluminum oxide, a gallium oxide, or a hafnium oxide of the insulator 412 is on the insulator 406c side, entry of silicon included in the silicon oxide or the silicon oxynitride into the semiconductor 406b can be suppressed. Alternatively, when the silicon oxide or the silicon oxynitride is on the insulator 406c side, a trap center may be formed at an interface between the aluminum oxide, the gallium oxide, or the hafnium oxide, and the silicon oxide or the silicon oxynitride in some cases. Trapping an electron, the trap center can shift a threshold voltage of the transistor in a positive direction in some cases.

Each of the conductors 404a, 404b, and 404c may have a single-layer structure or a stacked-layer structure including a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound may be used, for example, and a conductor containing aluminum, a conductor containing copper and titanium, a conductor containing copper and manganese, a conductor containing indium, tin, and oxygen, a conductor containing titanium and nitrogen, or the like may be used.

The insulator 428 may have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 428 may be formed with, for example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

Note that the insulator 428 preferably includes an insulator with low relative permittivity. For example, the insulator 428 preferably includes silicon oxide, silicon oxynitride, silicon nitride oxide, silicon nitride, resin, or the like. Alternatively, the insulator 428 preferably has a stacked-layer structure of silicon oxide or silicon oxynitride and resin. When silicon oxide or silicon oxynitride, which is thermally stable, is combined with resin, the stacked-layer structure can have thermal stability and low relative permittivity. Examples of the resin include polyester, polyolefin, polyamide (e.g., nylon or aramid), polyimide, polycarbonate, and acrylic.

An oxide semiconductor is preferably used as the semiconductor 406b. However, silicon (including strained silicon), germanium, silicon germanium, silicon carbide, gallium arsenide, aluminum gallium arsenide, indium phosphide, gallium nitride, an organic semiconductor, or the like can be used in some cases.

As the insulator 406a and the insulator 406c, oxides containing one or more elements other than oxygen included in the semiconductor 406b are preferably used. However, silicon (including strained silicon), germanium, silicon germanium, silicon carbide, gallium arsenide, aluminum gallium arsenide, indium phosphide, gallium nitride, an organic semiconductor, or the like can be used in some cases.

<Transistor Structure 2>

Figure 2A:
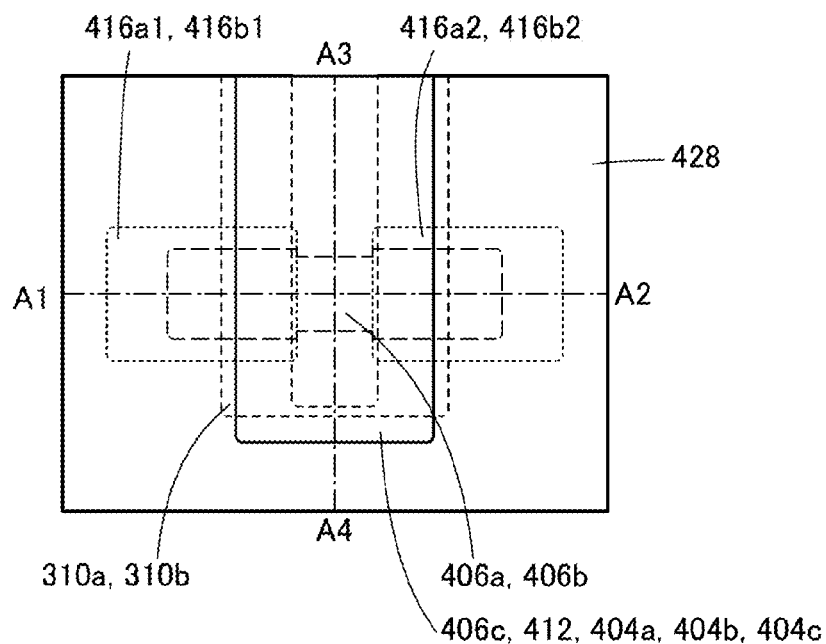
FIGS. 2A and 2B are a top view and a cross-sectional view which illustrate a transistor of one embodiment of the present invention.
Figure 2B:
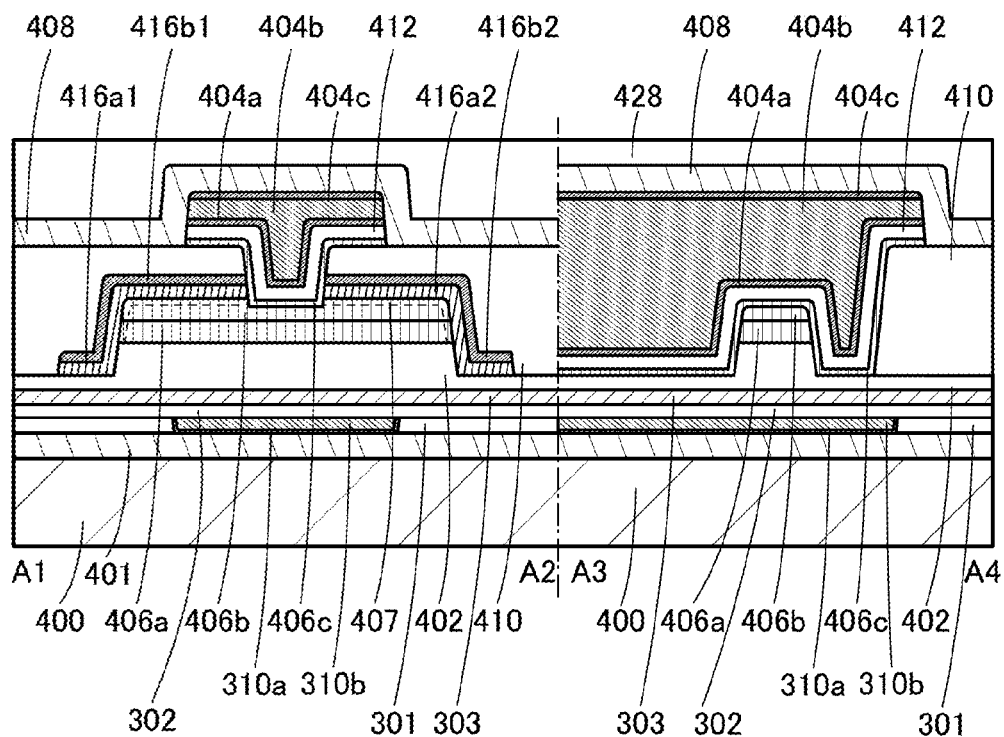

A transistor having a structure different from that in FIGS. 1A and 1B is described with reference to FIGS. 2A and 2B. FIG. 2A is a top view. FIG. 2B is a cross-sectional view taken along dashed-dotted line A1-A2 and dashed-dotted line A3-A4 in FIG. 2A. Note that for simplification of the drawing, some components in the top view in FIG. 2A are not illustrated.

In FIG. 2B, the transistor includes the insulator 401 over the substrate 400, an insulator 301 including an opening over the insulator 401, a conductor 310a and a conductor 310b embedded in the opening of the insulator 301, an insulator 302 over the insulator 301, the conductor 310a, and the conductor 310b, an insulator 303 over the insulator 302, the insulator 402 over the insulator 303, an insulator 406a over the insulator 402, a semiconductor 406b over the insulator 406a, a conductor 416a1 and a conductor 416a2 including a region in contact with the top surface and the side surface of the semiconductor 406b and the side surface of the insulator 406a, a region 407 in contact with the conductor 416a1, the conductor 416a2, the top surface and the side surface of the semiconductor 406b and the side surface of the insulator 406a, a conductor 416b1 over the conductor 416a1, a conductor 416b2 over the conductor 416a2, an insulator 410 in contact with the top surfaces of the conductor 416b1 and the conductor 416b2, an insulator 406c in contact with the top surface of the semiconductor 406b, an insulator 412 over the insulator 406c, a conductor 404a positioned over the semiconductor 406b with the insulator 412 and the insulator 406c positioned therebetween, a conductor 404b over the conductor 404a, a conductor 404c over the conductor 404b, an insulator 408 including a region in contact with the top surface of the insulator 410, the top surface of the conductor 404c, the side surface of the conductor 404c, the side surface of the conductor 404b, the side surface of the conductor 404a, the side surface of the insulator 412, and the side surface of the insulator 406c, an insulator 428 over the insulator 408.

In the transistor, the conductor 404a, the conductor 404b and the conductor 404c serve as a first gate electrode. The conductor 404a and the conductor 404c are less likely to allow the passage of oxygen than the conductor 404b, whereby decrease in conductivity due to oxidation of the conductor 404b can be prevented. The insulator 412 serves as the first gate insulator. The conductor 416a1, the conductor 416b1, the conductor 416a2, and the conductor 416b2 each serve as a source electrode and a drain electrode. The conductor 416b1 and the conductor 416b2 are less likely to allow the passage of oxygen than the conductor 416a1 and the conductor 416a2, whereby decrease in conductivity due to oxidation of the conductor 416a1 and the conductor 416a2 can be prevented. The resistance of the semiconductor 406b can be controlled by a potential applied to the conductor 404a, the conductor 404b, and the conductor 404c. That is, conduction or non-conduction between the conductor 416a1 and the conductor 416b1 and between the conductor 416a2 and the conductor 416b2 can be controlled by the potential applied to the conductor 404a, the conductor 404b, and the conductor 404c.

The conductors 310a and 310b serve as a second gate electrode. The conductor 310a is less likely to allow the passage of oxygen than the conductor 310b, whereby decrease in conductivity due to oxidation of the conductor 310b can be prevented. The insulators 302, 303, and 402 serve as a gate insulating film. In addition, the threshold voltage of the transistor can be controlled by applying potentials to the conductors 310a and 310b so that electrons are injected to the insulator 303. The first gate electrode and the second gate electrode electrically connected to each other can increase the on-state current. Note that the function of the first gate electrode and that of the second gate electrode may be interchanged.

The insulators 301 and 302 may each be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, the insulator 301 and the insulator 302 preferably contain silicon oxide or silicon oxynitride.

The insulator 303 may be formed to have, for example, a single-layer structure or a stacked-layer structure including an insulator or a metal oxide film containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, the insulator 303 preferably contains silicon nitride, hafnium oxide, or aluminum oxide. For the other components, refer to the transistor in FIGS. 1A and 1B.

<Structure of Oxide Semiconductor>

The structure of an oxide semiconductor is described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and has an unstable structure. For this reason, an a-like OS has physical properties similar to those of an amorphous oxide semiconductor.

<CAAC-OS>

First, a CAAC-OS is described.

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 4A:
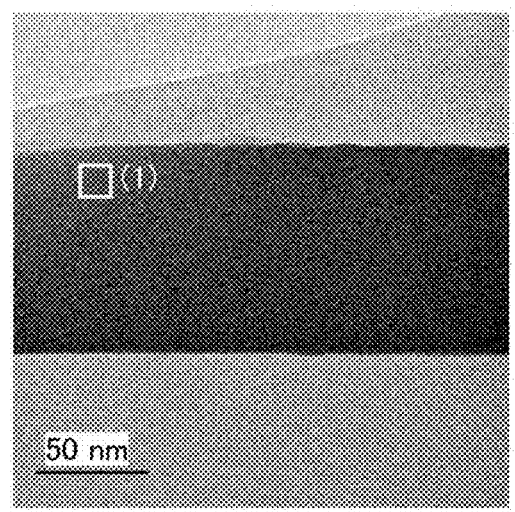
FIGS. 4A to 4C are Cs-corrected high-resolution TEM images of a cross section of a CAAC-OS.

The CAAC-OS observed with a TEM is described below. FIG. 4A shows an example of a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 4B:
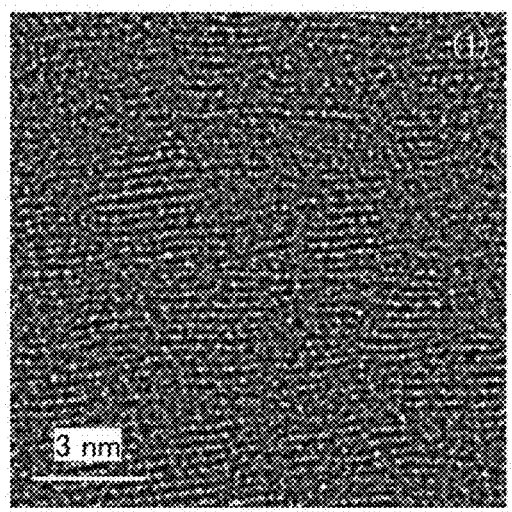

FIG. 4B is an enlarged Cs-corrected high-resolution TEM image of a region (1) in FIG. 4A. FIG. 4B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 4C:
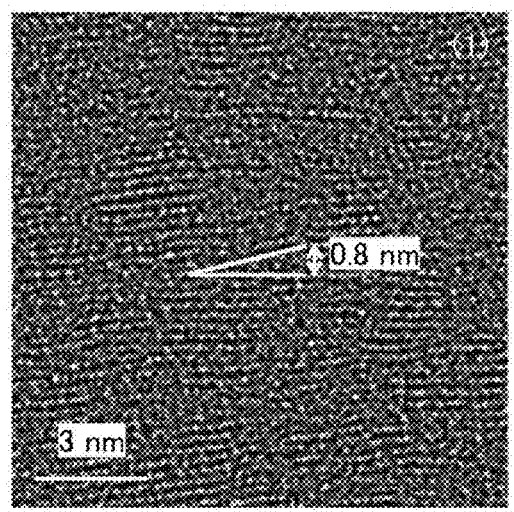

As shown in FIG. 4B, the CAAC-OS has a characteristic atomic arrangement. The characteristic atomic arrangement is denoted by an auxiliary line in FIG. 4C. FIGS. 4B and 4C prove that the size of a pellet is 1 nm or greater, or 3 nm or greater, and the size of a space caused by tilt of the pellets is approximately 0.8 nm. Therefore, the pellet can also be referred to as a nanocrystal (nc). Furthermore, the CAAC-OS can also be referred to as an oxide semiconductor including c-axis aligned nanocrystals (CANC).

Figure 4D:
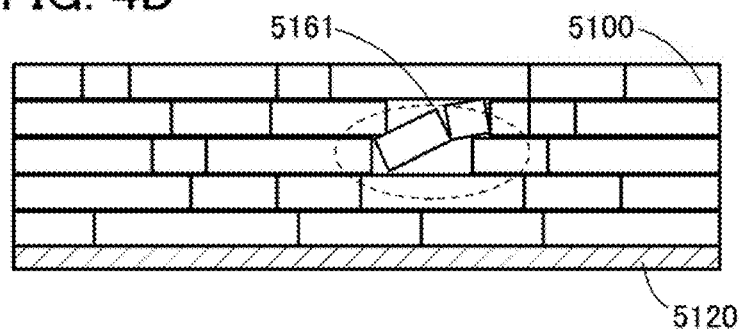
FIG. 4D is a cross-sectional schematic view of a CAAC-OS.

Here, according to the Cs-corrected high-resolution TEM images, the schematic arrangement of pellets 5100 of a CAAC-OS over a substrate 5120 is illustrated by such a structure in which bricks or blocks are stacked (see FIG. 4D). The part in which the pellets are tilted as observed in FIG. 4C corresponds to a region 5161 shown in FIG. 4D.

Figure 5A:
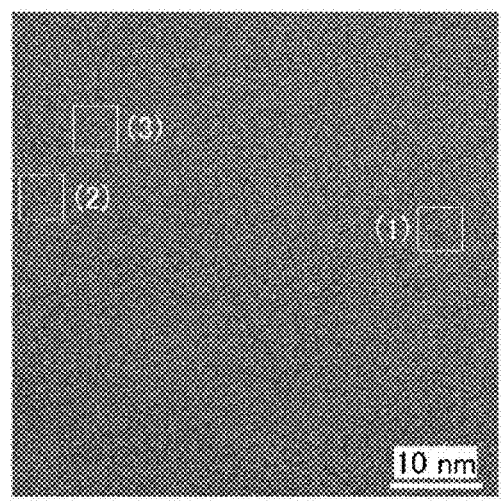
FIGS. 5A to 5D are Cs-corrected high-resolution TEM images of a plane of a CAAC-OS.
Figure 5B:
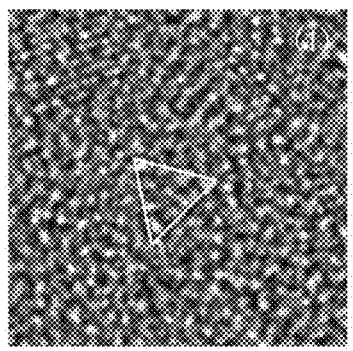
Figure 5C:
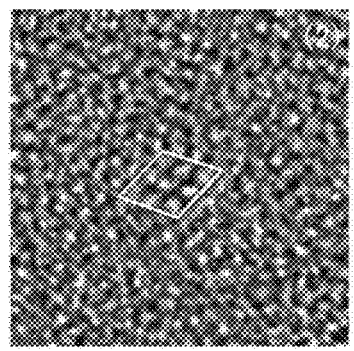
Figure 5D:
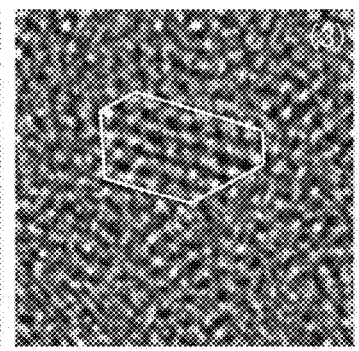

FIG. 5A shows a Cs-corrected high-resolution TEM image of a plane of the CAAC-OS observed from a direction substantially perpendicular to the sample surface. FIGS. 5B, 5C, and 5D are enlarged Cs-corrected high-resolution TEM images of regions (1), (2), and (3) in FIG. 5A, respectively. FIGS. 5B, 5C, and 5D indicate that metal atoms are arranged in a triangular, quadrangular, or hexagonal configuration in a pellet. However, there is no regularity of arrangement of metal atoms between different pellets.

Figure 6A:
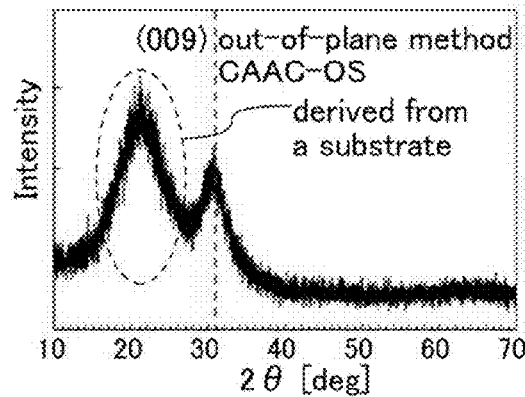
FIGS. 6A to 6C show structural analysis of a CAAC-OS and a single crystal oxide semiconductor by XRD.

Next, a CAAC-OS analyzed by X-ray diffraction (XRD) is described. For example, when the structure of a CAAC-OS including an $InGaZnO_4$ crystal is analyzed by an out-of-plane method, a peak appears at a diffraction angle ($2\theta$) of around 31° as shown in FIG. 6A. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when $2\theta$ is around 36°, in addition to the peak at $2\theta$ of around 31°. The peak of $2\theta$ at around 36° indicates that a crystal having no c-axis alignment is included in part of the CAAC-OS. It is preferable that in the CAAC-OS analyzed by an out-of-plane method, a peak appear when $2\theta$ is around 31° and that a peak not appear when $2\theta$ is around 36°.

Figure 6B:
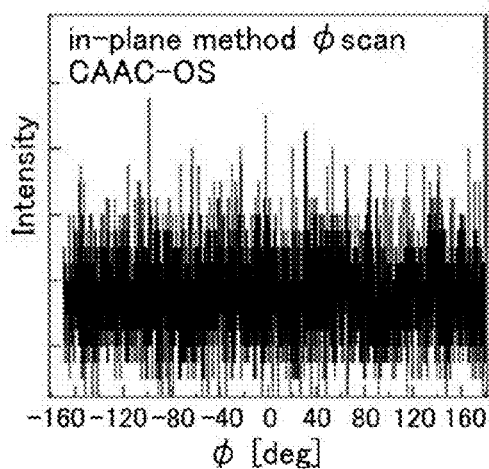
Figure 6C:
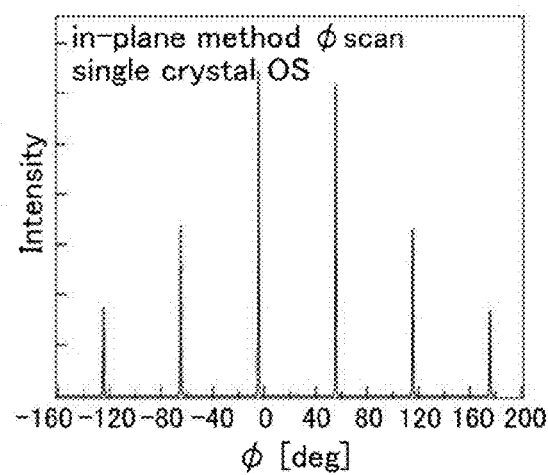

On the other hand, in structural analysis of the CAAC-OS by an in-plane method in which an X-ray beam is incident on a sample in a direction substantially perpendicular to the c-axis, a peak appears when $2\theta$ is around 56°. This peak is attributed to the (110) plane of the $InGaZnO_4$ crystal. In the case of the CAAC-OS, when analysis ($\phi$ scan) is performed with $2\theta$ fixed at around 56° and with the sample rotated using a normal vector of the sample surface as an axis ($\phi$ axis), as shown in FIG. 6B, a peak is not clearly observed. In contrast, in the case of a single crystal oxide semiconductor of $InGaZnO_4$, when $\phi$ scan is performed with $2\theta$ fixed at around 56°, as shown in FIG. 6C, six peaks which are assigned to crystal planes equivalent to the (110) plane are observed. Accordingly, the structural analysis using XRD shows that the directions of the a-axes and b-axes are irregularly oriented in the CAAC-OS.

Figure 7A:
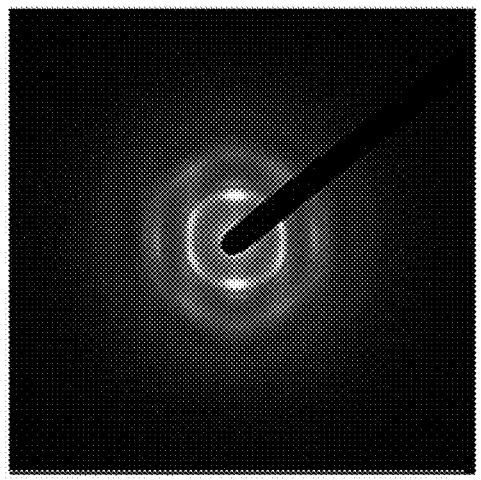
FIGS. 7A and 7B show electron diffraction patterns of a CAAC-OS.
Figure 7B:
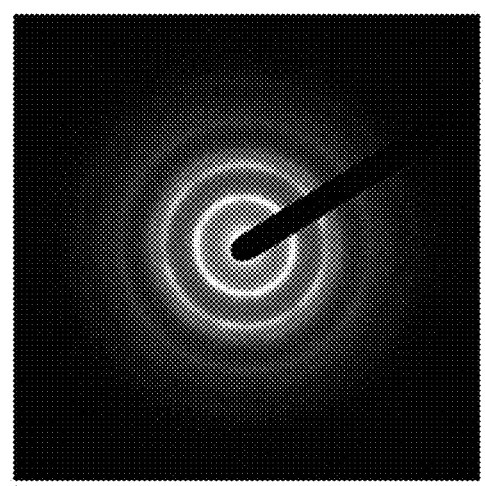

Next, a CAAC-OS analyzed by electron diffraction is described. For example, when an electron beam with a probe diameter of 300 nm is incident on a CAAC-OS including an $InGaZnO_4$ crystal in a direction parallel to the sample surface, a diffraction pattern (also referred to as a selected-area transmission electron diffraction pattern) shown in FIG. 7A can be obtained. In this diffraction pattern, spots assigned to the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 7B shows a diffraction pattern obtained in such a manner that an electron beam with a probe diameter of 300 nm is incident on the same sample in a direction perpendicular to the sample surface. As shown in FIG. 7B, a ring-like diffraction pattern is observed. Thus, the electron diffraction also indicates that the a-axes and b-axes of the pellets included in the CAAC-OS do not have regular alignment. The first ring in FIG. 7B is considered to be assigned to the (010) plane, the (100) plane, and the like of the $InGaZnO_4$ crystal. The second ring in FIG. 7B is considered to be assigned to the (110) plane and the like.

As described above, the CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. Furthermore, oxygen vacancies in the oxide semiconductor serve as carrier traps or serve as carrier generation sources when hydrogen is captured therein.

The CAAC-OS having small amounts of impurities and oxygen vacancies is an oxide semiconductor with low carrier density (specifically, lower than $8 \times 10^{11}/cm^3$, preferably lower than $1 \times 10^{11}/cm^3$, further preferably lower than $1 \times 10^{10}/cm^3$, and is higher than or equal to $1 \times 10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS will be described.

An nc-OS has a region in which a crystal part is observed and a region in which a crystal part is not clearly observed in a high-resolution TEM image. In most cases, the size of a crystal part included in the nc-OS is greater than or equal to 1 nm and less than or equal to 10 nm, or greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method. For example, when the nc-OS is analyzed by an out-of-plane method using an X-ray beam having a diameter larger than the size of a pellet, a peak indicating a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-like OS>

An a-like OS has a structure intermediate between those of the nc-OS and the amorphous oxide semiconductor.

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it contains a void. To verify that an a-like OS has an unstable structure as compared with a CAAC-OS and an nc-OS, a change in structure caused by electron irradiation is described below.

An a-like OS (referred to as Sample A), an nc-OS (referred to as Sample B), and a CAAC-OS (referred to as Sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of $InGaZnO_4$. Each of lattice fringes corresponds to the a-b plane of the $InGaZnO_4$ crystal.

FIG. 8 shows change in the average size of crystal parts (at 22 points to 45 points) in each sample. Note that the crystal part size corresponds to the length of a lattice fringe. FIG. 8 indicates that the crystal part size in the a-like OS increases with an increase in the cumulative electron dose. Specifically, as shown by (1) in FIG. 8, a crystal part of approximately 1.2 nm (also referred to as an initial nucleus) at the start of TEM observation grows to a size of approximately 2.6 nm at a cumulative electron dose of $4.2 \times 10^8$ $e^-/nm^2$. In contrast, the crystal part size in the nc-OS and the CAAC-OS shows little change from the start of electron irradiation to a cumulative electron dose of $4.2 \times 10^8$ $e^-/nm^2$. Specifically, as shown by (2) and (3) in FIG. 8, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more of an amorphous oxide semiconductor, an a-like OS, an nc-OS, and a CAAC-OS, for example.

An oxide which can be used as the insulator 406a, the semiconductor 406b, the insulator 406c, or the like is described below.

The semiconductor 406b is an oxide semiconductor containing indium, for example. The semiconductor 406b can have high carrier mobility (electron mobility) by containing indium, for example. The semiconductor 406b preferably contains an element M. The element M is preferably aluminum, gallium, yttrium, tin, or the like. Other elements which can be used as the element M are boron, silicon, titanium, iron, nickel, germanium, zirconium, molybdenum, lanthanum, cerium, neodymium, hafnium, tantalum, tungsten, and the like. Note that two or more of the above elements may be used in combination as the element M. The element M is an element having a high bonding energy with oxygen, for example. The element M is an element whose bonding energy with oxygen is higher than that of indium, for example. The element M is an element that can increase the energy gap of the oxide semiconductor, for example. Furthermore, the semiconductor 406b preferably contains zinc. When the oxide semiconductor contains zinc, the oxide semiconductor is easily to be crystallized in some cases.

Note that the semiconductor 406b is not limited to the oxide semiconductor containing indium. The semiconductor 406b may be, for example, an oxide semiconductor which does not contain indium and contains zinc, an oxide semiconductor which does not contain indium and contains gallium, or an oxide semiconductor which does not contain indium and contains tin, e.g., a zinc tin oxide, a gallium tin oxide, or gallium oxide.

For the semiconductor 406b, an oxide with a wide energy gap may be used. For example, the energy gap of the semiconductor 406b is greater than or equal to 2.5 eV and less than or equal to 4.2 eV, preferably greater than or equal to 2.8 eV and less than or equal to 3.8 eV, or further preferably greater than or equal to 3 eV and less than or equal to 3.5 eV.

For example, the insulator 406a and the insulator 406c include one or more elements other than oxygen included in the semiconductor 406b. Since the insulator 406a and the insulator 406c each include one or more elements other than oxygen included in the semiconductor 406b, an interface state is less likely to be formed at the interface between the insulator 406a and the semiconductor 406b and the interface between the semiconductor 406b and the insulator 406c.

The case where the insulator 406a, the semiconductor 406b, and the insulator 406c each include indium is described below. In the case of using an In-M-Zn oxide as the insulator 406a, when the summation of In and M is assumed to be 100 atomic %, the proportions of In and M are preferably set to be less than 50 atomic % and greater than 50 atomic %, respectively, more preferably less than 25 atomic % and greater than 75 atomic %, respectively. In the case of using an In-M-Zn oxide as the semiconductor 406b, when the summation of In and M is assumed to be 100 atomic %, the proportions of In and M are preferably set to be greater than 25 atomic % and less than 75 atomic %, respectively, more preferably greater than 34 atomic % and less than 66 atomic %, respectively. In the case of using an In-M-Zn oxide as the insulator 406c, when the summation of In and M is assumed to be 100 atomic %, the proportions of In and M are preferably set to be less than 50 atomic % and greater than 50 atomic %, respectively, more preferably less than 25 atomic % and greater than 75 atomic %, respectively. Note that the insulator 406c may be an oxide that is a type the same as that of the insulator 406a.

As the semiconductor 406b, an oxide having an electron affinity higher than those of the insulators 406a and 406c is used. For example, as the semiconductor 406b, an oxide having an electron affinity higher than those of the insulators 406a and 406c by 0.07 eV or higher and 1.3 eV or lower, preferably 0.1 eV or higher and 0.7 eV or lower, or further preferably 0.15 eV or higher and 0.4 eV or lower is used. Note that the electron affinity refers to an energy gap between the vacuum level and the bottom of the conduction band.

An indium gallium oxide has a small electron affinity and a high oxygen-blocking property. Therefore, the insulator 406c preferably includes indium gallium oxide. The gallium atomic ratio [Ga/(In+Ga)] is, for example, higher than or equal to 70%, preferably higher than or equal to 80%, or more preferably higher than or equal to 90%.

Note that the insulator 406a and/or the insulator 406c may be gallium oxide. For example, when gallium oxide is used for the insulator 406c, a leakage current generated between the conductors 404a, 404b, and 404c and the conductor 416a or 416b can be reduced. In other words, the off-state current of the transistor can be reduced.

At this time, when a gate voltage is applied, a channel is formed in the semiconductor 406b having the highest electron affinity in the insulator 406a, the semiconductor 406b, and the insulator 406c.

Here, in some cases, there is a mixed region of the insulator 406a and the semiconductor 406b between the insulator 406a and the semiconductor 406b. Furthermore, in some cases, there is a mixed region of the semiconductor 406b and the insulator 406c between the semiconductor 406b and the insulator 406c. The mixed region has a low density of interface states. For that reason, the stack including the insulator 406a, the semiconductor 406b, and the insulator 406c has a band structure where energy is changed continuously at each interface and in the vicinity of the interface (continuous junction).

At this time, electrons move mainly in the semiconductor 406b, not in the insulators 406a and 406c. Thus, when the interface state density at the interface between the insulator 406a and the semiconductor 406b and the interface state density at the interface between the semiconductor 406b and the insulator 406c are decreased, electron movement in the semiconductor 406b is less likely to be inhibited and the on-state current of the transistor can be increased.

In the case where the transistor has an s-channel structure, a channel is formed in the whole of the semiconductor 406b. Therefore, as the semiconductor 406b has a larger thickness, a channel region becomes larger. In other words, the thicker the semiconductor 406b is, the larger the on-state current of the transistor is. For example, the semiconductor 406b has a region with a thickness of greater than or equal to 10 nm, preferably greater than or equal to 20 nm, further preferably greater than or equal to 40 nm, still further preferably greater than or equal to 60 nm, yet further preferably greater than or equal to 100 nm. Note that the semiconductor 406b has a region with a thickness of, for example, less than or equal to 300 nm, preferably less than or equal to 200 nm, or more preferably less than or equal to 150 nm because the productivity of the semiconductor device including the transistor might be decreased. In some cases, when the channel formation region is reduced in size, electrical characteristics of the transistor with a smaller thickness of the semiconductor 406b may be improved. Therefore, the semiconductor 406b may have a thickness less than 10 nm.

Moreover, the thickness of the insulator 406c is preferably as small as possible to increase the on-state current of the transistor. The thickness of the insulator 406c is less than 10 nm, preferably less than or equal to 5 nm, more preferably less than or equal to 3 nm, for example. Meanwhile, the insulator 406c has a function of blocking entry of elements other than oxygen (such as hydrogen and silicon) included in the adjacent insulator into the semiconductor 406b where a channel is formed. For this reason, it is preferable that the insulator 406c have a certain thickness. The thickness of the insulator 406c is greater than or equal to 0.3 nm, preferably greater than or equal to 1 nm, further preferably greater than or equal to 2 nm, for example. The insulator 406c preferably has an oxygen blocking property to suppress outward diffusion of oxygen released from the insulator 402 and the like.

To improve reliability, preferably, the thickness of the insulator 406a is large and the thickness of the insulator 406c is small. For example, the insulator 406a has a region with a thickness, for example, greater than or equal to 10 nm, preferably greater than or equal to 20 nm, further preferably greater than or equal to 40 nm, still further preferably greater than or equal to 60 nm. When the thickness of the insulator 406a is made large, a distance from an interface between the adjacent insulator and the insulator 406a to the semiconductor 406b in which a channel is formed can be large. Since the productivity of the semiconductor device including a transistor might be decreased, the insulator 406a has a region with a thickness, for example, less than or equal to 200 nm, preferably less than or equal to 120 nm, further preferably less than or equal to 80 nm.

For example, silicon in the oxide semiconductor might serve as a carrier trap or a carrier generation source. Therefore, the silicon concentration of the semiconductor 406b is preferably as low as possible. For example, a region in which the concentration of silicon which is measured by secondary ion mass spectrometry (SIMS) is lower than $1 \times 10^{19}$ atoms/cm$^3$, preferably lower than $5 \times 10^{18}$ atoms/cm$^3$, or further preferably lower than $2 \times 10^{18}$ atoms/cm$^3$ is provided between the semiconductor 406b and the insulator 406a. A region with a silicon concentration lower than $1 \times 10^{19}$ atoms/cm$^3$, preferably lower than $5 \times 10^{18}$ atoms/cm$^3$, further preferably lower than $2 \times 10^{18}$ atoms/cm$^3$ which is measured by SIMS is provided between the semiconductor 406b and the insulator 406c.

It is preferable to reduce the concentration of hydrogen in the insulator 406a and the insulator 406c in order to reduce the concentration of hydrogen in the semiconductor 406b. The insulator 406a and the insulator 406c each have a region in which the concentration of hydrogen measured by SIMS is lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, still further preferably lower than or equal to $5 \times 10^{18}$ atoms/cm$^3$. It is preferable to reduce the concentration of nitrogen in the insulator 406a and the insulator 406c in order to reduce the concentration of nitrogen in the semiconductor 406b. The insulator 406a and the insulator 406c each have a region in which the concentration of nitrogen measured by SIMS is lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

Note that when copper enters the oxide semiconductor, an electron trap might be generated. The electron trap might shift the threshold voltage of the transistor in the positive direction. Therefore, the concentration of copper on the surface of or in the semiconductor 406b is preferably as low as possible. For example, the semiconductor 406b preferably has a region in which the copper concentration is lower than or equal to $1 \times 10^{19}$ atoms/cm$^3$, lower than or equal to $5 \times 10^{18}$ atoms/cm$^3$, or lower than or equal to $1 \times 10^{18}$ atoms/cm$^3$.

The above three-layer structure is an example. For example, a two-layer structure without the insulator 406a or the insulator 406c may be employed. A four-layer structure in which any one of the semiconductors described as examples of the insulator 406a, the semiconductor 406b, and the insulator 406c is provided below or over the insulator 406a or below or over the insulator 406c may be employed. An n-layer structure (n is an integer of 5 or more) in which any one of the semiconductors described as examples of the insulator 406a, the semiconductor 406b, and the insulator 406c is provided at two or more of the following positions: over the insulator 406a, below the insulator 406a, over the insulator 406c, and below the insulator 406c.

As the substrate 400, an insulator substrate, a semiconductor substrate, or a conductor substrate may be used, for example. As the insulator substrate, a glass substrate, a quartz substrate, a sapphire substrate, a stabilized zirconia substrate (e.g., an yttria-stabilized zirconia substrate), or a resin substrate is used, for example. As the semiconductor substrate, a single material semiconductor substrate of silicon, germanium, or the like or a compound semiconductor substrate of silicon carbide, silicon germanium, gallium arsenide, indium phosphide, zinc oxide, gallium oxide, or the like is used, for example. A semiconductor substrate in which an insulator region is provided in the above semiconductor substrate, e.g., a silicon on insulator (SOI) substrate or the like is used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

Alternatively, a flexible substrate may be used as the substrate 400. As a method for providing the transistor over a flexible substrate, there is a method in which the transistor is formed over a non-flexible substrate and then the transistor is separated and transferred to the substrate 400 which is a flexible substrate. In that case, a separation layer is preferably provided between the non-flexible substrate and the transistor. As the substrate 400, a sheet, a film, or a foil containing a fiber may be used. The substrate 400 may have elasticity. The substrate 400 may have a property of returning to its original shape when bending or pulling is stopped. Alternatively, the substrate 400 may have a property of not returning to its original shape. The substrate 400 has a region with a thickness of, for example, greater than or equal to 5 µm and less than or equal to 700 µm, preferably greater than or equal to 10 µm and less than or equal to 500 µm, more preferably greater than or equal to 15 µm and less than or equal to 300 µm. When the substrate 400 has a small thickness, the weight of the semiconductor device including the transistor can be reduced. When the substrate 400 has a small thickness, even in the case of using glass or the like, the substrate 400 may have elasticity or a property of returning to its original shape when bending or pulling is stopped. Therefore, an impact applied to the semiconductor device over the substrate 400, which is caused by dropping or the like, can be reduced. That is, a durable semiconductor device can be provided.

For the substrate 400 which is a flexible substrate, metal, an alloy, resin, glass, or fiber thereof can be used, for example. The flexible substrate 400 preferably has a lower coefficient of linear expansion because deformation due to an environment is suppressed. The flexible substrate 400 is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, and acrylic. In particular, aramid is preferably used for the flexible substrate 400 because of its low coefficient of linear expansion.

<Manufacturing Method of Transistor Structure 1>

A method for manufacturing the transistor illustrated in FIGS. 1A and 1B is described below with reference to FIGS. 9A and 9B, FIGS. 10A and 10B, FIGS. 11A and 11B, FIGS. 12A and 12B, FIGS. 13A and 13B, and FIGS. 14A and 14B.

First, the substrate 400 is prepared.

Next, the insulator 401 is formed. The insulator 401 may be formed by a sputtering method, a chemical vapor deposition (CVD) method, a molecular beam epitaxy (MBE) method, a pulsed laser deposition (PLD) method, an atomic layer deposition (ALD) method, or the like.

CVD methods can be classified into a plasma enhanced CVD (PECVD) method using plasma, a thermal CVD (TCVD) method using heat, a photo CVD method using light, and the like. Moreover, the CVD method can include a metal CVD (MCVD) method and a metal organic CVD (MOCVD) method depending on a source gas.

By using the PECVD method, a high-quality film can be formed at a relatively low temperature. Furthermore, a thermal CVD method does not use plasma and thus causes less plasma damage to an object. For example, a wiring, an electrode, an element (e.g., transistor or capacitor), or the like included in a semiconductor device might be charged up by receiving charges from plasma. In that case, accumulated charges might break the wiring, electrode, element, or the like included in the semiconductor device. By contrast, when a thermal CVD method not using plasma is employed, such plasma damage is not caused and the yield of the semiconductor device can be increased. A thermal CVD method does not cause plasma damage during deposition, so that a film with few defects can be obtained.

An ALD method also causes less plasma damage to an object. An ALD method does not cause plasma damage during deposition, so that a film with few defects can be obtained.

Different from a film formation method whereby particles released from a target are deposited, a CVD method and an ALD method are film formation methods whereby a film is formed by a reaction at a surface of an object of the treatment. Therefore, they are film formation methods whereby a film with favorable coverage is formed without being greatly affected by the shape of the object. In particular, a film formed by an ALD method has favorable coverage and excellent uniformity in thickness. Therefore, an ALD method is preferred for forming a film covering a surface of an opening with a high aspect ratio. However, film formation speed of an ALD method is relatively slow, and thus it may be preferable to use an ALD method in combination with another film formation method with high film formation speed such as a CVD method in some cases.

In the case of a CVD method or an ALD method, the composition of a film to be obtained can be controlled by adjusting the flow ratio of a source gas. For example, by a CVD method or an ALD method, a film with a desired composition can be formed by adjusting the flow ratio of a source gas. Moreover, with a CVD method or an ALD method, by changing the flow ratio of the source gases while forming the film, a film whose composition is continuously changed can be formed. In the case where the film is formed while changing the flow ratio of the source gases, as compared to the case where the film is formed using a plurality of deposition chambers, time taken for the film formation can be reduced because time taken for transfer and pressure adjustment is omitted. Thus, semiconductor devices can be manufactured with improved productivity.

Then, the insulator 402 is formed. The insulator 402 can be formed by the sputtering method, a CVD method, an MBE method, a PLD method, an ALD method, or the like.

Next, treatment to add oxygen to the insulator 402 may be performed. An ion implantation method, a plasma treatment method, or the like can be used for the treatment to add oxygen. Note that oxygen added to the insulator 402 is excess oxygen.

Next, a semiconductor is formed. The semiconductor can be formed by the sputtering method, a CVD method, an MBE method, a PLD method, an ALD method, or the like.

Next, treatment to add oxygen to the semiconductor may be performed. An ion implantation method, a plasma treatment method, or the like can be used for the treatment to add oxygen. Note that oxygen added to the semiconductor becomes excess oxygen. When the semiconductor is a stacked-layer film, oxygen is preferably added to a layer of an insulator to be the insulator 406a. Next, the semiconductor to be the semiconductor 406b is formed over the insulator to be the insulator 406a.

Next, first heat treatment is preferably performed. The first heat treatment can be performed at a temperature higher than or equal to 250° C. and lower than or equal to 650° C., preferably higher than or equal to 450° C. and lower than or equal to 600° C., further preferably higher than or equal to 520° C. and lower than or equal to 570° C. The first heat treatment is performed in an inert gas atmosphere or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. The crystallinity of the semiconductor can be increased by the first heat treatment. Furthermore, impurities such as hydrogen and water can be removed by the first heat treatment.

Figure 9A:
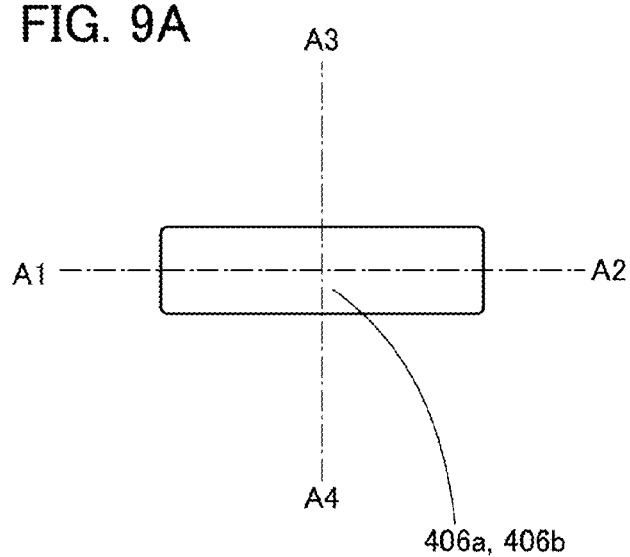
FIGS. 9A and 9B are a top view and a cross-sectional view illustrating a method for manufacturing a transistor of one embodiment of the present invention.
Figure 9B:
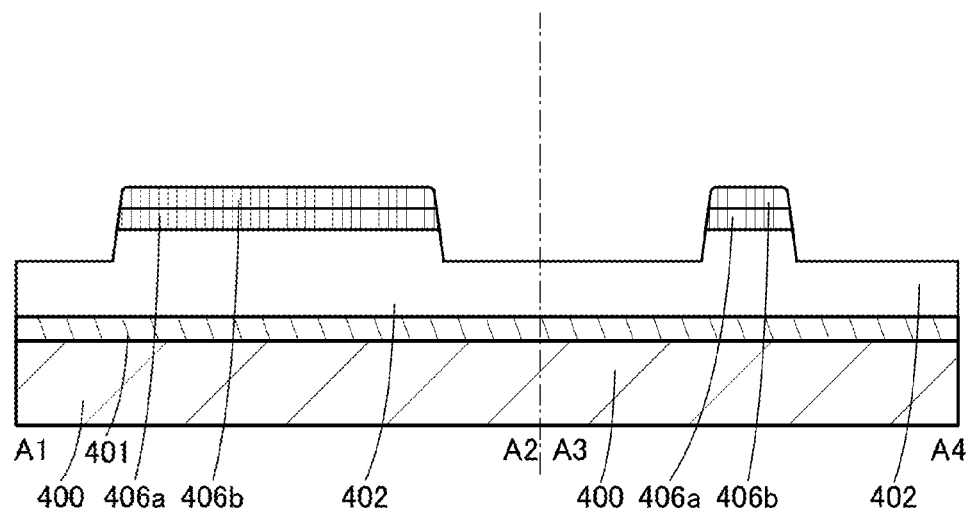

Next, the insulator to be the insulator 406a and the semiconductor to be the semiconductor 406b are processed by a photolithography process or the like, so that a layer including the insulator 406a and the semiconductor 406b is formed (see FIGS. 9A and 9B). Note that when the layer is formed, part of the insulator 402 may be etched and thinned in some cases. That is, the insulator 402 may have a protruding portion in a region in contact with the layer.

Next, the conductor to be the conductor 416a is formed, and the conductor to be the conductor 416b is formed over the conductor to be the conductor 416a. The conductor to be the conductor 416a and the conductor to be the conductor 416b can be formed by a sputtering method, a CVD method, an MBE method, a PLD method, an ALD method, or the like.

Figure 10A:
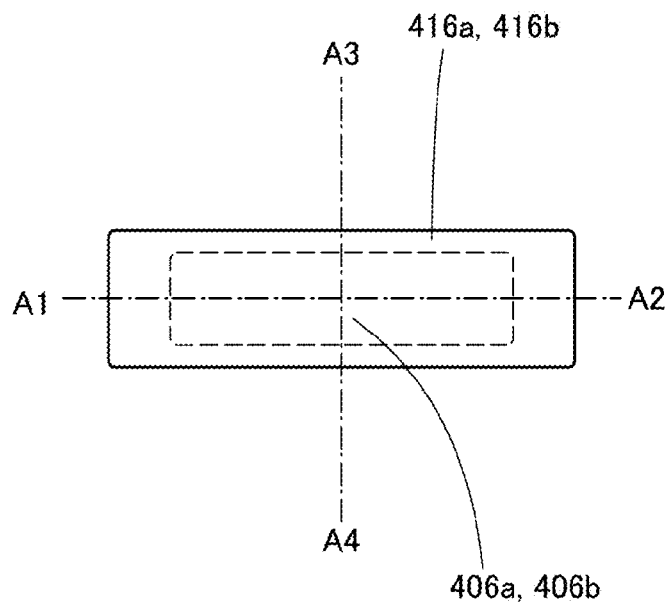
FIGS. 10A and 10B are a top view and a cross-sectional view illustrating a method for manufacturing a transistor of one embodiment of the present invention.
Figure 10B:
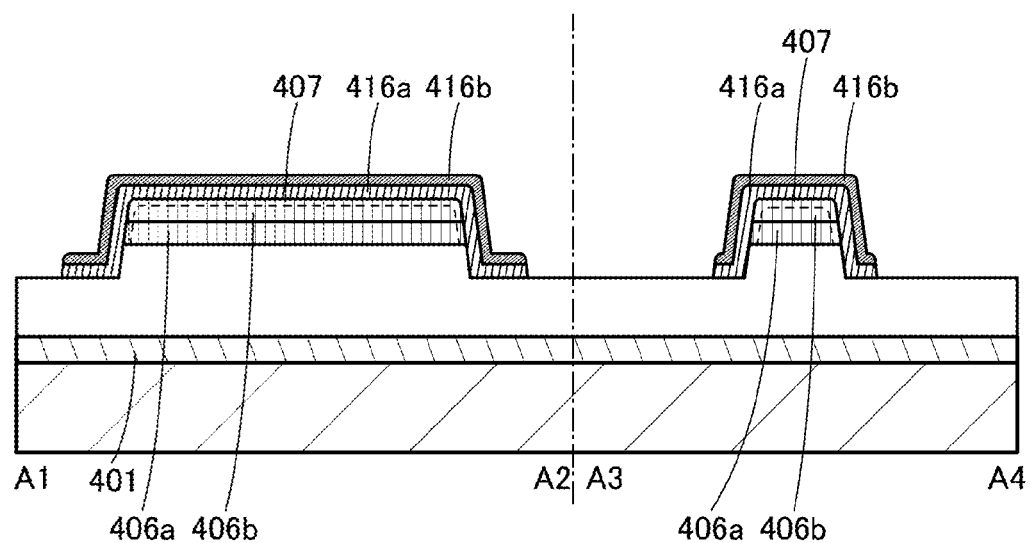

Next, the conductor to be the conductor 416a and the conductor to be the conductor 416b are processed by a photolithography method or the like, thereby forming the conductor layer including the conductors 416a and 416b (see FIGS. 10A and 10B). Note that the conductor layer covers the layer. Here, when the conductor 416a is formed over the layer, a region 407 denoted by a dotted line in FIG. 10B is formed by damaging the side surface of the insulator 406a and the top surface and the side surface of the semiconductor 406b. Since the region 407 includes a region where the resistance of the insulator 406a and the semiconductor 406b is reduced, the contact resistance between the conductors 416a and 416b and the semiconductor 406b is reduced.

In the photolithography method, first, a resist is exposed to light through a photomask. Next, a region exposed to light is removed or left using a developing solution, so that a resist mask is formed. Then, etching through the resist mask is conducted. As a result, a conductor, a semiconductor, an insulator, or the like can be processed into a desired shape. The resist mask is formed by, for example, exposure of the resist to light using KrF excimer laser light, ArF excimer laser light, extreme ultraviolet (EUV) light, or the like. Alternatively, a liquid immersion technique may be employed in which a portion between a substrate and a projection lens is filled with liquid (e.g., water) to perform light exposure. An electron beam or an ion beam may be used instead of the above-mentioned light. Note that a photomask is not necessary in the case of using an electron beam or an ion beam. For the removal of the resist mask, dry etching treatment such as ashing, wet etching treatment, or both can be used.

Figure 11A:
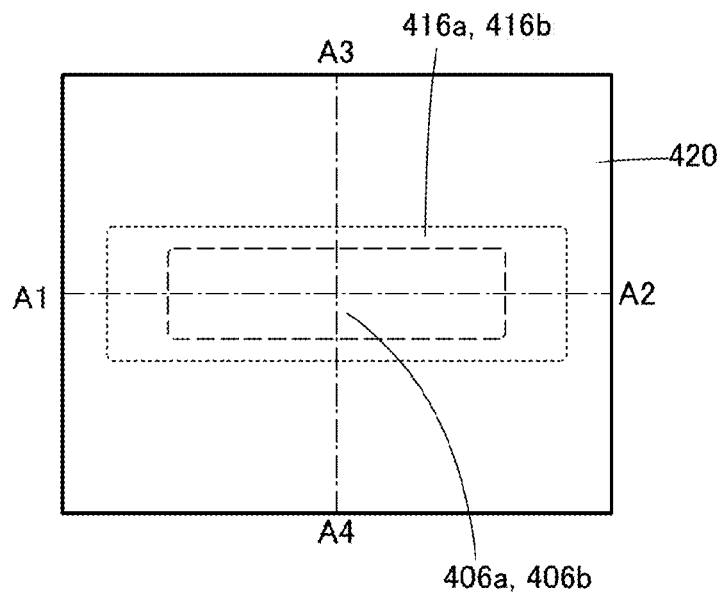
FIGS. 11A and 11B are a top view and a cross-sectional view illustrating a method for manufacturing a transistor of one embodiment of the present invention.
Figure 11B:
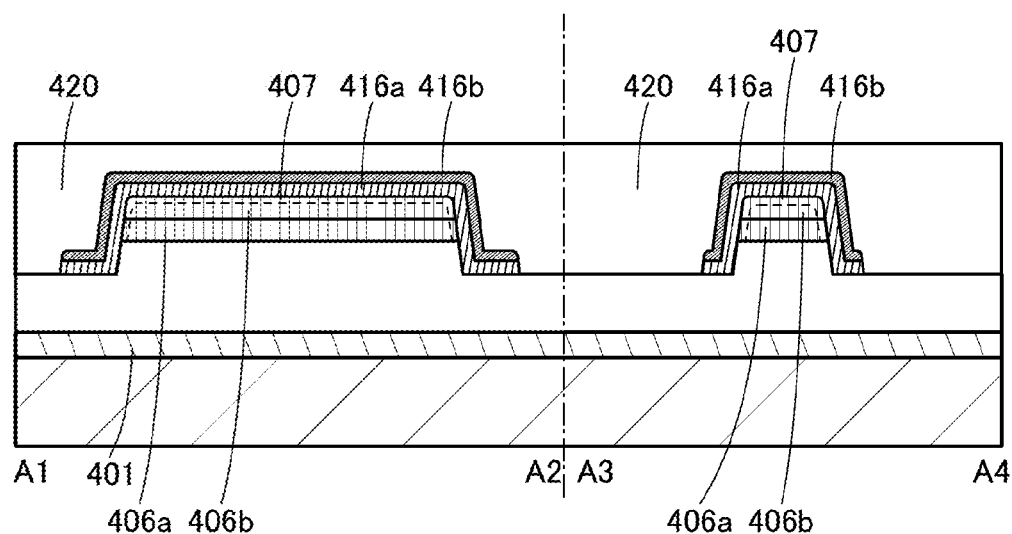

Then, the insulator 420 is formed (see FIGS. 11A and 11B). The insulator 420 can be formed by a sputtering method, a CVD method, an MBE method, a PLD method, an ALD method, or the like. Alternatively, the insulator 420 can be formed by a spin coating method, a dipping method, a droplet discharging method (such as an ink-jet method), a printing method (such as screen printing or offset printing), a doctor knife method, a roll coater method, a curtain coater method, or the like.

The insulator 420 is formed to have a flat top surface. For example, the top surface of the insulator 420 may have planarity immediately after the film formation. Alternatively, after the film formation, an upper portion of the insulator 420 may be removed so that the top surface of the insulator 420 becomes parallel to a reference surface such as a rear surface of the substrate. Such treatment is referred to as planarization treatment. As the planarization treatment, for example, chemical mechanical polishing (CMP) treatment, dry etching treatment, or the like can be performed. However, the top surface of the insulator 420 is not necessarily flat.

Next, the insulator 420 is processed by the photolithography method or the like, so that the insulator 410 is formed.

Figure 12A:
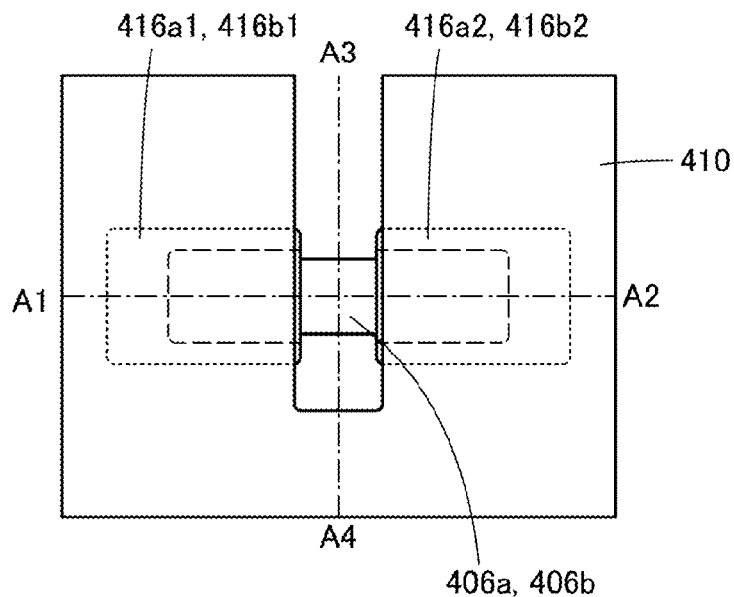
FIGS. 12A and 12B are a top view and a cross-sectional view illustrating a method for manufacturing a transistor of one embodiment of the present invention.
Figure 12B:
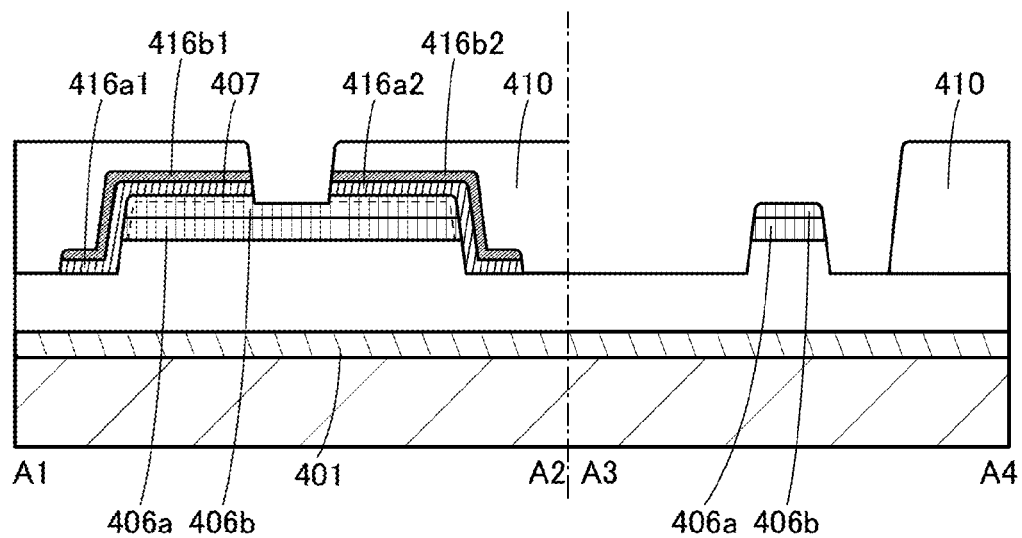

Next, the conductor layer including the conductor 416a and the conductor 416b is processed, whereby the conductor layer is separated into a conductor layer including the conductor 416a1 and the conductor 416b1 and a conductor layer including the conductor 416a2 and the conductor 416b2 (see FIGS. 12A and 12B). Note that the insulator 420 and the conductor layer including the conductor 416a and the conductor 416b may be processed in the same photolithography process. Processing in the same photolithography process can reduce the number of manufacturing steps. Thus, productivity of a semiconductor device including the transistor can be increased. Alternatively, the insulator 420 and the conductor layer including the conductor 416a and the conductor 416b may be processed in different photolithography processes. Processing in different photolithography processes may facilitate formation of films with different shapes.

Here, the region 407 in the exposed surface of the semiconductor 406b is removed by the processing of the conductor layer including the conductor 416a and the conductor 416b. Alternatively, the region 407 may be removed by wet etching, for example. In this manner, the resistance of the exposed surface of the semiconductor 406b (i.e., a channel formation region) is increased.

On the other hand, it is preferable that the region 407 that is the side surface of the insulator 406a, the side surface of the semiconductor 406b, and the top surface of the semiconductor 406b which are in contact with the conductors 416a1 and 416a2, have low resistance as described above because the contact resistance between the conductors 416a1 and 416a2 and the semiconductor 406b is lowered, and favorable transistor characteristics can be obtained.

Next, an insulator to be the insulator 406c is formed, and an insulator to be the insulator 412 is formed over the insulator to be the insulator 406c. The insulator to be the insulator 406c and the insulator to be the insulator 412 can be formed by a sputtering method, a CVD method, an MBE method, a PLD method, an ALD method, or the like. The insulator to be the insulator 406c and the insulator to be the insulator 412 are formed to have the uniform thickness along bottom and side surfaces of an opening formed by the insulator 410, the conductor 416a1, the conductor 416b1, the conductor 416a2, and the conductor 416b2. Therefore, the ALD method is preferably used.

Next, a conductor to be the conductor 404a, a conductor to be the conductor 404b, and a conductor to be the conductor 404c are formed. The conductor to be the conductor 404a, the conductor to be the conductor 404b, and the conductor to be the conductor 404c can be formed by a sputtering method, a CVD method, an MBE method, a PLD method, an ALD method, or the like. The conductor to be the conductor 404a, the conductor to be the conductor 404b, and the conductor to be the conductor 404c are formed so as to fill the opening formed by the insulator 410 and others. Therefore, a CVD method (an MCVD method, in particular) is preferred. A stacked-layer film of a conductor formed by an ALD method or the like and a conductor formed by a CVD method is preferred in some cases to increase adhesion of the conductor formed by an MCVD method. For example, a stacked-layer film where titanium nitride and tungsten are formed in this order may be used.

Next, the conductor to be the conductor 404a, the conductor to be the conductor 404b, and the conductor to be the conductor 404c are processed by a photolithography method or the like, whereby a gate electrode including the conductors 404a, 404b, and 404c is formed.

Figure 13A:
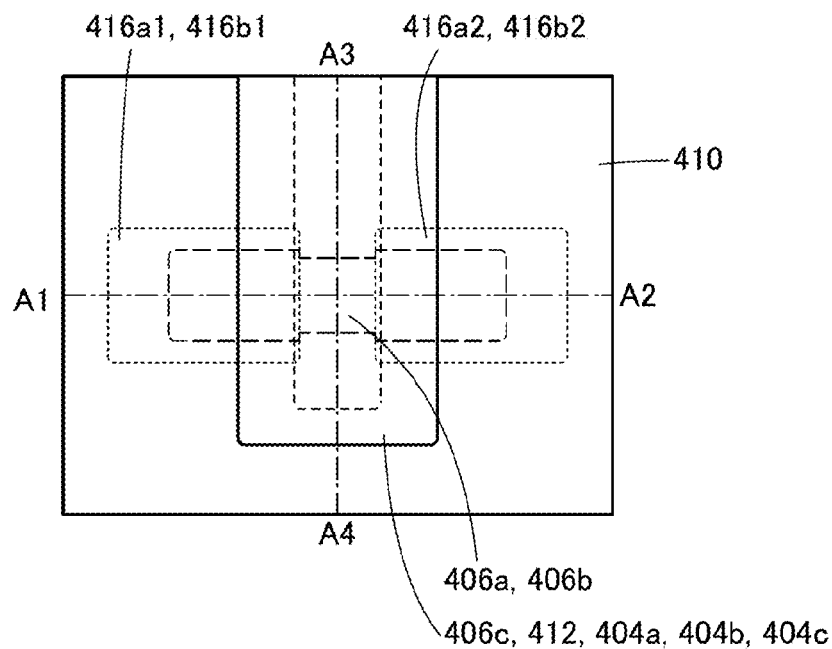
FIGS. 13A and 13B are a top view and a cross-sectional view illustrating a method for manufacturing a transistor of one embodiment of the present invention.
Figure 13B:
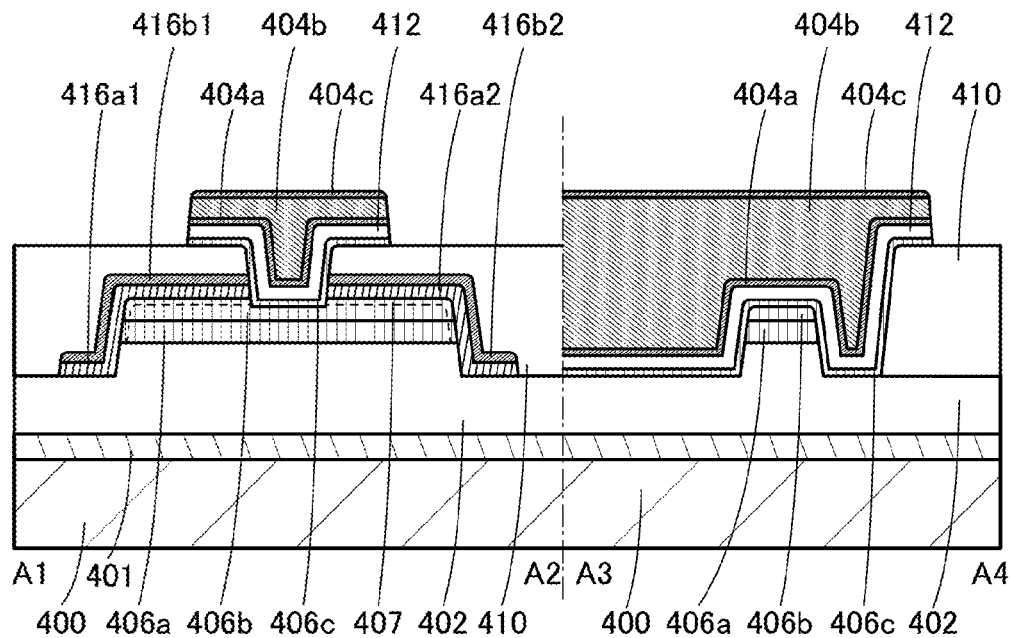
Figure 14A:
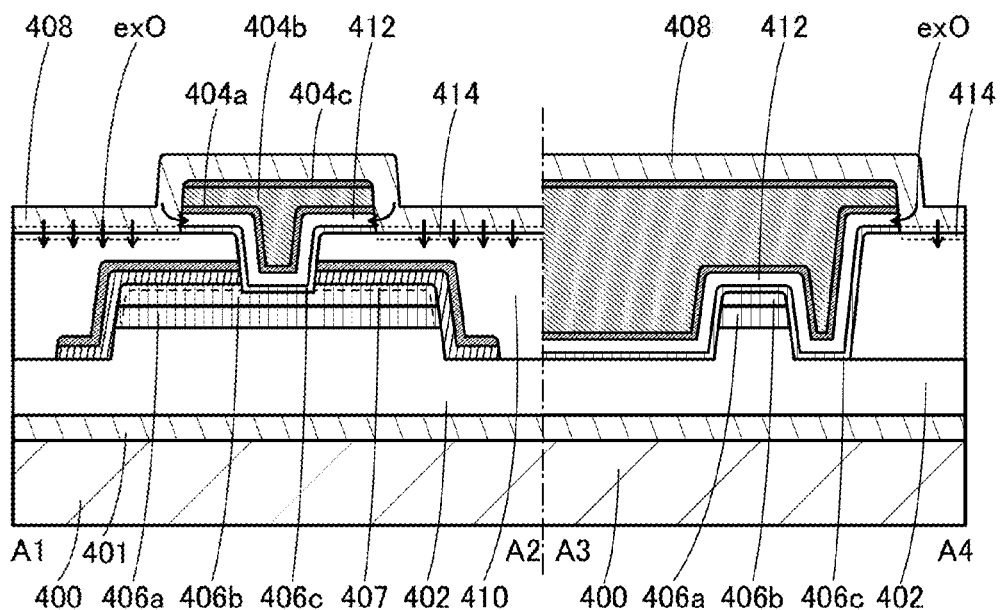
FIGS. 14A and 14B are cross-sectional views illustrating the method for manufacturing a transistor of one embodiment of the present invention.
Figure 14B:
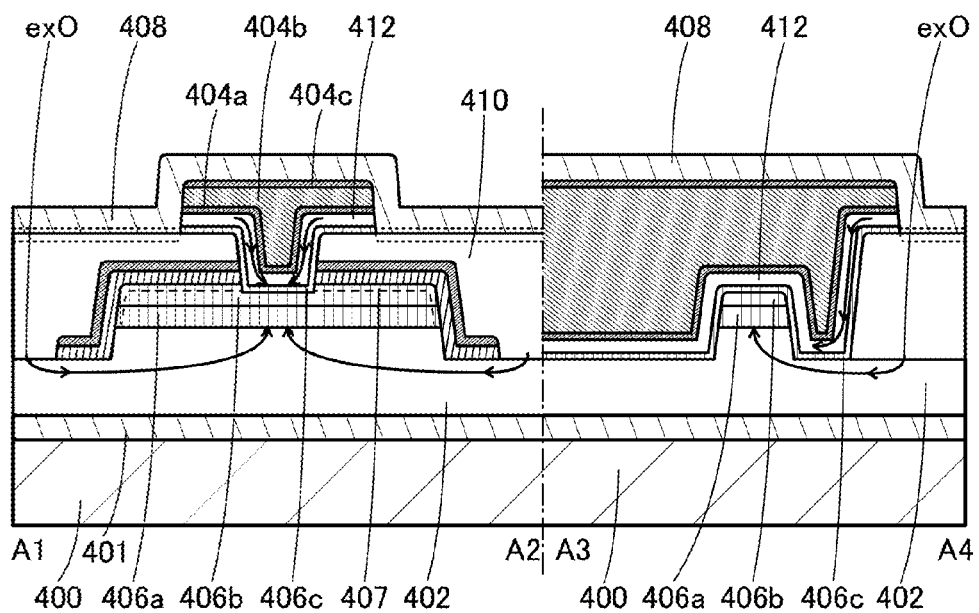

Next, the insulator to be the insulator 412 and the insulator to be the insulator 406c are processed by a photolithography method, whereby the insulator 412 and the insulator 406c are formed (see FIGS. 13A and 13B). Note that the conductors 404a, 404b, and 404c and the insulators 412 and 406c may be processed in the same photolithography process. Processing in the same photolithography process can reduce the number of manufacturing steps. Thus, productivity of a semiconductor device including the transistor can be increased. Alternatively, the conductors 404a, 404b, and 404c and the insulators 412 and 406c may be processed in different photolithography processes. Processing in different photolithography processes may facilitate formation of films with different shapes. Though an example where the insulator 412 and the insulator 406c are processed is shown here, the transistor of one embodiment of the present invention is not limited thereto. For example, the insulator 412 and the insulator 406c may be used without being processed in some cases.

Next, an insulator to be the insulator 408 is formed over the insulator 410 and a gate electrode. The insulator to be the insulator 408 can be formed by a sputtering method, a CVD method, an MBE method, a PLD method, an ALD method, or the like. An aluminum oxide film is preferably formed as the insulator to be the insulator 408 using plasma containing oxygen, so that oxygen in the plasma can be added to side surfaces of the insulator 410 and the insulator 412 as excess oxygen. Here, a mixed region 414 containing a large amount of excess oxygen might be formed in interface between the insulator to be the insulator 408 and the insulator 410 and the vicinity of the interface (see FIG. 14A).

Second heat treatment may be performed at any time after the formation of the insulator to be the insulator 408. By the second heat treatment, the excess oxygen contained in the insulator 410 and the mixed region 414 is moved to the semiconductor 406b through the insulators 402 and 406a. Furthermore, excess oxygen contained in the insulator 410 is moved to the semiconductor 406b through the insulator 412. Since excess oxygen is moved to the semiconductor 406b by passing two paths as described above, defects (oxygen vacancies) in the semiconductor 406b can be reduced (see FIG. 14B).

Note that the second heat treatment may be performed at a temperature such that excess oxygen (oxygen) in the insulator 410 and the mixed region 414 is diffused to the semiconductor 406b. For example, the description of the first heat treatment may be referred to for the second heat treatment. Alternatively, the temperature of the second heat treatment is preferably lower than that of the first heat treatment. The second heat treatment is preferably performed at a temperature lower than that of the first heat treatment by higher than or equal to 20° C. and lower than or equal to 150° C., preferably higher than or equal to 40° C. and lower than or equal to 100° C. Accordingly, superfluous release of excess oxygen (oxygen) from the insulator 402 can be inhibited. Note that the second heat treatment is not necessarily performed when heating during formation of the films can work as heat treatment comparable to the second heat treatment.

Next, an insulator to be the insulator 428 is formed over the insulator 408. The insulator to be the insulator 428 can be formed by a sputtering method, a CVD method, an MBE method, a PLD method, an ALD method, or the like.

Through the above steps, the transistor illustrated in FIGS. 1A and 1B can be manufactured.

Figure 15A:
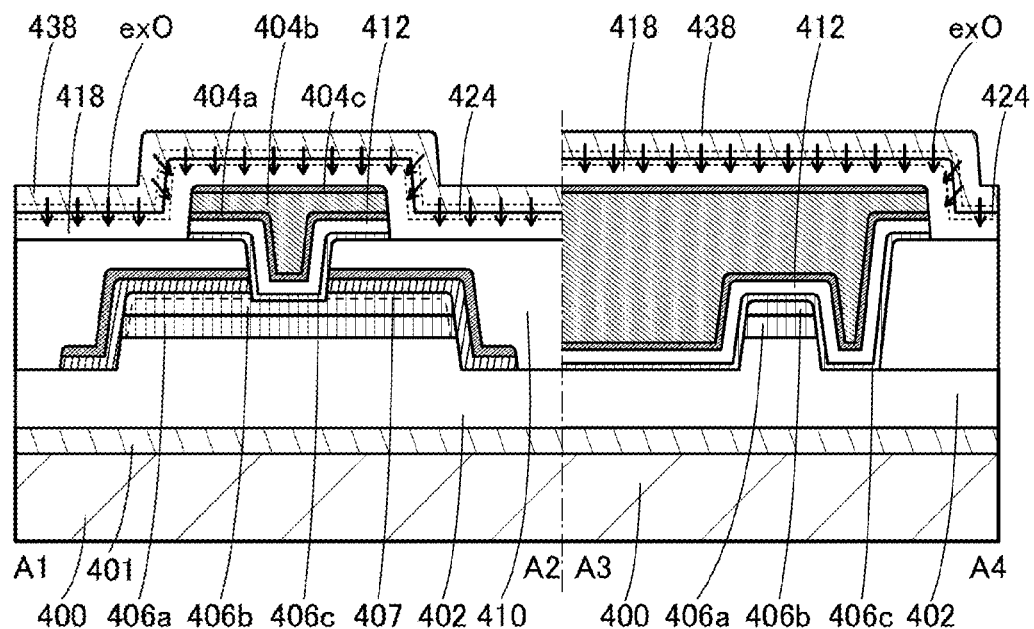
FIGS. 15A and 15B are cross-sectional views illustrating a method of manufacturing a transistor of one embodiment of the present invention.

A transistor having a structure different from that in FIGS. 1A and 1B is illustrated in FIG. 15A. The structure of the transistor illustrated in FIG. 15A is different from the structure of the transistor in FIGS. 1A and 1B in that an insulator 418 is formed over the insulator 410 and the gate electrode, and an insulator 438 which corresponds to the insulator 408 in the transistor in FIGS. 1A and 1B is formed over the insulator 418.

The insulator 438 can be formed by a sputtering method, a CVD method, an MBE method, a PLD method, an ALD method, or the like. An aluminum oxide film is preferably formed as the insulator 438 using plasma containing oxygen so that oxygen in the plasma can be added to the insulator 418 as excess oxygen. Here, a mixed region 424 containing a large amount of excess oxygen might be formed in the interface between the insulator 438 and the insulator 418 and the vicinity of the interface (see FIG. 15A).

Figure 15B:
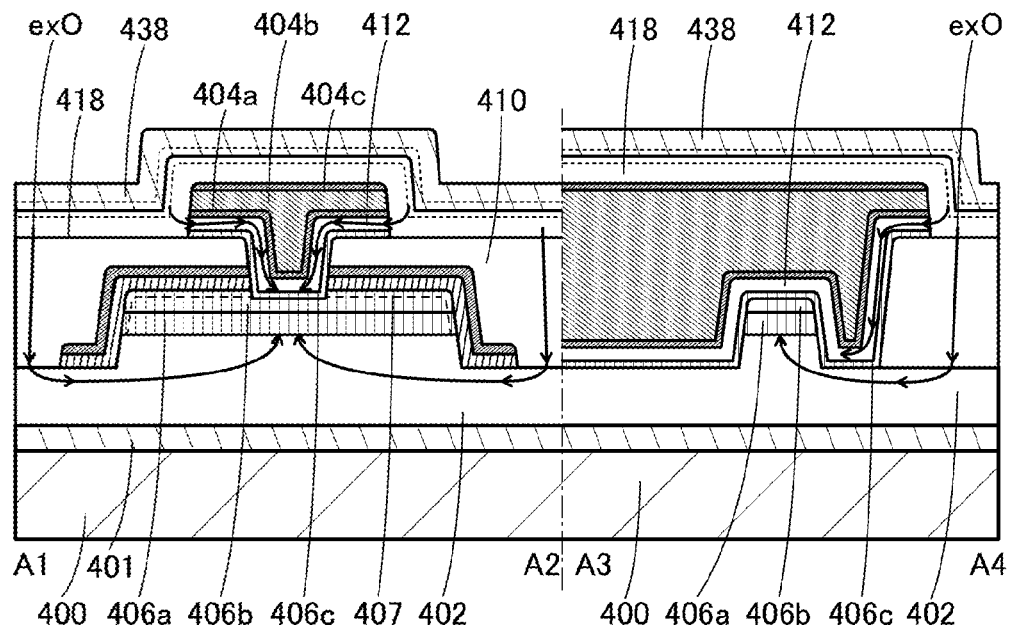

Second heat treatment may be performed at any time after the formation of the insulator 438. By the second heat treatment, the excess oxygen contained in the insulator 418 and the mixed region 424 is moved to the semiconductor 406b through the insulators 410, 402 and 406a. Furthermore, excess oxygen contained the insulator 418 and the mixed region 424 is moved to the semiconductor 406b through the insulator 412. Since excess oxygen is moved to the semiconductor 406b by passing two paths as described above, defects (oxygen vacancies) in the semiconductor 406b can be reduced (see FIG. 15B).

Figure 16A:
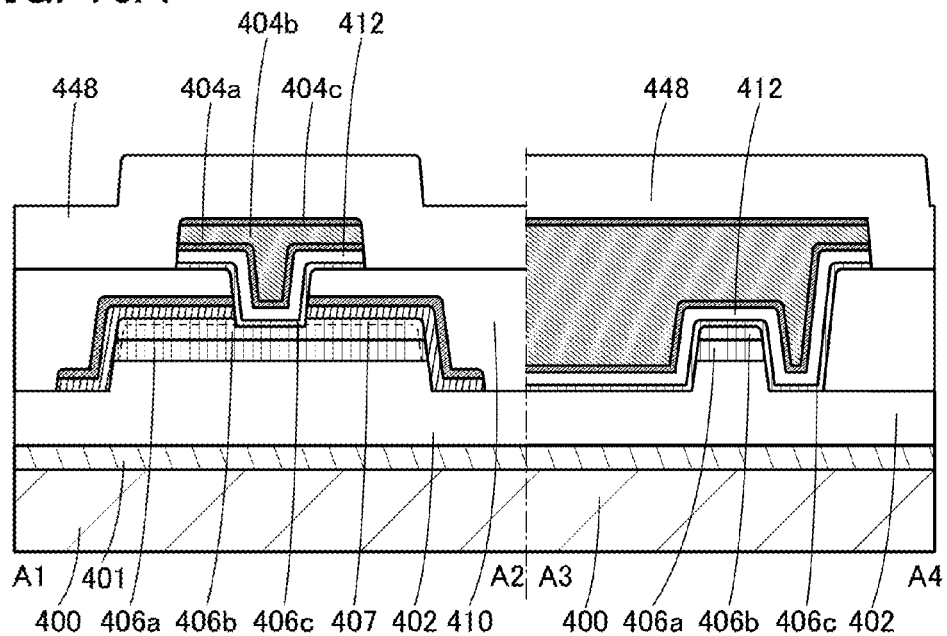
FIGS. 16A and 16B are cross-sectional views illustrating a method of manufacturing a transistor of one embodiment of the present invention.
Figure 16B:
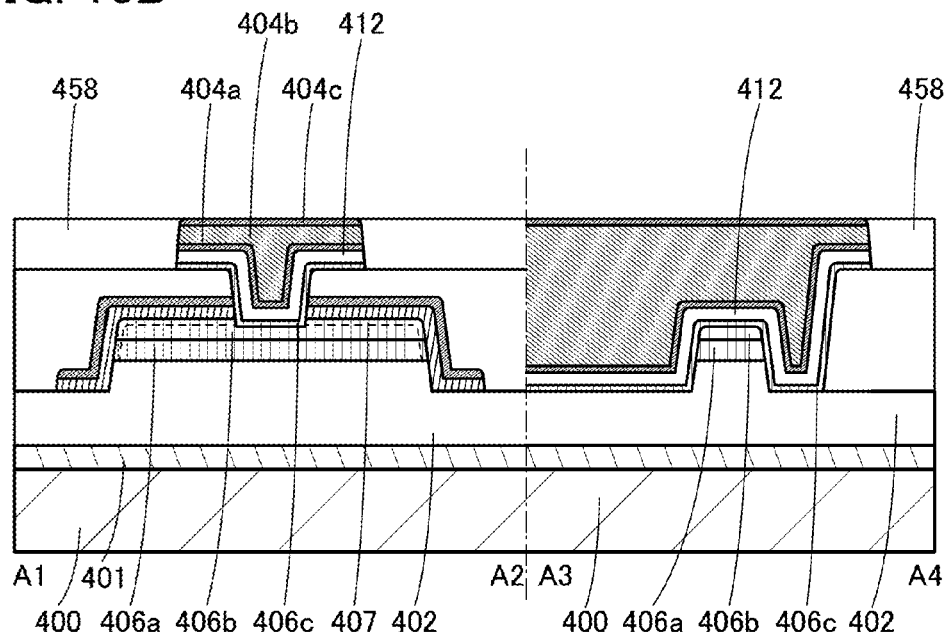

Here, different structures of an insulating film over the insulator 410 and the gate electrode are described with reference to FIGS. 16A and 16B.

An insulator 448 is formed over the insulator 410 and the gate electrode. The insulator 448 is formed to have a thickness larger than a difference in height between the top surface of the insulator 410 and the top surface of the gate electrode (see FIG. 16A). The insulator 448 can be formed by a sputtering method, a CVD method, an MBE method, a PLD method, an ALD method, or the like.

Then, CMP treatment is performed on the insulator 448 until the conductor 404c which is the top surface of the gate electrode is exposed. At this time, the conductor 404c serves as a CMP stopper film. In such a manner, the insulator 448 is planarized to form an insulator 458 (see FIG. 16B).

Since the top surface of the insulator 458 is planarized, the subsequent formation of a wiring layer or the like becomes easy, which is preferable.

Figure 17A:
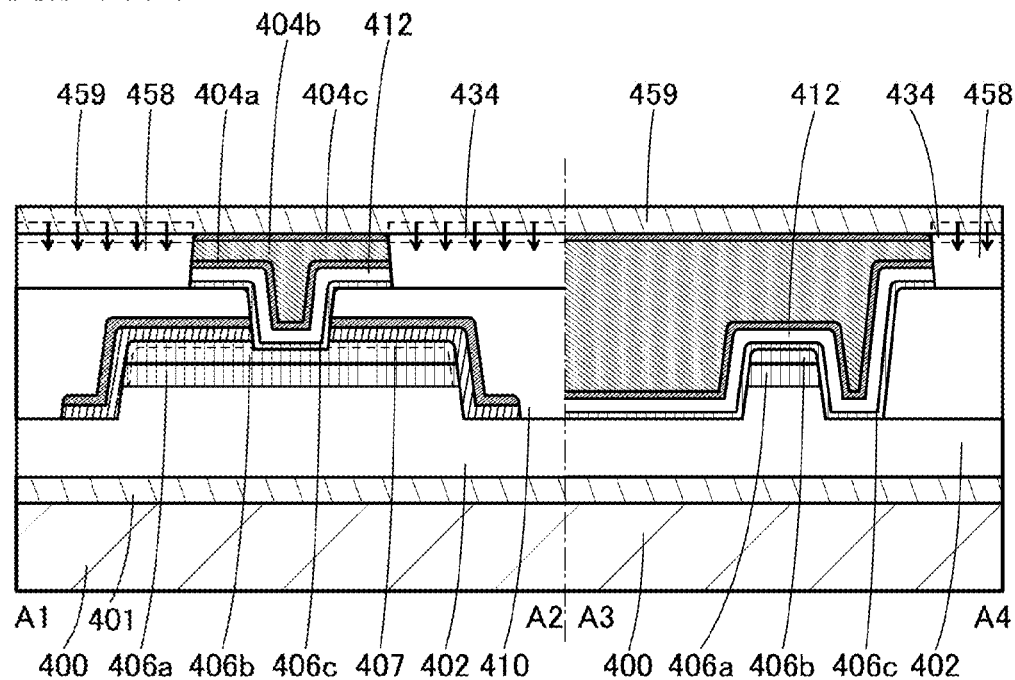
FIGS. 17A and 17B are cross-sectional views illustrating a method of manufacturing a transistor of one embodiment of the present invention.

Next, an insulator 459 corresponding to the insulator 408 of the transistor in FIGS. 1A and 1B is formed over the insulator 458. The insulator 459 can be formed by a sputtering method, a CVD method, an MBE method, a PLD method, an ALD method, or the like. An aluminum oxide film is preferably formed as the insulator 459 using plasma containing oxygen so that oxygen in the plasma can be added to the insulator 458 as excess oxygen. Here, a mixed region 434 containing a large amount of excess oxygen might be formed in the interface between the insulator 459 and the insulator 458 and the vicinity of the interface (see FIG. 17A).

Figure 17B:
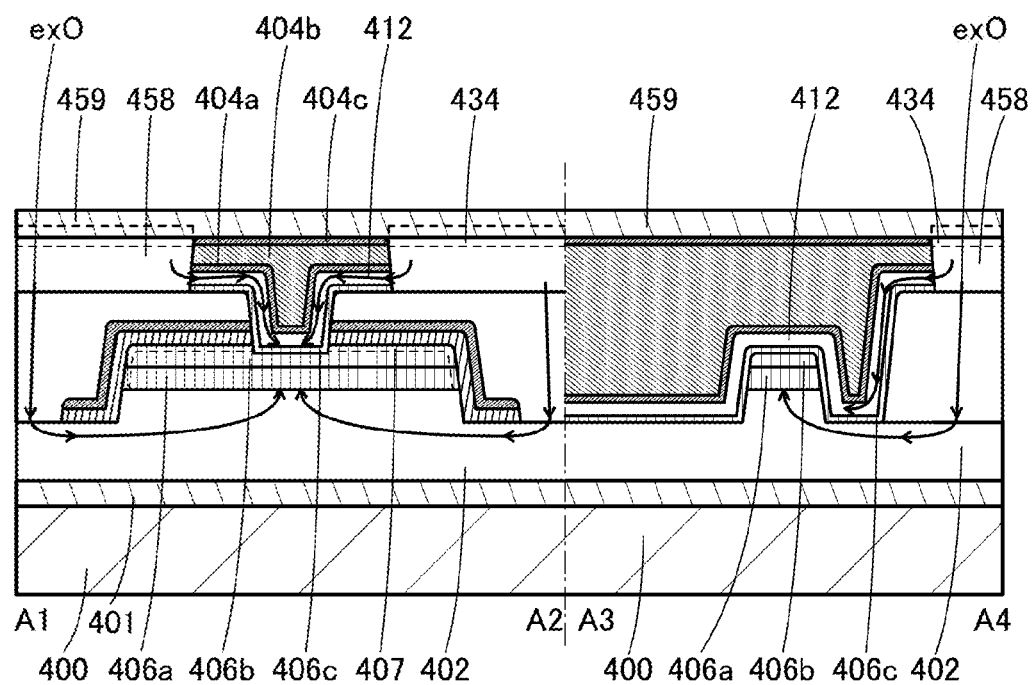
Figure 18A:
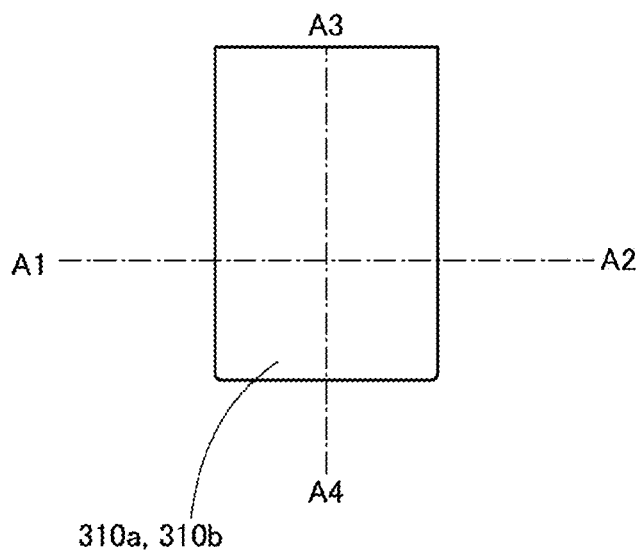
FIGS. 18A and 18B are a top view and a cross-sectional view illustrating a method for manufacturing a transistor of one embodiment of the present invention.
Figure 18B:
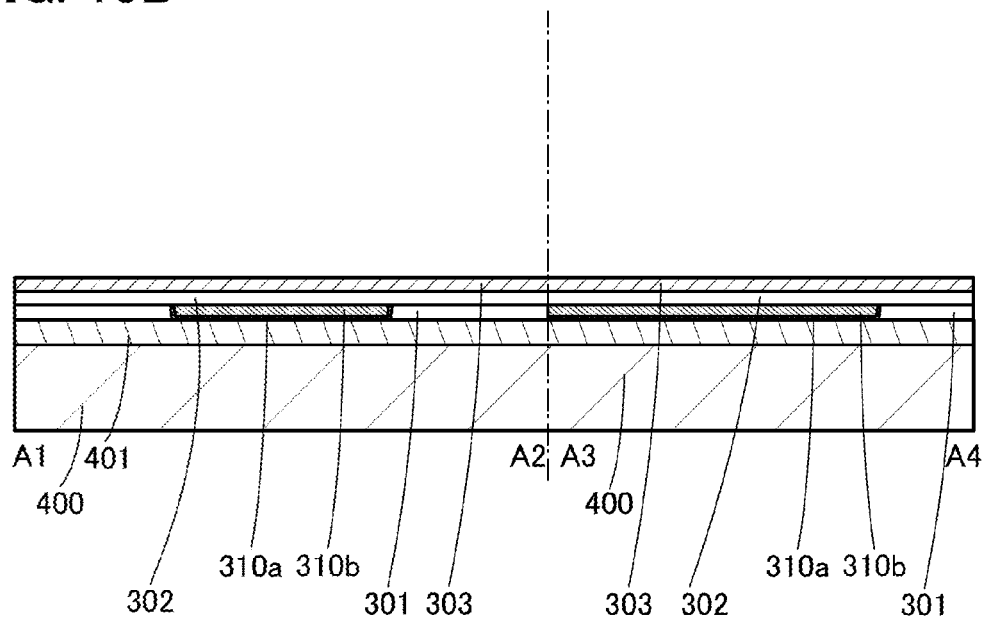

Second heat treatment may be performed at any time after the formation of the insulator 459. By the second heat treatment, the excess oxygen contained in the insulator 458 and the mixed region 434 is moved to the semiconductor 406*b* through the insulators 410, 402 and 406*a*. Furthermore, excess oxygen contained in the insulator 458 and the mixed region 434 is moved to the semiconductor 406*b* through the insulator 412. Since excess oxygen is moved to the semiconductor 406*b* by passing two paths as described above, defects (oxygen vacancies) in the semiconductor 406*b* can be reduced (see FIG. 17B).

Since the gate line width can be reduced, the transistor is easily miniaturized. In addition, since the parasitic capacitance between the gate electrode and the source electrode or the drain electrode is small, the transistor can have high frequency characteristics.

<Manufacturing Method of Transistor Structure 2>

A method for manufacturing the transistor illustrated in FIGS. 2A and 2B will be described below with reference to FIGS. 18A and 18B, FIGS. 19A and 19B, FIGS. 20A and 20B, FIGS. 21A and 21B, FIGS. 22A and 22B, FIGS. 23A and 23B, and FIGS. 24A and 24B.

First, the substrate 400 is prepared.

Next, the insulator 401 is formed. The insulator 401 can be formed by a sputtering method, a CVD method, an MBE method, a PLD method, an ALD method, or the like.

Next, the insulator 301 is formed over the insulator 401. The insulator 301 can be formed by a sputtering method, a CVD method, an MBE method, a PLD method, an ALD method, or the like.

Then, a groove is formed in the insulator 301 so as to reach the insulator 401. Examples of the groove include a hole and an opening. In forming the groove, wet etching may be employed; however, dry etching is preferably employed in terms of microfabrication. The insulator 401 is preferably an insulator that serves as an etching stopper film used in forming the groove by etching the insulator 301. For example, in the case where a silicon oxide film is used as the insulator 301 in which the groove is to be formed, the insulator 401 is preferably formed using a silicon nitride film, an aluminum oxide film, or a hafnium oxide film.

After the formation of the groove, a conductor to be the conductor 310*a* is formed. It is preferable that the conductor to be the conductor 310*a* is less likely allow the passage of oxygen. Alternatively, the conductor to be the conductor 310*a* preferably less likely allows the passage of oxygen than the conductor to be the conductor 310*b*. For example, tantalum nitride, tungsten nitride, or titanium nitride can be used. The conductor to be the conductor 310*a* can be formed by a sputtering method, a CVD method, an MBE method, a PLD method, an ALD method, or the like. Then, the conductor to be the conductor 310*b* is formed over the conductor to be the conductor 310*a*. The conductor to be the conductor 310*b* preferably has low resistance. For example, tantalum, tungsten, titanium, molybdenum, aluminum, copper, or a molybdenum-tungsten alloy can be used. The conductor to be the conductor 310*b* can be formed by a method similar to that for the conductor to be the conductor 310*a*.

Next, CMP is performed to remove a conductor over the insulator 301. Consequently, the conductor remains only in the groove, whereby a wiring layer with a flat top surface including the conductor 310*b* and the conductor 310*a* can be formed.

Next, the insulator 302 is formed over the insulator 301, the conductor 310*b*, and the conductor 310*a*. The insulator 302 can be formed by a sputtering method, a CVD method, an MBE method, a PLD method, an ALD method, or the like. The insulator 303 is formed over the insulator 302. It is preferable that the insulator 303 hardly allow impurities such as oxygen and hydrogen to pass therethrough. It is preferable to use, for example, a silicon nitride film, an aluminum oxide film, or a hafnium oxide film. The insulator 303 can be formed by a sputtering method, a CVD method, an MBE method, a PLD method, an ALD method, or the like (see FIGS. 18A and 18B).

Next, the insulator 402 is formed over the insulator 303. The insulator 402 can be formed by a sputtering method, a CVD method, an MBE method, a PLD method, an ALD method, or the like.

Next, treatment to add oxygen to the insulator 402 may be performed. An ion implantation method, a plasma treatment method, or the like can be used for the treatment to add oxygen. Note that oxygen added to the insulator 402 is excess oxygen.

Next, an insulator to be the insulator 406*a* is formed. The insulator to be the insulator 406*a* can be formed by a sputtering method, a CVD method, an MBE method, a PLD method, an ALD method, or the like.

Next, treatment to add oxygen to the insulator to be the insulator 406*a* may be performed. An ion implantation method, a plasma treatment method, or the like can be used for the treatment to add oxygen. Note that oxygen added to the semiconductor becomes excess oxygen. When a semiconductor is formed over the insulator to be the insulator 406*a*, oxygen is preferably added to the insulator to be the insulator 406*a*.

Next, the semiconductor to be the semiconductor 406*b* is formed over the insulator to be the insulator 406*a*. The semiconductor to be the semiconductor 406*b* can be formed by a sputtering method, a CVD method, an MBE method, a PLD method, an ALD method, or the like.

Next, first heat treatment is preferably performed. The first heat treatment can be performed at a temperature higher than or equal to 250° C. and lower than or equal to 650° C., preferably higher than or equal to 450° C. and lower than or equal to 600° C., further preferably higher than or equal to 520° C. and lower than or equal to 570° C. The first heat treatment is performed in an inert gas atmosphere or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. By the first heat treatment, crystallinity of the semiconductor can be increased. In addition, by the first heat treatment, impurities such as hydrogen and water can be removed.

Figure 19A:
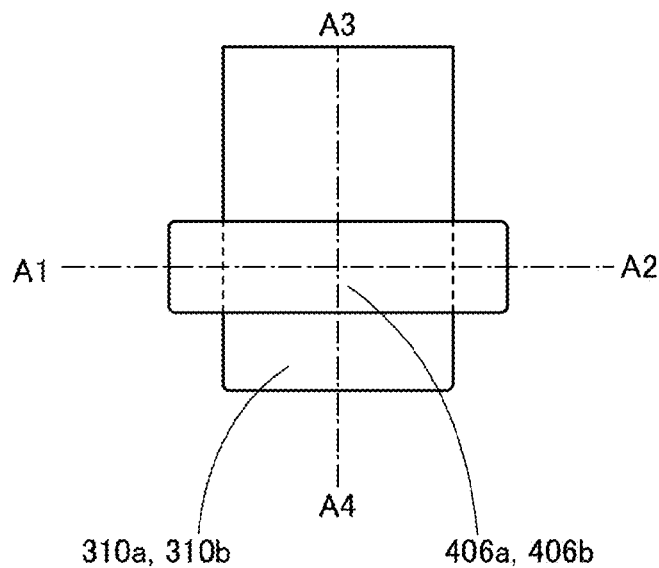
FIGS. 19A and 19B are a top view and a cross-sectional view illustrating a method for manufacturing a transistor of one embodiment of the present invention.
Figure 19B:
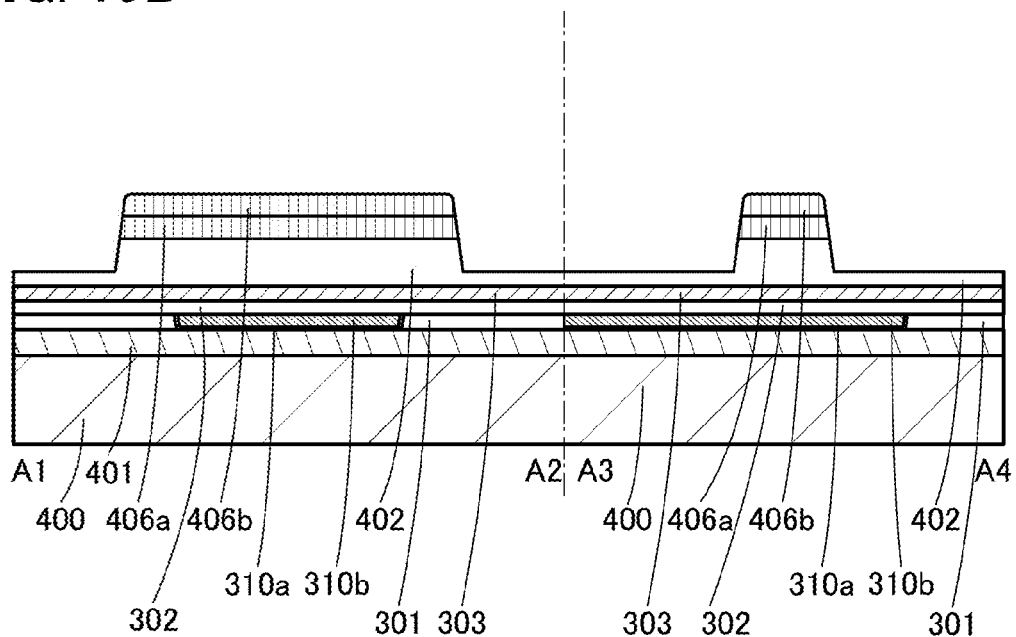

Next, the insulator to be the insulator 406a and the semiconductor to be the semiconductor 406b are processed by a photolithography process or the like, whereby a layer including the insulator 406a and the semiconductor 406b are formed (see FIGS. 19A and 19B). Note that when the layer is formed, part of the insulator 402 may be etched and thinned in some cases. That is, the insulator 402 may have a protruding portion in a region in contact with the layer.

Next, the conductor to be the conductor 416a is formed, and the conductor to be the conductor 416b is formed over the conductor to be the conductor 416a. The conductor to be the conductor 416a and the conductor to be the conductor 416b can be formed by a sputtering method, a CVD method, an MBE method, a PLD method, an ALD method, or the like.

Figure 20A:
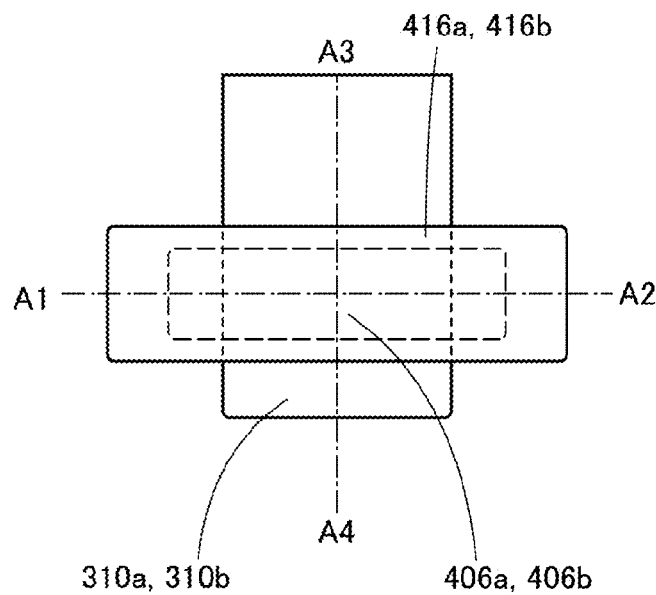
FIGS. 20A and 20B are a top view and a cross-sectional view illustrating a method for manufacturing a transistor of one embodiment of the present invention.
Figure 20B:
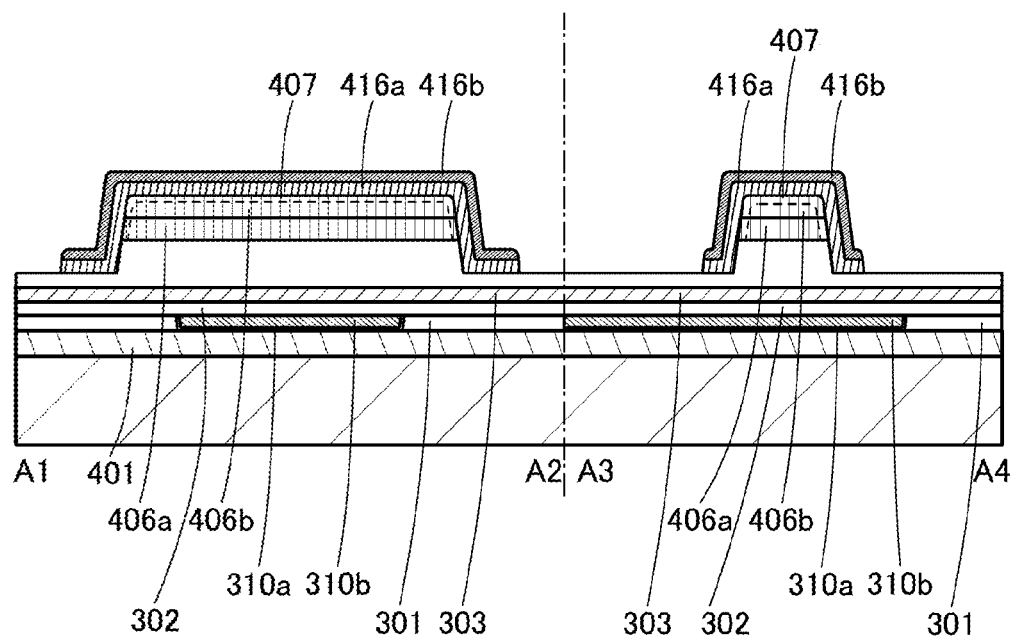

Next, the conductor to be the conductor 416a and the conductor to be the conductor 416b are processed by a photolithography process or the like, so that a conductor layer including the conductor 416a and the conductor 416b is formed (see FIGS. 20A and 20B). Note that the conductor layer covers the semiconductor layer. Here, when the conductor 416a is formed over the semiconductor layer, the region 407 denoted by a dotted line in FIG. 20B is formed by damaging the side surface of the insulator 406a and the top surface and the side surface of the semiconductor 406b. Since the region 407 includes a region where the resistance of the insulator 406a and the semiconductor 406b is reduced, the contact resistance between the conductors 416a and 416b and the semiconductor 406b is reduced.

Figure 21A:
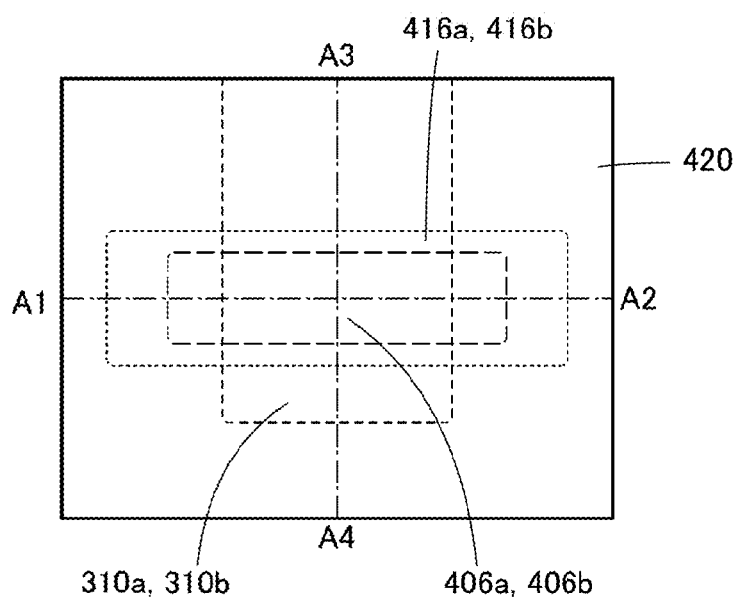
FIGS. 21A and 21B are a top view and a cross-sectional view illustrating a method for manufacturing a transistor of one embodiment of the present invention.
Figure 21B:
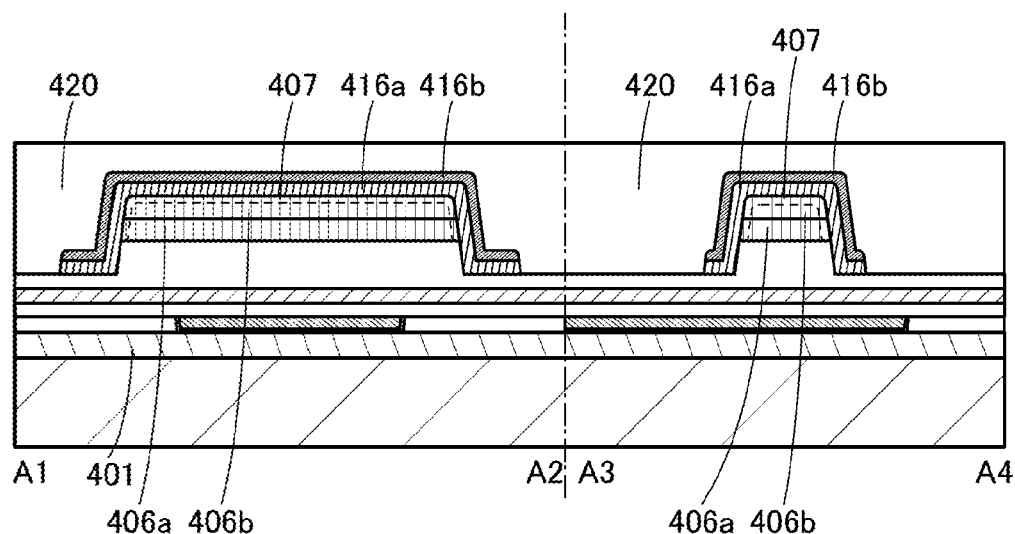

Then, the insulator 420 is formed (see FIGS. 21A and 21B). The insulator 420 can be formed by a sputtering method, a CVD method, an MBE method, a PLD method, an ALD method, or the like. Alternatively, the insulator 420 can be formed by a spin coating method, a dipping method, a droplet discharging method (such as an ink-jet method), a printing method (such as screen printing or offset printing), a doctor knife method, a roll coater method, a curtain coater method, or the like.

The insulator 420 is formed to have a flat top surface. For example, the top surface of the insulator 420 may have planarity immediately after the film formation. Alternatively, after the film formation, an upper portion of the insulator 420 may be removed so that the top surface of the insulator 420 becomes parallel to a reference surface such as a rear surface of the substrate. Such treatment is referred to as planarization treatment. As the planarization treatment, for example, chemical mechanical polishing (CMP) treatment, dry etching treatment, or the like can be performed. However, the top surface of the insulator 420 is not necessarily flat.

Next, the insulator 420 is processed by the photolithography method or the like, so that the insulator 410 is formed.

Figure 22A:
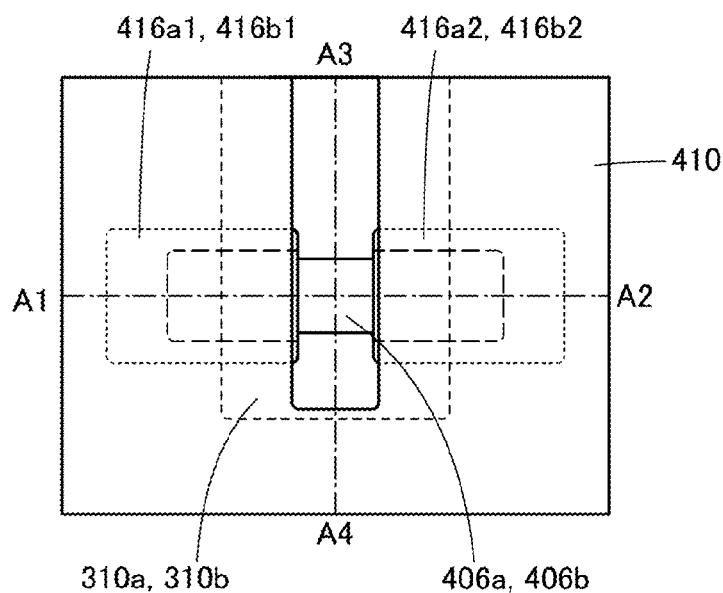
FIGS. 22A and 22B are a top view and a cross-sectional view illustrating a method for manufacturing a transistor of one embodiment of the present invention.
Figure 22B:
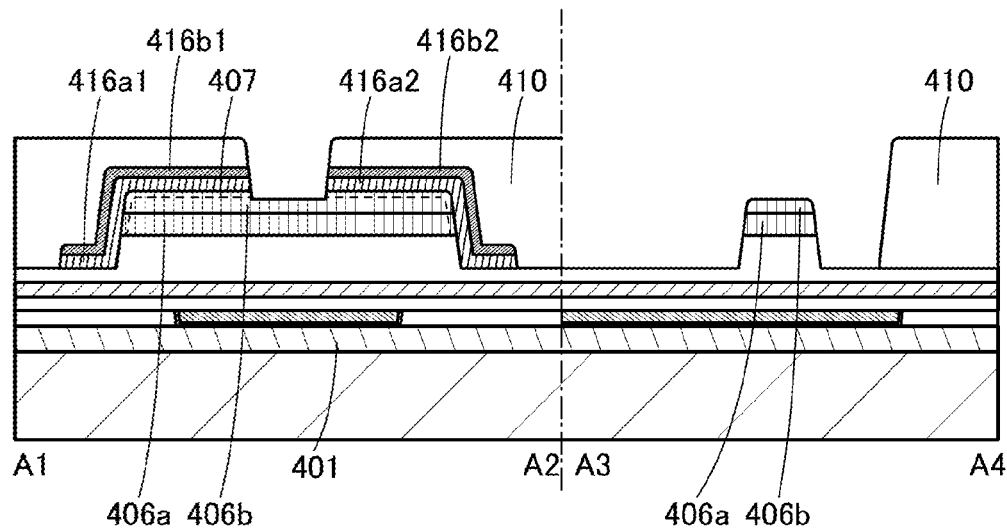

Next, the conductor layer including the conductor 416a and the conductor 416b is processed, whereby the conductor layer is separated into a conductor layer including the conductor 416a1 and the conductor 416b1 and a conductor layer including the conductor 416a2 and the conductor 416b2 (see FIGS. 22A and 22B). Note that the insulator 420 and the conductor layer including the conductor 416a and the conductor 416b may be processed in the same photolithography process. Processing in the same photolithography process can reduce the number of manufacturing steps. Thus, productivity of a semiconductor device including the transistor can be increased. Alternatively, the insulator 420 and the conductor layer including the conductor 416a and the conductor 416b may be processed in different photolithography processes. Processing in different photolithography processes may facilitate formation of films with different shapes.

Here, the semiconductor 406b is exposed. The region 407 in the exposed surface of the semiconductor 406b is removed by the processing of conductor layer including the conductor 416a and the conductor 416b. Alternatively, the region 407 may be removed by wet etching, for example. In this manner, the resistance of the exposed surface of the semiconductor 406b (i.e., a channel formation region) is increased.

On the other hand, it is preferable that the region 407 that is the side surface of the insulator 406a, the side surface of the semiconductor 406b, and the top surface of the semiconductor 406b which are in contact with the conductors 416a1 and 416a2, have low resistance as described above because the contact resistance between the conductors 416a1 and 416a2 and the semiconductor 406b is lowered, and favorable transistor characteristics can be obtained.

Next, the insulator to be the insulator 406c is formed, and the insulator to be the insulator 412 is formed over the insulator to be the insulator 406c. The insulator to be the insulator 406c and the insulator to be the insulator 412 can be formed by a sputtering method, a CVD method, an MBE method, a PLD method, an ALD method, or the like. The insulator to be the insulator 406c and the insulator to be the insulator 412 are formed to have the uniform thickness along bottom and side surfaces of an opening formed by the insulator 410, the conductor 416a1, the conductor 416b1, the conductor 416a2, and the conductor 416b2. Therefore, the ALD method is preferably used.

Next, the conductor to be the conductor 404a, the conductor to be the conductor 404b, and the conductor to be the conductor 404c are formed. The conductor to be the conductor 404a, the conductor to be the conductor 404b, and the conductor to be the conductor 404c can be formed by a sputtering method, a CVD method, an MBE method, a PLD method, an ALD method, or the like. The conductor to be the conductor 404a, the conductor to be the conductor 404b, and the conductor to be the conductor 404c are formed so as to fill the opening formed by the insulator 410 and others. Therefore, a CVD method (an MCVD method, in particular) is preferred. A stacked-layer film of a conductor formed by an ALD method or the like and a conductor formed by a CVD method is preferred in some cases to increase adhesion of the conductor formed by an MCVD method. For example, a stacked-layer film where titanium nitride and tungsten are formed in this order may be used.

Next, the conductor to be the conductor 404a, the conductor to be the conductor 404b, and the conductor to be the conductor 404c are processed by a photolithography method or the like, so that a gate electrode including the conductor 404a, the conductor 404b, and the conductor 404c is formed.

Figure 23A:
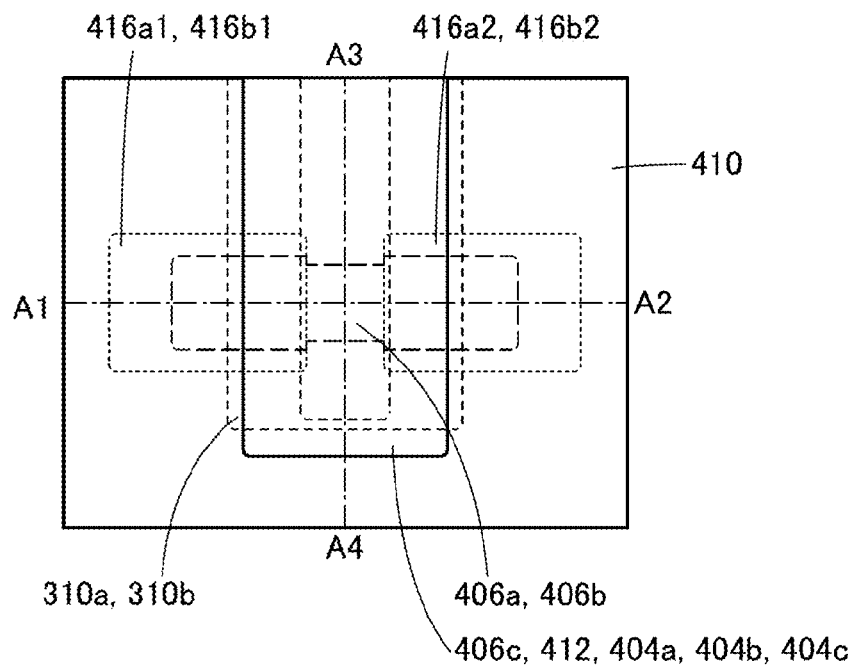
FIGS. 23A and 23B are a top view and a cross-sectional view illustrating a method for manufacturing a transistor of one embodiment of the present invention.
Figure 23B:
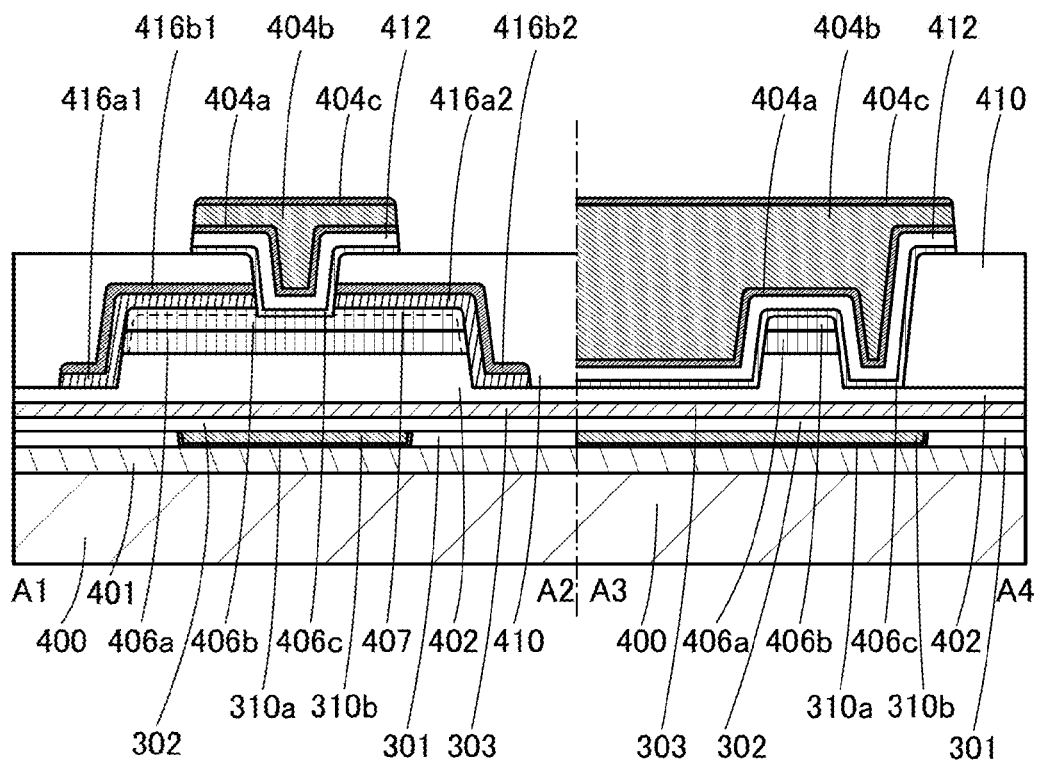
Figure 24A:
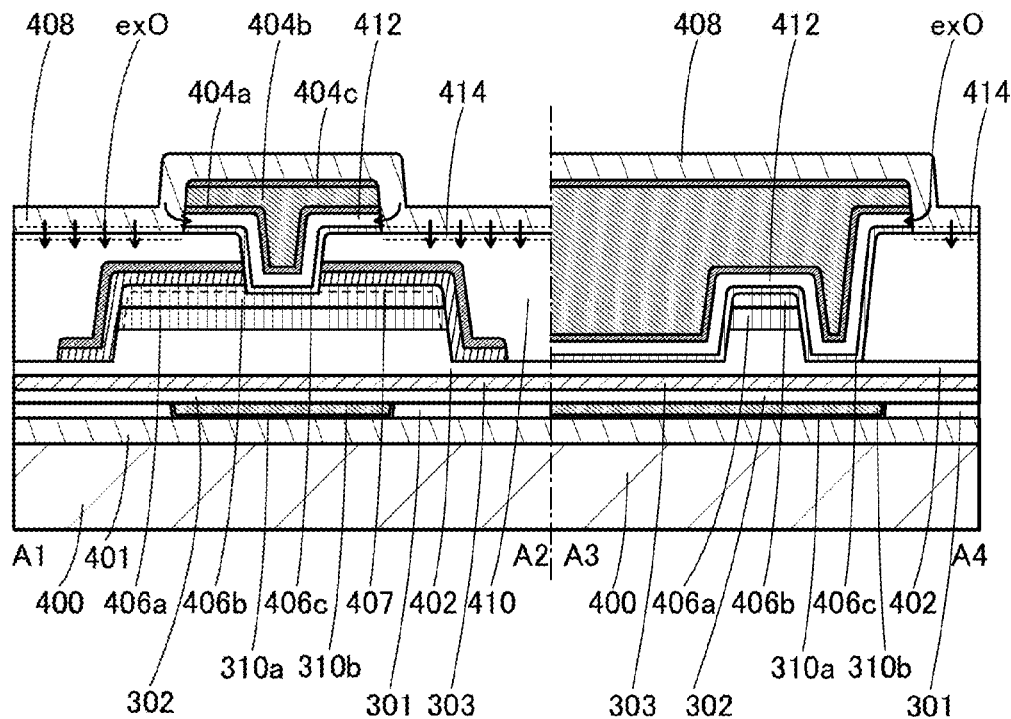
FIGS. 24A and 24B are cross-sectional views illustrating a method for manufacturing a transistor of one embodiment of the present invention.
Figure 24B:
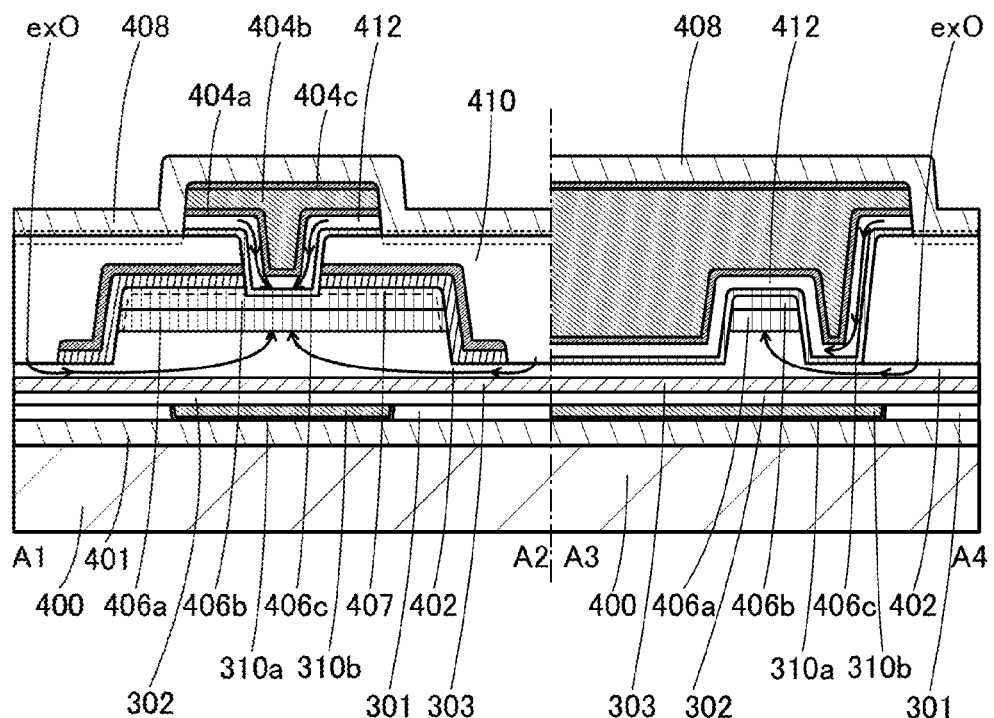

Next, the insulator to be the insulator 412 and the insulator to be the insulator 406c are processed by a photolithography method (see FIGS. 23A and 23B). Note that the conductors 404a, 404b, and 404c and the insulators 412 and 406c may be processed in the same photolithography process. Processing in the same photolithography process can reduce the number of manufacturing steps. Thus, productivity of a semiconductor device including the transistor can be increased. Alternatively, the conductors 404a, 404b, and 404c and the insulators 412 and 406c may be processed in different photolithography processes. Processing in different photolithography processes may facilitate formation of films with different shapes. Though an example where the insulator 412 and the insulator 406c are processed is shown here, the transistor of one embodiment of the present invention is not limited thereto. For example, the insulator 412 and the insulator 406c may be used without being processed in some cases.

Next, the insulator to be the insulator 408 is formed over the insulator 410 and the gate electrode. The insulator to be the insulator 408 can be formed by a sputtering method, a CVD method, an MBE method, a PLD method, an ALD method, or the like. An aluminum oxide film is preferably formed as the insulator 408 using plasma containing oxygen so that oxygen in the plasma can be added to the insulator 410 and a side surface of the insulator 412 as excess oxygen. Here, the mixed region 414 containing a large amount of excess oxygen might be formed in the interface between the insulator to be the insulator 408 and the insulator 410 and the vicinity of the interface (see FIG. 24A).

Second heat treatment may be performed at any time after the formation of the insulator to be the insulator 408. By the second heat treatment, the excess oxygen contained in the insulator 410 and the mixed region 414 is moved to the semiconductor 406b through the insulators 402 and 406a. Furthermore, excess oxygen contained in the insulator 410 is moved to the semiconductor 406b through the insulator 412. Since excess oxygen is moved to the semiconductor 406b by passing two paths as described above, defects (oxygen vacancies) in the semiconductor 406b can be reduced (see FIG. 24B).

Note that the second heat treatment may be performed at a temperature such that excess oxygen (oxygen) in the insulator 410 and the mixed region 414 is diffused to the semiconductor 406b. For example, the description of the first heat treatment may be referred to for the second heat treatment. Alternatively, the temperature of the second heat treatment is preferably lower than that of the first heat treatment. The second heat treatment is preferably performed at a temperature lower than that of the first heat treatment by higher than or equal to 20° C. and lower than or equal to 150° C., preferably higher than or equal to 40° C. and lower than or equal to 100° C. Accordingly, superfluous release of excess oxygen (oxygen) from the insulator 402 can be inhibited. Note that the second heat treatment is not necessarily performed when heating during formation of the films can work as heat treatment comparable to the second heat treatment.

Next, the insulator 428 is formed over the insulator 408. The insulator 428 can be formed by a sputtering method, a CVD method, an MBE method, a PLD method, an ALD method, or the like (see FIGS. 2A and 2B).

Through the above steps, the transistor illustrated in FIGS. 2A and 2B can be manufactured.

Figure 25A:
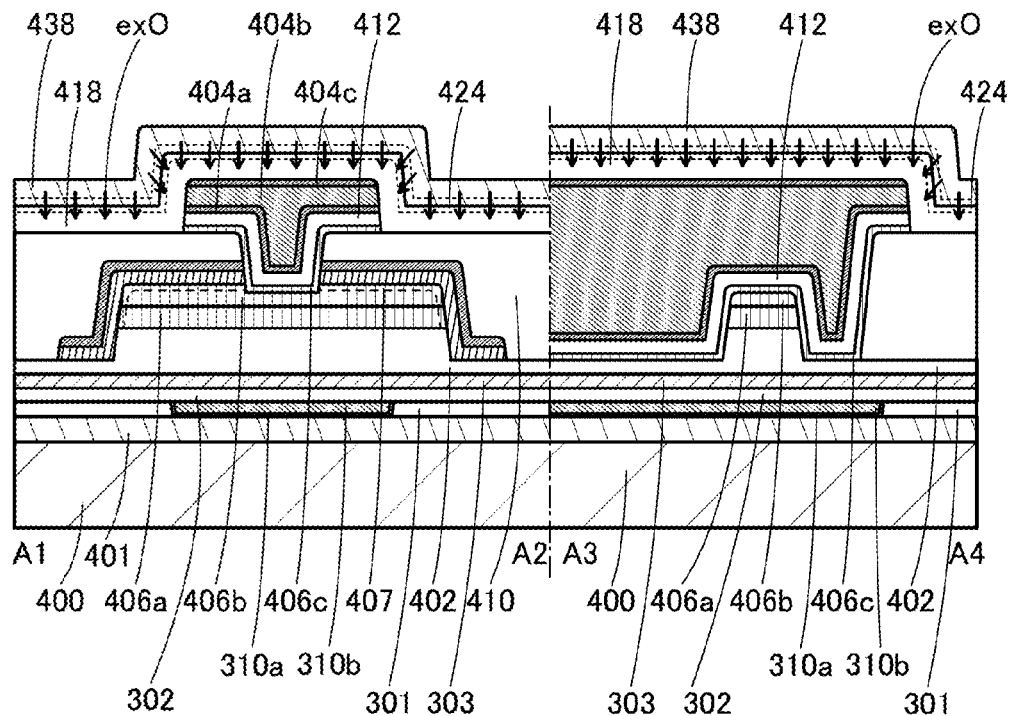
FIGS. 25A and 25B are cross-sectional views illustrating a method for manufacturing a transistor of one embodiment of the present invention.

A transistor having a structure different from that in FIGS. 2A and 2B is illustrated in FIG. 25A. The structure of the transistor illustrated in FIG. 25A is different from the structure of the transistor in FIGS. 2A and 2B in that an insulator 418 is formed over the insulator 410 and the gate electrode, and an insulator 438 which corresponds to the insulator 408 in the transistor in FIGS. 2A and 2B is formed over the insulator 418.

The insulator 438 can be formed by a sputtering method, a CVD method, an MBE method, a PLD method, an ALD method, or the like. An aluminum oxide film is preferably formed as the insulator 438 using plasma containing oxygen so that oxygen in the plasma can be added to the insulator 418 as excess oxygen. Here, the mixed region 424 containing a large amount of excess oxygen might be formed in the interface between the insulator 438 and the insulator 418 and the vicinity of the interface (see FIG. 25A).

Figure 25B:
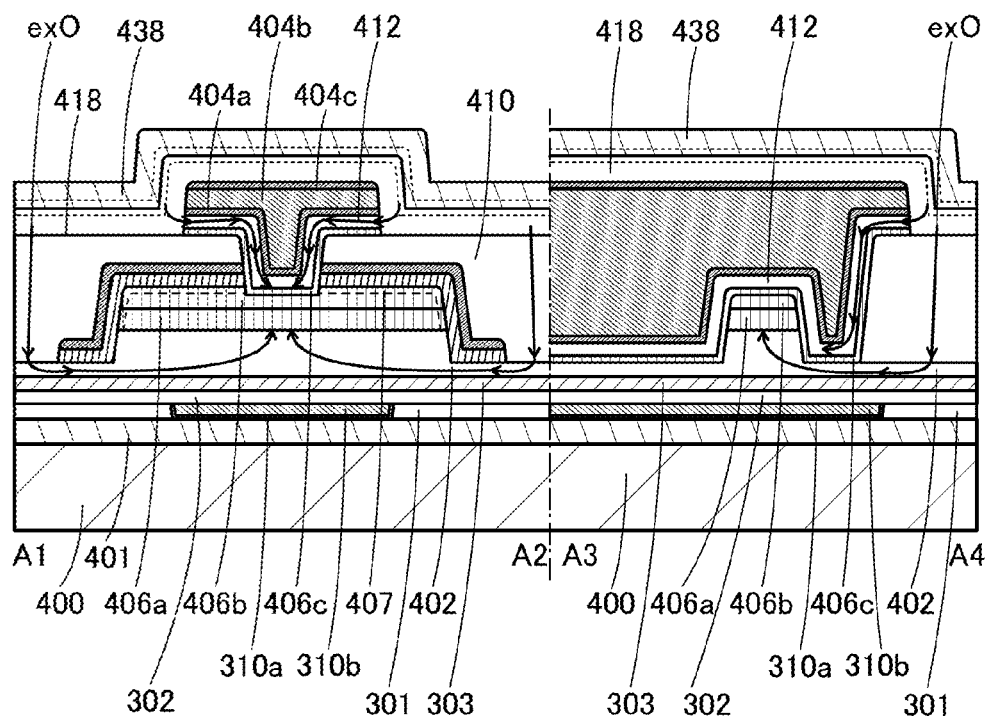

Second heat treatment may be performed at any time after the formation of the insulator 438. By the second heat treatment, the excess oxygen contained in the insulator 418 and the mixed region 424 is moved to the semiconductor 406b through the insulators 410, 402 and 406a. Furthermore, excess oxygen contained the insulator 418 and the mixed region 424 is moved to the semiconductor 406b through the insulator 412. Since excess oxygen is moved to the semiconductor 406b by passing two paths as described above, defects (oxygen vacancies) in the semiconductor 406b can be reduced (see FIG. 25B).

Figure 26A:
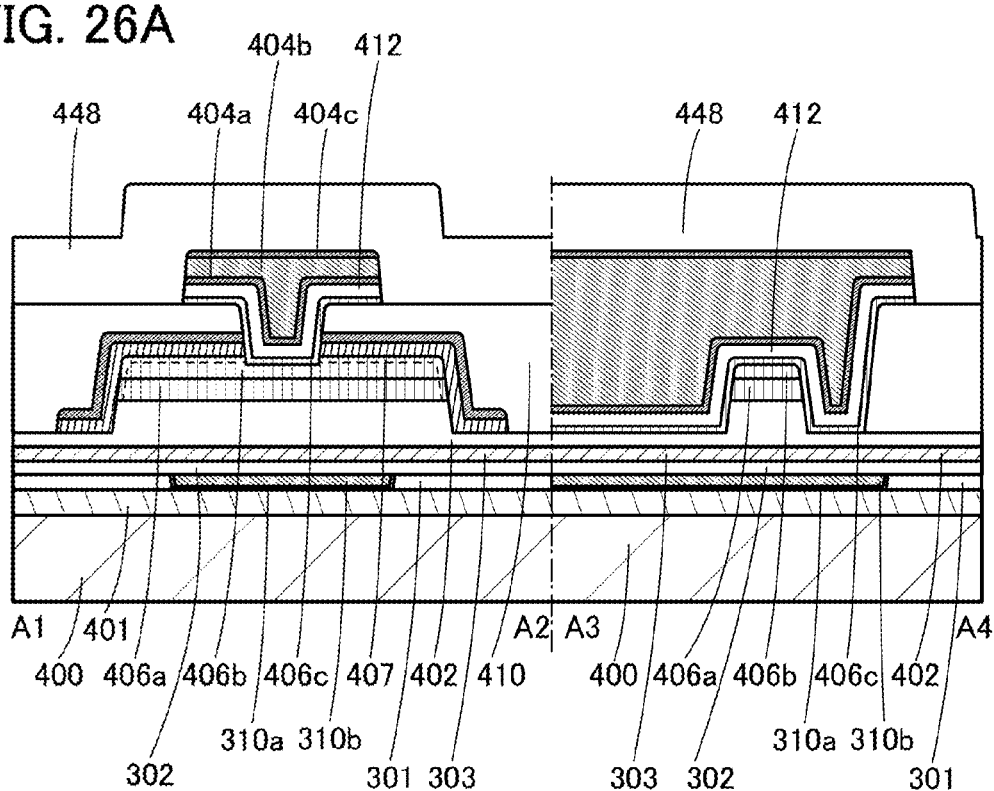
FIGS. 26A and 26B are cross-sectional views illustrating a method for manufacturing a transistor of one embodiment of the present invention.
Figure 26B:
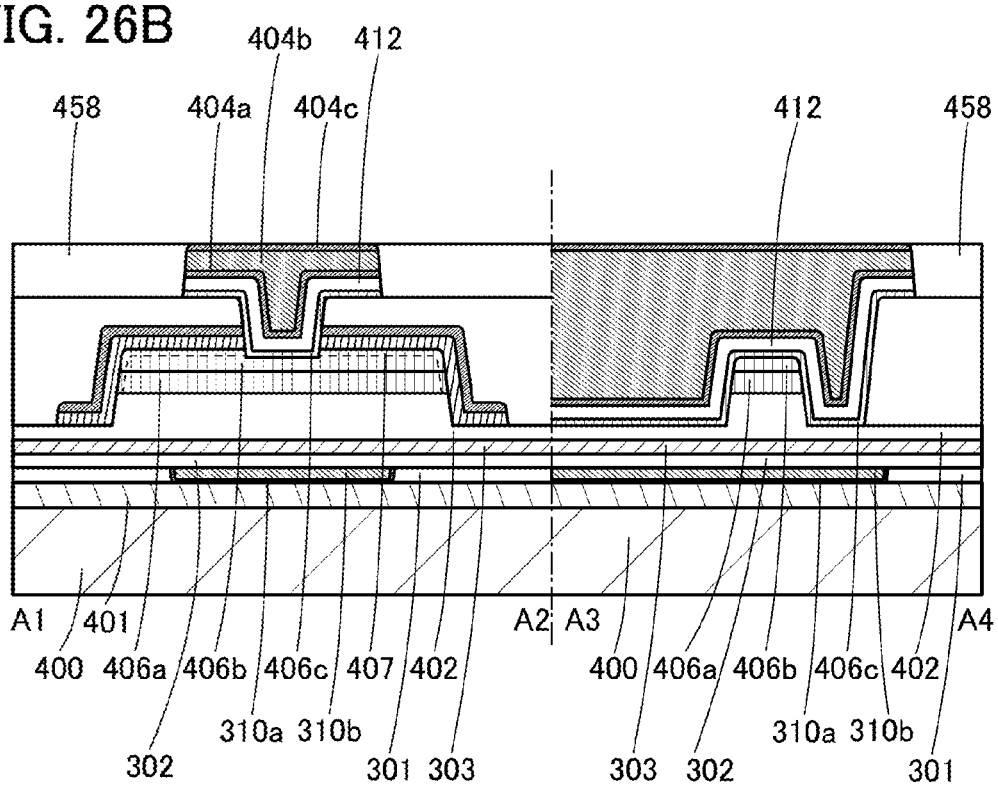

Here, different structures of an insulator over the insulator 410 and the gate electrode is described with reference to FIGS. 26A and 26B.

The insulator 448 is formed over the insulator 410 and the gate electrode. The insulator 448 is formed to have a thickness larger than a difference in height between the top surface of the insulator 410 and the top surface of the gate electrode. The insulator 448 can be formed by a sputtering method, a CVD method, an MBE method, a PLD method, an ALD method, or the like.

Then, CMP treatment is performed on the insulator 448 until the conductor 404c which is the top surface of the gate electrode is exposed. At this time, the conductor 404c serves as a CMP stopper film. In such a manner, the insulator 448 is planarized to form the insulator 458.

It is preferable that the top surface of the insulator 458 is planarized because the subsequent formation of a wiring layer or the like becomes easy.

Figure 27A:
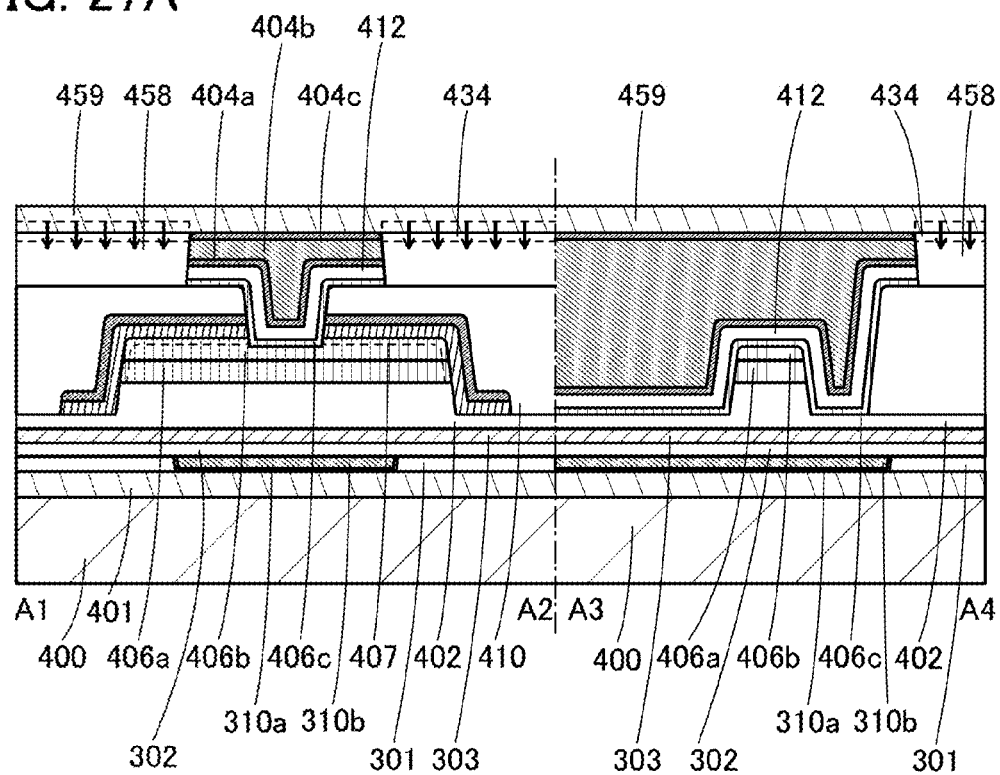
FIGS. 27A and 27B are cross-sectional views illustrating a method for manufacturing a transistor of one embodiment of the present invention.

Next, the insulator 459 corresponding to the insulator 408 of the transistor in FIGS. 2A and 2B is formed over the insulator 458. The insulator 459 can be formed by a sputtering method, a CVD method, an MBE method, a PLD method, an ALD method, or the like. An aluminum oxide film is preferably formed as the insulator 459 using plasma containing oxygen so that oxygen in the plasma can be added to the insulator 458 as excess oxygen. Here, the mixed region 434 containing a large amount of excess oxygen is formed in the interface between the insulator 459 and the insulator 458 and the vicinity of the interface (see FIG. 27A).

Figure 27B:
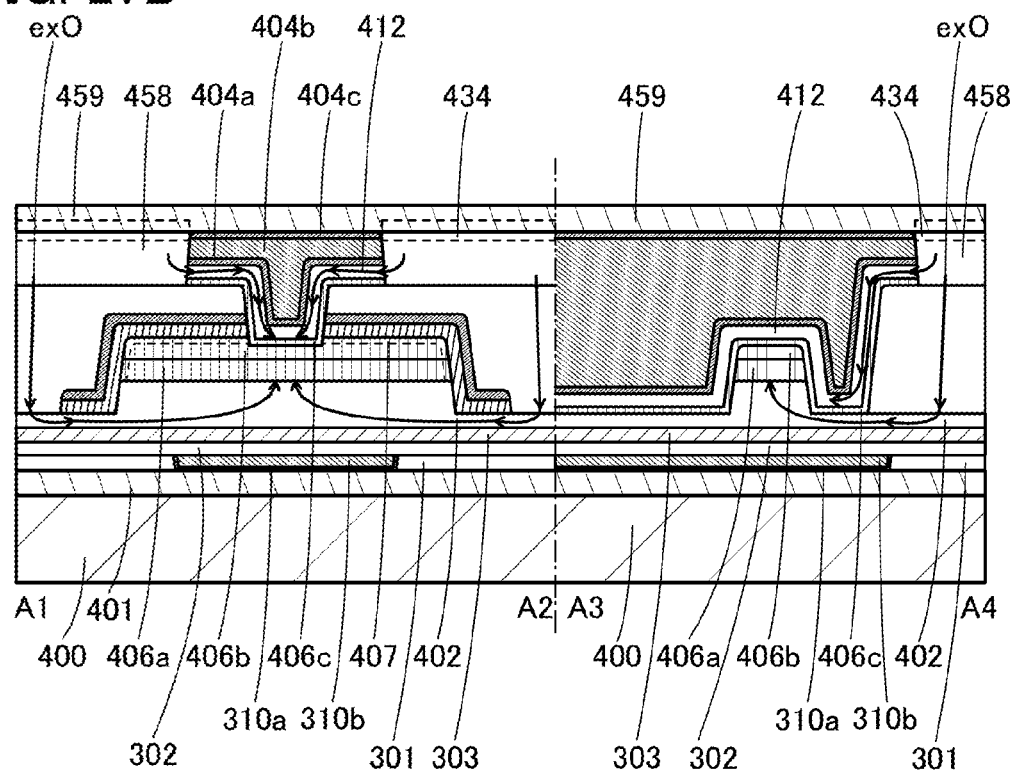

Second heat treatment may be performed at any time after the formation of the insulator 459. By the second heat treatment, the excess oxygen contained in the insulator 458 and the mixed region 434 is moved to the semiconductor 406b through the insulators 410, 402 and 406a. Furthermore, excess oxygen contained in the insulator 458 and the mixed region 434 is moved to the semiconductor 406b through the insulator 412. Since excess oxygen is moved to the semiconductor 406b by passing two paths as described above, defects (oxygen vacancies) in the semiconductor 406b can be reduced (see FIG. 27B).

Since the gate line width can be reduced, the transistor is easily miniaturized. In addition, since the parasitic capacitance between the gate electrode and the source electrode or the drain electrode is small, the transistor can have high frequency characteristics.

<Memory Device 1>

Figure 28A:
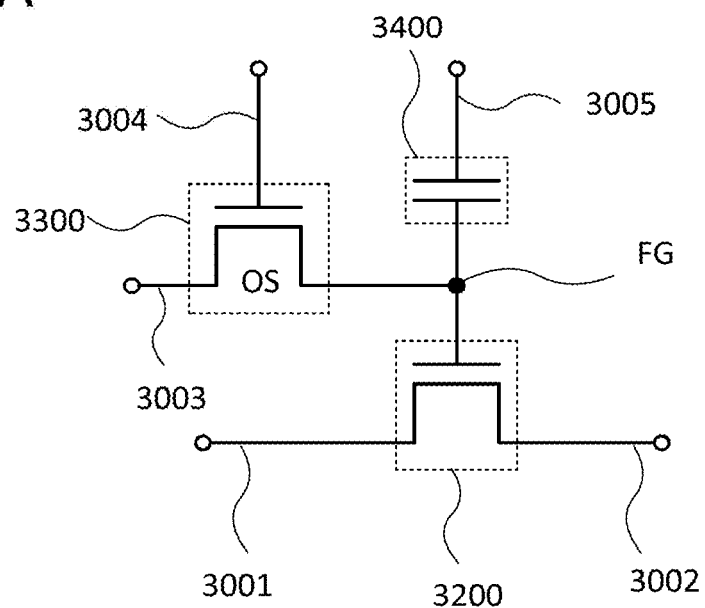
FIGS. 28A and 28B are circuit diagrams of memory devices of one embodiment of the present invention.
Figure 28B:
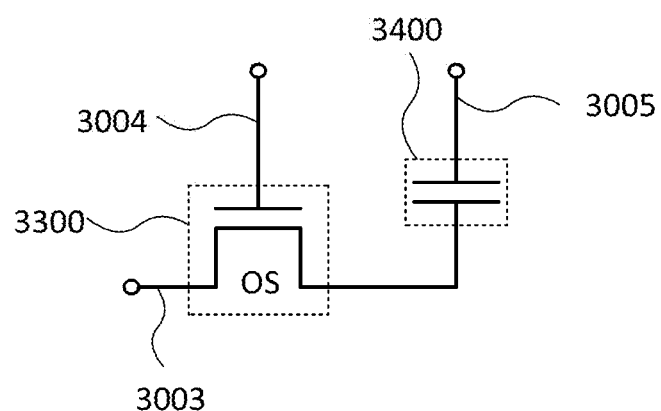

An example of a semiconductor device (memory device) which includes the transistor of one embodiment of the present invention, which can retain stored data even when not powered, and which has an unlimited number of write cycles is shown in FIGS. 28A and 28B.

The semiconductor device illustrated in FIG. 28A includes a transistor 3200 using a first semiconductor, a transistor 3300 using a second semiconductor, and a capacitor 3400. Note that any of the above-described transistors can be used as the transistor 3300.

Note that the transistor 3300 is preferably a transistor with a low off-state current. For example, a transistor using an oxide semiconductor can be used as the transistor 3300. Since the off-state current of the transistor 3300 is low, stored data can be retained for a long period at a predetermined node of the semiconductor device. In other words, power consumption of the semiconductor device can be reduced because refresh operation becomes unnecessary or the frequency of refresh operation can be extremely low.

In FIG. 28A, a first wiring 3001 is electrically connected to a source of the transistor 3200. A second wiring 3002 is electrically connected to a drain of the transistor 3200. A third wiring 3003 is electrically connected to one of the source and the drain of the transistor 3300. A fourth wiring 3004 is electrically connected to the gate of the transistor 3300. The gate of the transistor 3200 and the other of the source and the drain of the transistor 3300 are electrically connected to the one electrode of the capacitor 3400. A fifth wiring 3005 is electrically connected to the other electrode of the capacitor 3400.

The semiconductor device in FIG. 28A has a feature that the potential of the gate of the transistor 3200 can be retained, and thus enables writing, retaining, and reading of data as follows.

Writing and holding of data will be described. First, the potential of the fourth wiring 3004 is set to a potential at which the transistor 3300 is turned on, so that the transistor 3300 is turned on. Accordingly, the potential of the third wiring 3003 is supplied to a node FG where the gate of the transistor 3200 and the one electrode of the capacitor 3400 are electrically connected to each other. That is, a predetermined charge is supplied to the gate of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is turned off, so that the transistor 3300 is turned off. Thus, the charge is held at the node FG (retaining).

Since the off-state current of the transistor 3300 is low, the charge of the node FG is retained for a long time.

Next, reading of data will be described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the node FG. This is because in the case of using an n-channel transistor as the transistor 3200, an apparent threshold voltage $V_{th\_H}$ at the time when the high-level charge is given to the gate of the transistor 3200 is lower than an apparent threshold voltage $V_{th\_L}$ at the time when the low-level charge is given to the gate of the transistor 3200. Here, an apparent threshold voltage refers to the potential of the fifth wiring 3005 which is needed to turn on the transistor 3200. Thus, the potential of the fifth wiring 3005 is set to a potential $V_0$ which is between $V_{th\_H}$ and $V_{th\_L}$, whereby charge supplied to the node FG can be determined. For example, in the case where the high-level charge is supplied to the node FG in writing and the potential of the fifth wiring 3005 is $V_0$ ($>V_{th\_H}$), the transistor 3200 is turned on. On the other hand, in the case where the low-level charge is supplied to the node FG in writing, even when the potential of the fifth wiring 3005 is $V_0$ ($<V_{th\_L}$), the transistor 3200 remains off. Thus, the data retained in the node FG can be read by determining the potential of the second wiring 3002.

Note that in the case where memory cells are arrayed, it is necessary that data of a desired memory cell is read in read operation. A configuration in which only data of a desired memory cell can be read by supplying a potential at which the transistor 3200 is in "off state" regardless of the electric charge supplied to the node FG, that is, a potential lower than $V_{th\_H}$ to the fifth wiring 3005 of memory cells from which data is not read may be employed. Alternatively, a configuration in which only data of a desired memory cell can be read by supplying a potential at which the transistor 3200 is brought into "on state" regardless of the electric charge supplied to the node FG, that is, a potential higher than $V_{th\_L}$ to the fifth wiring 3005 of memory cells from which data is not read may be employed.

<Structure of Semiconductor Device>

Figure 29:
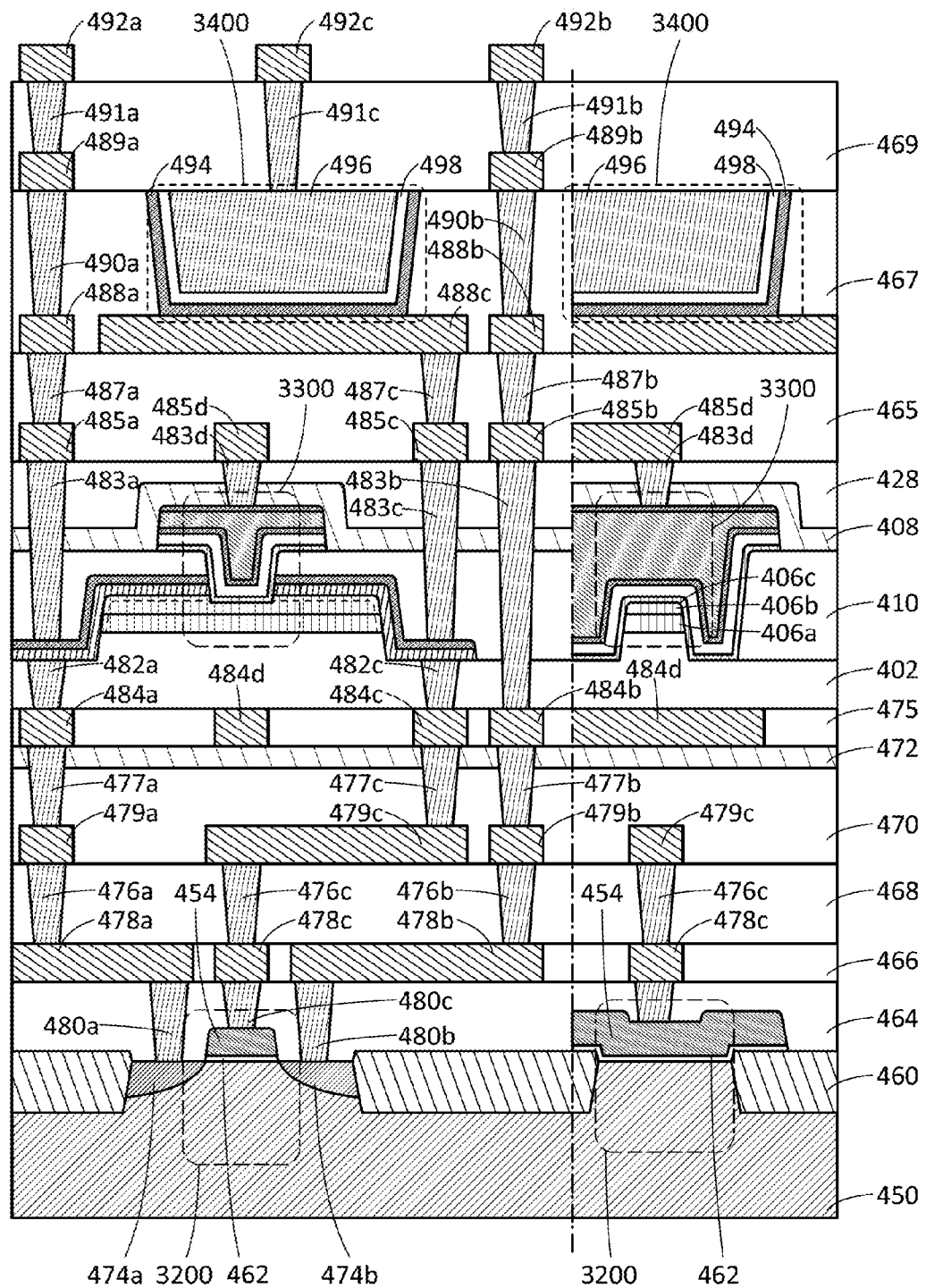
FIG. 29 is a cross-sectional view illustrating a semiconductor device of one embodiment of the present invention.

FIG. 29 is a cross-sectional view of the semiconductor device of FIG. 28A. The semiconductor device shown in FIG. 29 includes the transistor 3200, the transistor 3300, and the capacitor 3400. The transistor 3300 and the capacitor 3400 are provided over the transistor 3200. Although an example where the transistor shown in FIGS. 1A and 1B is used as the transistor 3300 is shown, a semiconductor device of one embodiment of the present invention is not limited thereto. Therefore, the description regarding the above-mentioned transistors is referred to as appropriate.

The transistor 3200 shown in FIG. 29 is a transistor using a semiconductor substrate 450. The transistor 3200 includes a region 474a in the semiconductor substrate 450, a region 474b in the semiconductor substrate 450, an insulator 462, and a conductor 454.

In the transistor 3200, the regions 474a and 474b have a function as a source region and a drain region. The insulator 462 has a function as a gate insulator. The conductor 454 has a function as a gate electrode. Therefore, resistance of a channel formation region can be controlled by a potential applied to the conductor 454. In other words, conduction or non-conduction between the region 474a and the region 474b can be controlled by the potential applied to the conductor 454.

For the semiconductor substrate 450, a single-material semiconductor substrate of silicon, germanium, or the like or a compound semiconductor substrate of silicon carbide, silicon germanium, gallium arsenide, indium phosphide, zinc oxide, gallium oxide, or the like may be used, for example. A single crystal silicon substrate is preferably used as the semiconductor substrate 450.

For the semiconductor substrate 450, a semiconductor substrate including impurities imparting n-type conductivity is used. However, a semiconductor substrate including impurities imparting p-type conductivity may be used as the semiconductor substrate 450. In that case, a well including impurities imparting the n-type conductivity is provided in a region where the transistor 3200 is formed. Alternatively, the semiconductor substrate 450 may be an i-type semiconductor substrate.

A top surface of the semiconductor substrate 450 preferably has a (110) plane. Then, on-state characteristics of the transistor 3200 can be improved.

The regions 474a and 474b are regions including impurities imparting the p-type conductivity. Accordingly, the transistor 3200 has a structure of a p-channel transistor.

Note that although the transistor 3200 is illustrated as a p-channel transistor, the transistor 3200 may be an n-channel transistor.

Note that the transistor 3200 is separated from an adjacent transistor by a region 460 and the like. The region 460 is an insulating region.

The semiconductor device illustrated in FIG. 29 includes the insulator 462, an insulator 464, an insulator 466, an insulator 468, an insulator 470, an insulator 472, an insulator 475, the insulator 402, the insulator 410, the insulator 408, the insulator 428, an insulator 465, an insulator 467, an insulator 469, an insulator 498, the insulator 406a, the insulator 406c, a conductor 480a, a conductor 480b, a conductor 480c, a conductor 478a, a conductor 478b, a conductor 478c, a conductor 476a, a conductor 476b, a conductor 476c, a conductor 479a, a conductor 479b, a conductor 479c, a conductor 477a, a conductor 477b, a conductor 477c, a conductor 484a, a conductor 484b, a conductor 484c, a conductor 484d, a conductor 482a, a conductor 482c, a conductor 483a, a conductor 483b, a conductor 483c, a conductor 483d, a conductor 485a, a conductor 485b, a conductor 485c, a conductor 485d, a conductor 487a, a conductor 487b, a conductor 487c, a conductor 488a, a conductor 488b, a conductor 488c, a conductor 490a, a conductor 490b, a conductor 489a, a conductor 489b, a conductor 491a, a conductor 491b, a conductor 491c, a conductor 492a, a conductor 492b, and a conductor 492c.

The insulator 464 is over the transistor 3200. The insulator 466 is over the insulator 464. The insulator 468 is over the insulator 466. The insulator 470 is over the insulator 468. The insulator 472 is over the insulator 470. The insulator 475 is over the insulator 472. The transistor 3300 is over the insulator 475. The insulator 408 is over the transistor 3300. The insulator 428 is over the insulator 408. The insulator 465 is over the insulator 428. The capacitor 3400 is over the insulator 465. The insulator 469 is over the capacitor 3400.

The insulator 464 includes an opening reaching the region 474a, an opening portion reaching the region 474b, and an opening reaching the conductor 454, in which the conductor 480a, the conductor 480b, and the conductor 480c are embedded, respectively.

In addition, the insulator 466 includes an opening reaching the conductor 480a, an opening reaching the conductor 480b, and an opening reaching the conductor 480c, in which the conductor 478a, the conductor 478b, and the conductor 478c are embedded, respectively.

The insulator 468 includes an opening reaching the conductor 478a, an opening reaching the conductor 478b, and an opening reaching the conductor 478c. In the openings, the conductor 476a, the conductor 476b, and the conductor 476c are embedded.

The insulator 470 includes the conductor 479a, the conductor 479b, and the conductor 479c. The insulator 472 includes an opening reaching the conductor 479a through the insulator 470, an opening reaching the conductor 479b through the insulator 470, and an opening reaching the conductor 479c through the insulator 470. In the openings, the conductor 477a, the conductor 477b, and the conductor 477c are embedded.

Furthermore, the insulator 475 includes an opening overlapping with the channel formation region of the transistor 3300, an opening reaching the conductor 477a, an opening reaching the conductor 477b, and an opening reaching the conductor 477c. In the openings, the conductor 484a, the conductor 484b, the conductor 484c, and the conductor 484d are embedded.

The conductor 484d may have a function as a bottom-gate electrode of the transistor 3300. Alternatively, for example, electric characteristics such as the threshold voltage of the transistor 3300 may be controlled by application of a constant potential to the conductor 484d. Further alternatively, for example, the conductor 484d and the top gate electrode of the transistor 3300 may be electrically connected to each other. Thus, the on-state current of the transistor 3300 can be increased. A punch-through phenomenon can be suppressed; thus, stable electric characteristics in the saturation region of the transistor 3300 can be obtained.

In addition, the insulator 402 includes an opening reaching the conductor 484a and an opening reaching the conductor 484c. In the openings, the conductor 482a and the conductor 482c are embedded.

The insulator 428 includes an opening reaching a conductor of one of the source electrode and the drain electrode of the transistor 3300 through the insulator 408 and the insulator 410, an opening reaching a conductor of the other of the source electrode and the drain electrode of the transistor 3300 through the insulator 408 and the insulator 410, an opening reaching the conductor 484b through the insulator 408, the insulator 410, and the insulator 402, and an opening reaching a conductor of the gate electrode of the transistor 3300 through the insulator 408. In the openings, the conductor 483a, the conductor 483b, and the conductor 483c are embedded.

The insulator 465 includes the conductor 485a in contact with the conductor 483a, the conductor 485b in contact with the conductor 483b, the conductor 485c in contact with the conductor 483c, and the conductor 485d in contact with the conductor 483d. The insulator 465 includes an opening reaching the conductor 485a, an opening reaching the conductor 485b, and an opening reaching the conductor 485c. In the openings, the conductor 487a, the conductor 487b, and the conductor 487c are embedded.

The insulator 467 includes the conductor 488a in contact with the conductor 487a, the conductor 488b in contact with the conductor 487b, and the conductor 488c in contact with the conductor 487c. In addition, the insulator 467 includes an opening reaching the conductor 488a and an opening reaching the conductor 488b. In the openings, the conductor 490a and the conductor 490b are embedded. The conductor 488c is in contact with the conductor 494 which is one of the electrodes of the capacitor 3400.

The insulator 469 includes the conductor 489a in contact with the conductor 490a and the conductor 489b in contact with the conductor 490b. The insulator 469 includes an opening reaching the conductor 489a, an opening reaching the conductor 489b, an opening reaching the conductor 496 which is the other of electrodes of the capacitor 3400. In the openings, the conductor 491a, the conductor 492b, and the conductor 492c are embedded.

The conductor 492a in contact with the conductor 491a, the conductor 492b in contact with the conductor 491b, and the conductor 492c in contact with the conductor 491c are over the insulator 469.

The insulators 464, 466, 468, 470, 472, 475, 402, 410, 408, 428, 465, 467, and 469 may each be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 401 may be formed of, for example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The insulator that has a function of blocking oxygen and impurities such as hydrogen is preferably included in at least one of the insulators 464, 466, 468, 470, 472, 475, 402, 410, 408, 428, 465, 467, and 469. When an insulator that has a function of blocking oxygen and impurities such as hydrogen is placed near the transistor 3300, the electrical characteristics of the transistor 3300 can be stable.

An insulator with a function of blocking oxygen and impurities such as hydrogen may have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum may be used.

Each of the conductors 480a, 480b, 480c, 478a, 478b, 478c, 476a, 476b, 476c, 479a, 479b, 479c, 477a, 477b, 477c, 484a, 484b, 484c, 484d, 482a, 482c, 483a, 483b, 483c, 483d, 485a, 485b, 485c, 485d, 487a, 487b, 487c, 488a, 488b, 488c, 490a, 490b, 489a, 489b, 491a, 491b, 491c, 492a, 492b, and 492c may have a single-layer structure or a stacked-layer structure including a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound may be used, for example, and a conductor containing aluminum, a conductor containing copper and titanium, a conductor containing copper and manganese, a conductor containing indium, tin, and oxygen, a conductor containing titanium and nitrogen, or the like may be used.

The source or drain of the transistor 3200 is electrically connected to the conductor that is one of the source electrode and the drain electrode of the transistor 3300 through the conductor 480a, the conductor 478a, the conductor 476a, the conductor 479a, the conductor 477a, the conductor 484a, the conductor 482a, and the conductor 483a. The conductor 454 that is the gate electrode of the transistor 3200 is electrically connected to the conductor that is the other of the source electrode and the drain electrode of the transistor 3300 through the conductor 480c, the conductor 478c, the conductor 476c, the conductor 479c, the conductor 477c, the conductor 484c, the conductor 482c and the conductor 483c.

The capacitor 3400 includes one of the source electrode and the drain electrode of the transistor 3300, the conductor 494 electrically connected to one of the electrodes of the capacitor 3400 through the conductor 483c, the conductor 485c, the conductor 487c, and the conductor 488c, the insulator 498, and the conductor 496 which is the other electrode of the capacitor 3400. The capacitor 3400 is preferably formed above or below the transistor 3300 because the semiconductor can be reduced in size.

For the structures of other components, the description of FIGS. 1A and 1B and the like can be referred to as appropriate.

Figure 30:
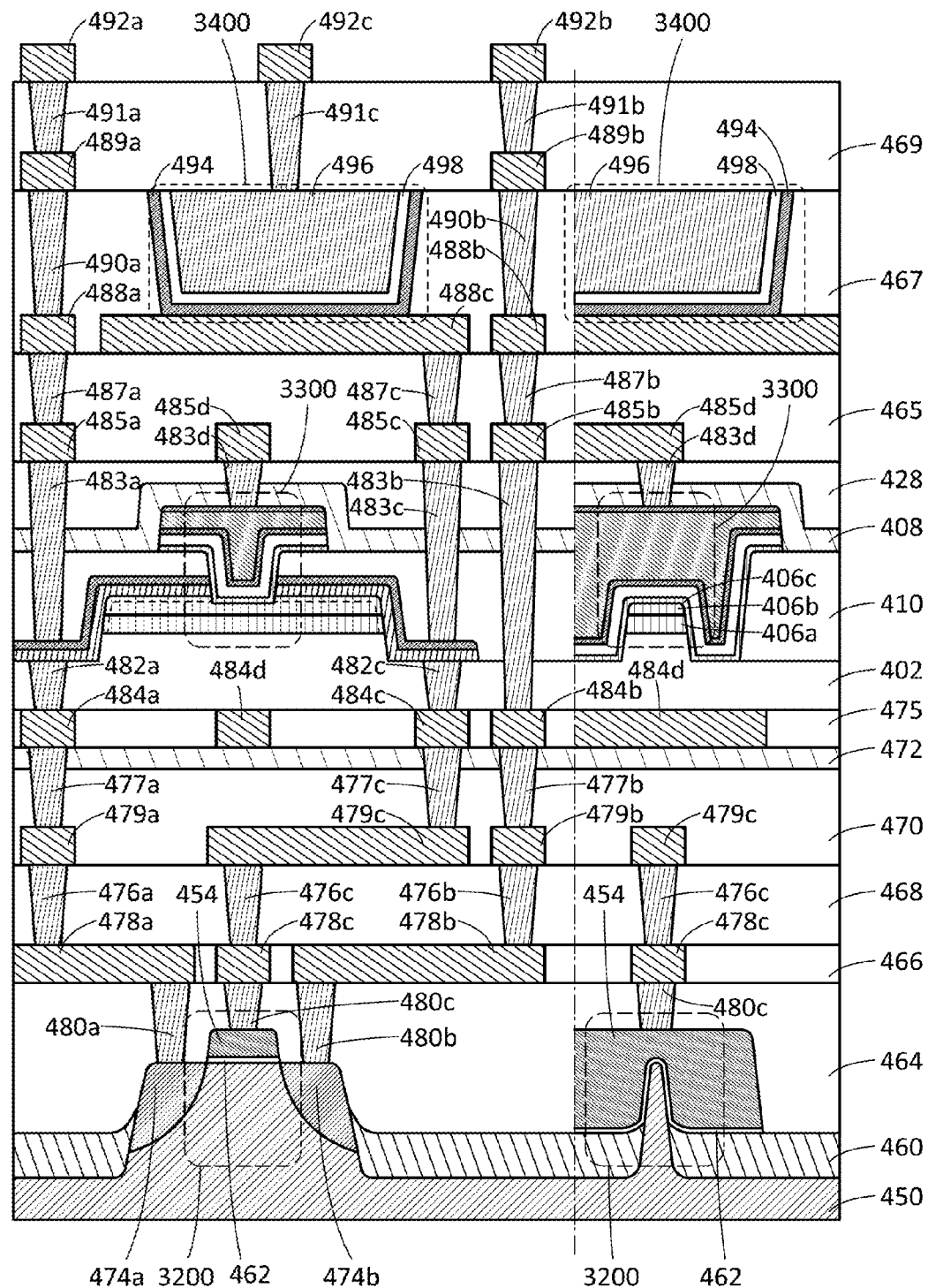
FIG. 30 is a cross-sectional view illustrating a semiconductor device of one embodiment of the present invention.

A semiconductor device in FIG. 30 is the same as the semiconductor device in FIG. 29 except the structure of the transistor 3200. Therefore, the description of the semiconductor device in FIG. 29 is referred to for the semiconductor device in FIG. 30. Specifically, in the semiconductor device in FIG. 30, the transistor 3200 is a FIN-type transistor. The effective channel width is increased in the FIN-type transistor 3200, whereby the on-state characteristics of the transistor 3200 can be improved. In addition, since contribution of the electric field of the gate electrode can be increased, the off-state characteristics of the transistor 3200 can be improved. Note that the transistor 3200 may be a p-channel transistor or an n-channel transistor.

<Memory Device 2>

The semiconductor device in FIG. 28B is different from the semiconductor device in FIG. 28A in that the transistor 3200 is not provided. Also in this case, writing and retaining operation of data can be performed in a manner similar to the semiconductor device in FIG. 28A.

Reading of data in the semiconductor device in FIG. 28B is described. When the transistor 3300 is turned on, the third wiring 3003 which is in a floating state and the capacitor 3400 are in the conduction state, and the charge is redistributed between the third wiring 3003 and the capacitor 3400. As a result, the potential of the third wiring 3003 is changed. The amount of change in potential of the third wiring 3003 varies depending on the potential of the one electrode of the capacitor 3400 (or the charge accumulated in the capacitor 3400).

For example, the potential of the third wiring 3003 after the charge redistribution is $(C_B \times V_{B0} + C \times V)/(C_B + C)$, where V is the potential of the one electrode of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 3400 is $V_1$ and $V_0$ ($V_1 > V_0$), the potential of the third wiring 3003 in the case of the one electrode of the capacitor 3400 retaining the potential $V_1$ ($=(C_B \times V_{B0} + C \times V_1)/(C_B + C)$) is higher than the potential of the third wiring 3003 in the case of the one electrode of the capacitor 3400 retaining the potential $V_0$ ($=(C_B \times V_{B0} + C \times V_0)/(C_B + C)$).

Then, by comparing the potential of the third wiring 3003 with a predetermined potential, data can be read.

In this case, a transistor including the first semiconductor may be used for a driver circuit for driving a memory cell, and a transistor including the second semiconductor may be stacked over the driver circuit as the transistor 3300.

When including a transistor using an oxide semiconductor and having a low off-state current, the semiconductor device described above can retain stored data for a long time. In other words, refresh operation becomes unnecessary or the frequency of the refresh operation can be extremely low, which leads to a sufficient reduction in power consumption of the semiconductor device. Moreover, stored data can be retained for a long time even when power is not supplied (note that a potential is preferably fixed).

Further, in the semiconductor device, high voltage is not needed for writing data and deterioration of elements is less likely to occur. Unlike in a conventional nonvolatile memory, for example, it is not necessary to inject and extract electrons into and from a floating gate; thus, a problem such as deterioration of an insulator is not caused. That is, the semiconductor device of one embodiment of the present invention does not have a limit on the number of times of rewriting data, which is a problem of a conventional nonvolatile memory, and the reliability thereof is drastically improved. Furthermore, data is written depending on the state of the transistor (on or off), whereby high-speed operation can be easily achieved.

[CMOS Circuit]

Figure 31A:
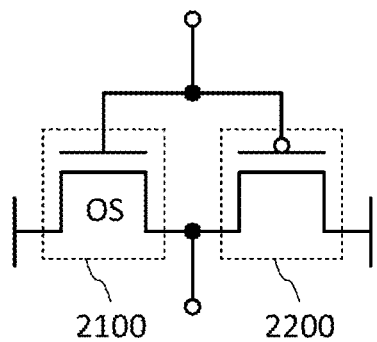
FIGS. 31A and 31B are circuit diagrams of a semiconductor device of one embodiment of the present invention.

A circuit diagram in FIG. 31A shows a configuration of a so-called CMOS circuit in which a p-channel transistor 2200 and an n-channel transistor 2100 are connected to each other in series and in which gates of them are connected to each other.

[Analog Switch]

Figure 31B:
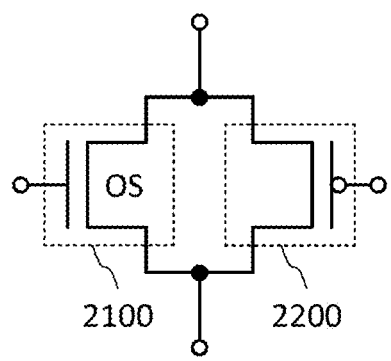

A circuit diagram in FIG. 31B shows a configuration in which sources of the transistors 2100 and 2200 are connected to each other and drains of the transistors 2100 and 2200 are connected to each other. With such a configuration, the transistors can function as a so-called analog switch.

<CPU>

A CPU including a semiconductor device such as any of the above-described transistors or the above-described memory device is described below.

Figure 32:
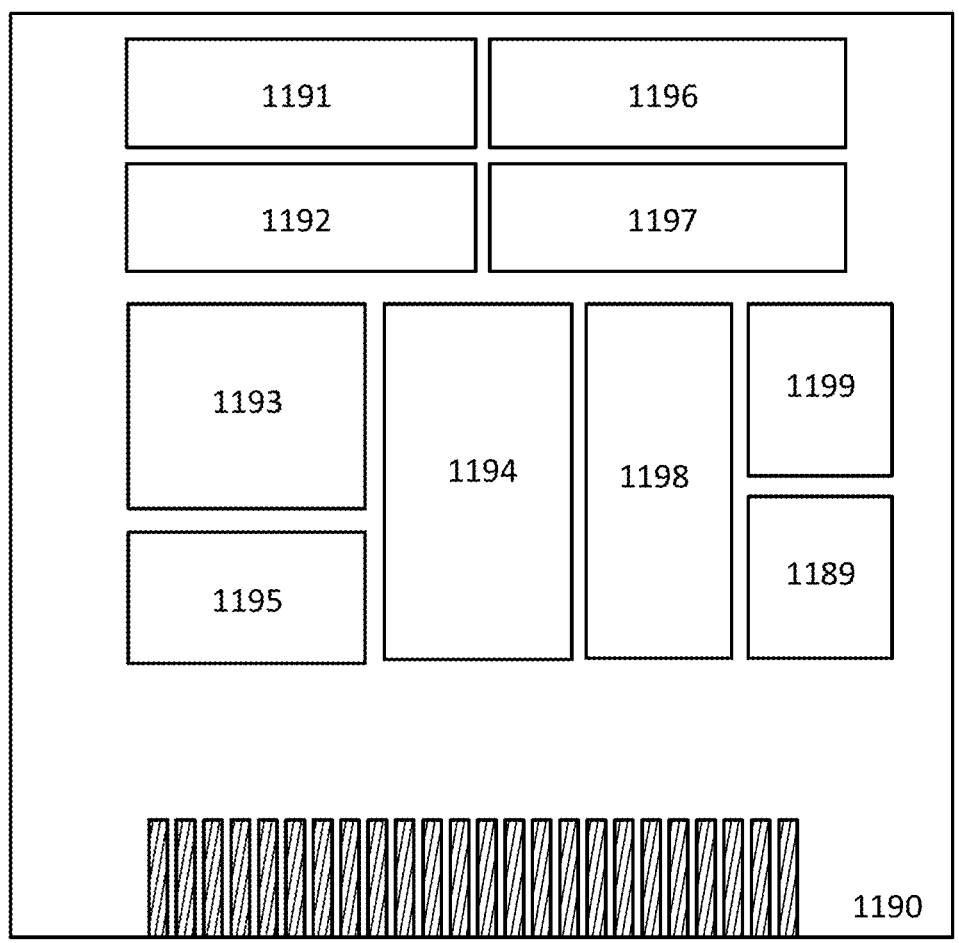
FIG. 32 is a block diagram illustrating a CPU of one embodiment of the present invention.

FIG. 32 is a block diagram illustrating a configuration example of a CPU including any of the above-described transistors as a component.

The CPU illustrated in FIG. 32 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and an ROM interface 1189. A semiconductor substrate, an SOI substrate, a glass substrate, or the like is used as the substrate 1190. The ROM 1199 and the ROM interface 1189 may be provided over a separate chip. Needless to say, the CPU in FIG. 32 is just an example of a simplified structure, and an actual CPU may have a variety of structures depending on the application. For example, the CPU may have the following configuration: a structure including the CPU illustrated in FIG. 32 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196, and reads/writes data from/to the register 1196 depending on the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal on the basis of a reference clock signal, and supplies the internal clock signal to the above circuits.

In the CPU illustrated in FIG. 32, a memory cell is provided in the register 1196. For the memory cell of the register 1196, any of the above-described transistors, the above-described memory device, or the like can be used.

In the CPU illustrated in FIG. 32, the register controller 1197 selects operation of retaining data in the register 1196 in accordance with an instruction from the ALU 1191. That is, the register controller 1197 selects whether data is held by a flip-flop or by a capacitor in the memory cell included in the register 1196. When data holding by the flip-flop is selected, a power supply voltage is supplied to the memory cell in the register 1196. When data holding by the capacitor is selected, the data is rewritten in the capacitor, and supply of the power supply voltage to the memory cell in the register 1196 can be stopped.

Figure 33:
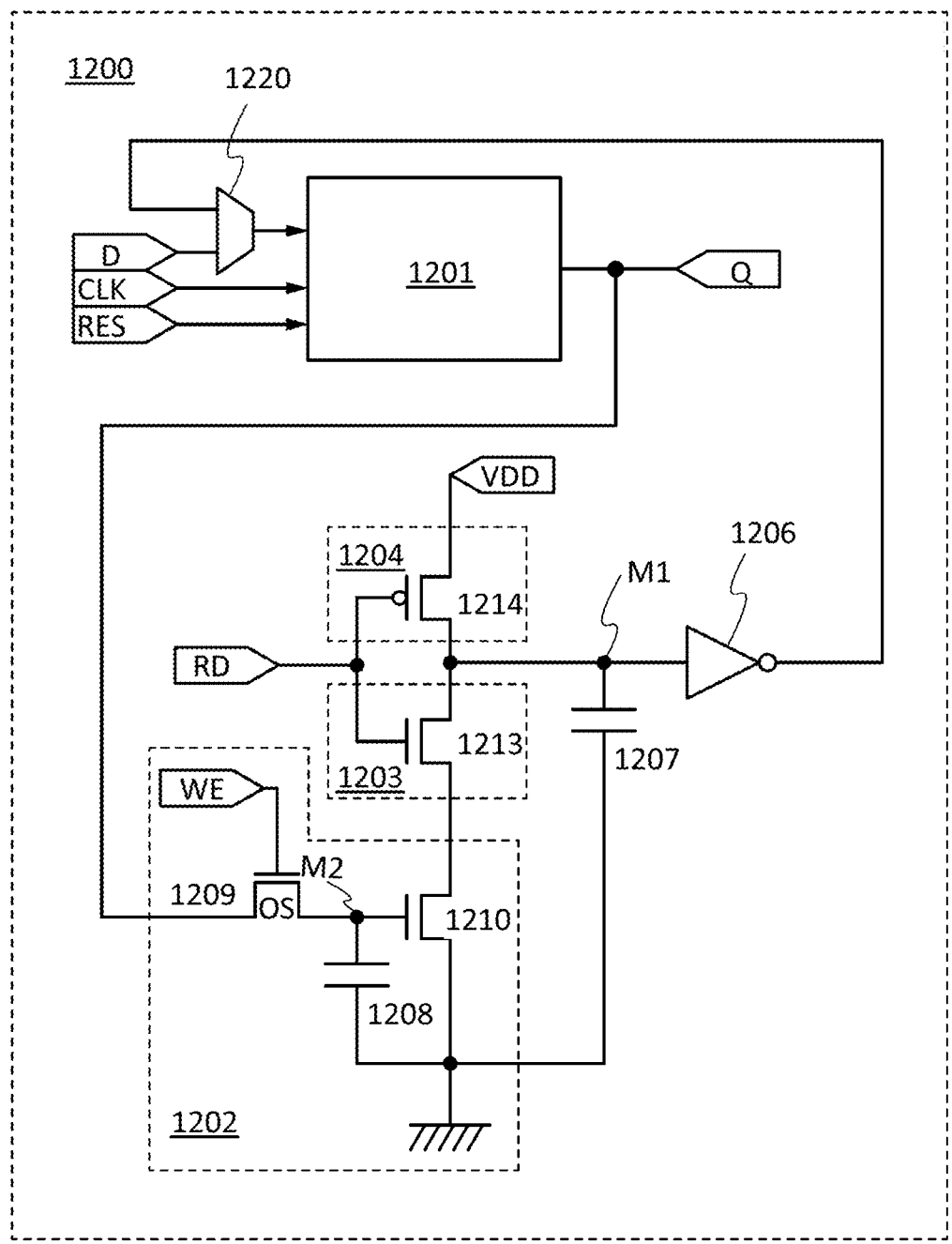
FIG. 33 is a circuit diagram of a memory element of one embodiment of the present invention.

FIG. 33 is an example of a circuit diagram of a memory element that can be used as the register 1196. A memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the above-described memory device can be used as the circuit 1202. When supply of a power supply voltage to the memory element 1200 is stopped, GND (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a line which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the line which can supply a low power supply potential (e.g., a GND line). The other of the pair of electrodes of the capacitor 1208 can be supplied with a constant potential. For example, the other of the pair of electrodes of the capacitor 1208 can be supplied with a low power supply potential (e.g., GND) or a high power supply potential (e.g., VDD). The other of the pair of electrodes of the capacitor 1208 is electrically connected to the line which can supply a low power supply potential (e.g., a GND line).

The capacitor 1207 and the capacitor 1208 are not necessarily provided as long as the parasitic capacitance of the transistor, the line, or the like is actively utilized.

A control signal WE is input to the first gate (first gate electrode) of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 33 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 33, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 33, the transistors included in the memory element 1200 except for the transistor 1209 can each be a transistor in which a channel is formed in a film formed using a semiconductor other than an oxide semiconductor or in the substrate 1190. For example, the transistor can be a transistor whose channel is formed in a silicon film or a silicon substrate. Alternatively, all the transistors in the memory element 1200 may be a transistor in which a channel is formed in an oxide semiconductor. Further alternatively, in the memory element 1200, a transistor in which a channel is formed in an oxide semiconductor can be included besides the transistor 1209, and a transistor in which a channel is formed in a layer or the substrate 1190 including a semiconductor other than an oxide semiconductor can be used for the rest of the transistors.

As the circuit 1201 in FIG. 33, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor is extremely low. For example, the off-state current of a transistor in which a channel is formed in an oxide semiconductor is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the above-described memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 varies to some degree.

By using the above-described memory element 1200 for a memory device such as a register or a cache memory included in a processor, data in the memory device can be prevented from being lost owing to the stop of the supply of the power supply voltage. Further, shortly after the supply of the power supply voltage is restarted, the memory element can be returned to the same state as that before the power supply is stopped. Therefore, the power supply can be stopped even for a short time in the processor or one or a plurality of logic circuits included in the processor. Accordingly, power consumption can be suppressed.

Although the memory element 1200 is used in a CPU, the memory element 1200 can also be used in an LSI such as a digital signal processor (DSP), a custom LSI, or a programmable logic device (PLD), and a radio frequency integrated circuit (RF-IC).

<Display Device>

The following shows configuration examples of a display device of one embodiment of the present invention.

Configuration Example

Figure 34A:
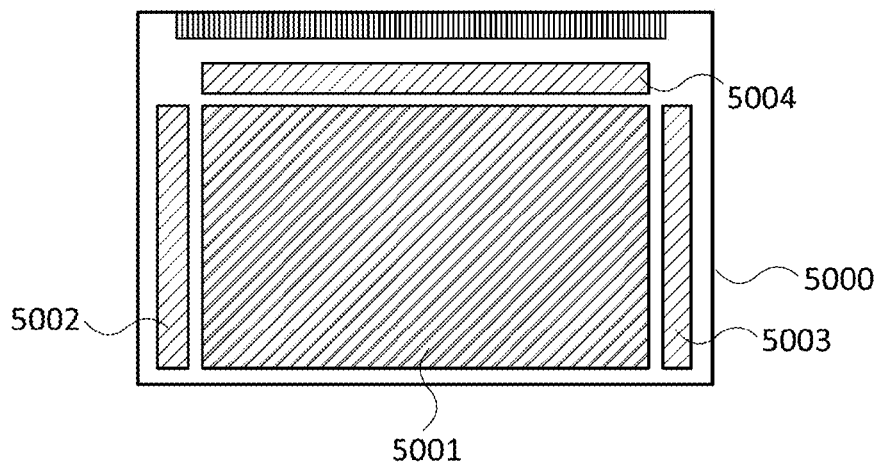
FIGS. 34A to 34C are a top view and circuit diagrams of a display device of one embodiment of the present invention.
Figure 34B:
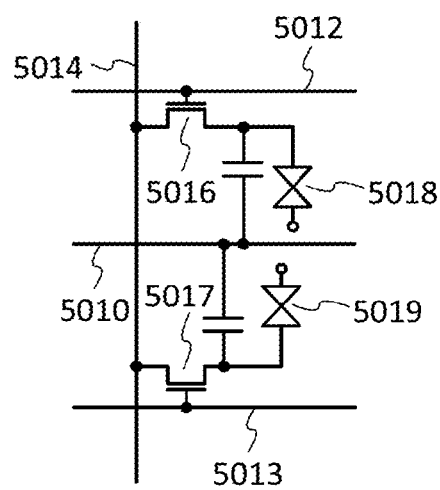
Figure 34C:
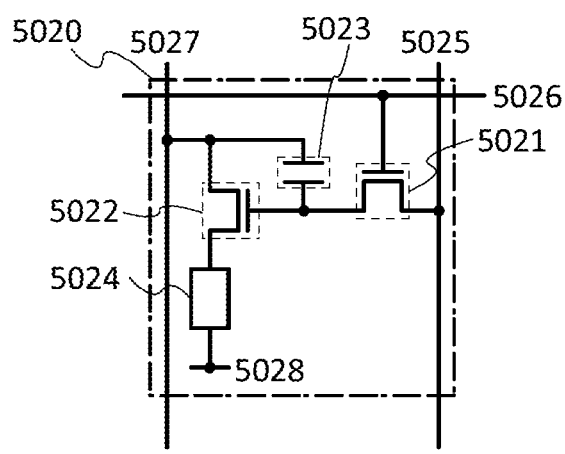

FIG. 34A is a top view of a display device of one embodiment of the present invention. FIG. 34B illustrates a pixel circuit where a liquid crystal element is used for a pixel of a display device of one embodiment of the present invention. FIG. 34C illustrates a pixel circuit where an organic EL element is used for a pixel of a display device of one embodiment of the present invention.

Any of the above-described transistors can be used as a transistor used for the pixel. Here, an example in which an n-channel transistor is used is shown. Note that a transistor manufactured through the same steps as the transistor used for the pixel may be used for a driver circuit. Thus, by using any of the above-described transistors for a pixel or a driver circuit, the display device can have high display quality and/or high reliability.

FIG. 34A illustrates an example of an active matrix display device. A pixel portion 5001, a first scan line driver circuit 5002, a second scan line driver circuit 5003, and a signal line driver circuit 5004 are provided over a substrate 5000 in the display device. The pixel portion 5001 is electrically connected to the signal line driver circuit 5004 through a plurality of signal lines and is electrically connected to the first scan line driver circuit 5002 and the second scan line driver circuit 5003 through a plurality of scan lines. Pixels including display elements are provided in respective regions divided by the scan lines and the signal lines. The substrate 5000 of the display device is electrically connected to a timing control circuit (also referred to as a controller or a control IC) through a connection portion such as a flexible printed circuit (FPC).

The first scan line driver circuit 5002, the second scan line driver circuit 5003, and the signal line driver circuit 5004 are formed over the substrate 5000 where the pixel portion 5001 is formed. Therefore, the display device can be manufactured at cost lower than that in the case where a driver circuit is separately formed. Further, in the case where a driver circuit is separately formed, the number of line connections is increased. By providing the driver circuit over the substrate 5000, the number of line connections can be reduced. Accordingly, the reliability and/or yield can be improved.

[Liquid Crystal Display Device]

FIG. 34B illustrates an example of a circuit configuration of the pixel. Here, a pixel circuit which is applicable to a pixel of a VA liquid crystal display device or the like is illustrated.

This pixel circuit can be used for a structure in which one pixel includes a plurality of pixel electrodes. The pixel electrodes are connected to different transistors, and the transistors can be driven with different gate signals. Accordingly, signals applied to individual pixel electrodes in a multi-domain pixel can be controlled independently.

A gate wiring 5012 of a transistor 5016 and a gate wiring 5013 of a transistor 5017 are separated so that different gate signals can be supplied thereto. In contrast, a source or drain electrode 5014 functioning as a data line is shared by the transistors 5016 and 5017. Any of the above-described transistors can be used as appropriate as each of the transistors 5016 and 5017. Thus, the liquid crystal display device can have high display quality and/or high reliability.

A first pixel electrode is electrically connected to the transistor 5016 and a second pixel electrode is electrically connected to the transistor 5017. The first pixel electrode and the second pixel electrode are separated. There is no specific limitation on the shapes of the first electrode and the second electrode. For example, the first pixel electrode has a V shape.

A gate electrode of the transistor 5016 is electrically connected to the gate wiring 5012, and a gate electrode of the transistor 5017 is electrically connected to the gate wiring 5013. When different gate signals are supplied to the gate wiring 5012 and the gate wiring 5013, operation timings of the transistor 5016 and the transistor 5017 can be varied. As a result, alignment of liquid crystals can be controlled.

Furthermore, a capacitor may be formed using a capacitor wiring 5010, a gate insulator functioning as a dielectric, and a capacitor electrode electrically connected to the first pixel electrode or the second pixel electrode.

The pixel structure is a multi-domain structure in which a first liquid crystal element 5018 and a second liquid crystal element 5019 are provided in one pixel. The first liquid crystal element 5018 includes the first pixel electrode, a counter electrode, and a liquid crystal layer therebetween.

The second liquid crystal element 5019 includes the second pixel electrode, the counter electrode, and the liquid crystal layer therebetween.

Note that a pixel circuit of the display device of one embodiment of the present invention is not limited to that shown in FIG. 34B. For example, a switch, a resistor, a capacitor, a transistor, a sensor, a logic circuit, or the like may be added to the pixel shown in FIG. 34B.

[Organic EL Panel]

FIG. 34C illustrates another example of a circuit configuration of the pixel. Here, a pixel structure of a display device using an organic EL element is shown.

In an organic EL element, by application of voltage to a light-emitting element, electrons are injected from one of a pair of electrodes included in the organic EL element and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. Based on such a mechanism, such a light-emitting element is referred to as a current-excitation type light-emitting element.

FIG. 34C illustrates an example of a pixel circuit. Here, one pixel includes two n-channel transistors. Note that any of the above-described transistors can be used as the n-channel transistors. Further, digital time grayscale driving can be employed for the pixel circuit.

The configuration of the applicable pixel circuit and operation of a pixel employing digital time grayscale driving will be described.

A pixel 5020 includes a switching transistor 5021, a driver transistor 5022, a light-emitting element 5024, and a capacitor 5023. A gate electrode of the switching transistor 5021 is connected to a scan line 5026, a first electrode (one of a source electrode and a drain electrode) of the switching transistor 5021 is connected to a signal line 5025, and a second electrode (the other of the source electrode and the drain electrode) of the switching transistor 5021 is connected to a gate electrode of the driver transistor 5022. The gate electrode of the driver transistor 5022 is connected to a power supply line 5027 through the capacitor 5023, a first electrode of the driver transistor 5022 is connected to the power supply line 5027, and a second electrode of the driver transistor 5022 is connected to a first electrode (a pixel electrode) of the light-emitting element 5024. A second electrode of the light-emitting element 5024 corresponds to a common electrode 5028. The common electrode 5028 is electrically connected to a common potential line provided over the same substrate.

As each of the switching transistor 5021 and the driver transistor 5022, any of the above-described transistors can be used as appropriate. In this manner, an organic EL display device having high display quality and/or high reliability can be provided.

The potential of the second electrode (the common electrode 5028) of the light-emitting element 5024 is set to be a low power supply potential. Note that the low power supply potential is lower than a high power supply potential supplied to the power supply line 5027. For example, the low power supply potential can be GND, 0 V, or the like. The high power supply potential and the low power supply potential are set to be higher than or equal to the forward threshold voltage of the light-emitting element 5024, and the difference between the potentials is applied to the light-emitting element 5024, whereby current is supplied to the light-emitting element 5024, leading to light emission. The forward voltage of the light-emitting element 5024 refers to a voltage at which a desired luminance is obtained, and includes at least forward threshold voltage.

Note that gate capacitance of the driver transistor 5022 may be used as a substitute for the capacitor 5023 in some cases, so that the capacitor 5023 can be omitted. The gate capacitance of the driver transistor 5022 may be formed between the channel formation region and the gate electrode.

Next, a signal input to the driver transistor 5022 is described. In the case of a voltage-input voltage driving method, a video signal for turning on or off the driver transistor 5022 is input to the driver transistor 5022. In order for the driver transistor 5022 to operate in a linear region, voltage higher than the voltage of the power supply line 5027 is applied to the gate electrode of the driver transistor 5022. Note that voltage higher than or equal to voltage which is the sum of power supply line voltage and the threshold voltage $V_{th}$ of the driver transistor 5022 is applied to the signal line 5025.

In the case of performing analog grayscale driving, a voltage higher than or equal to a voltage which is the sum of the forward voltage of the light-emitting element 5024 and the threshold voltage $V_{th}$ of the driver transistor 5022 is applied to the gate electrode of the driver transistor 5022. A video signal by which the driver transistor 5022 is operated in a saturation region is input, so that current is supplied to the light-emitting element 5024. In order for the driver transistor 5022 to operate in a saturation region, the potential of the power supply line 5027 is set higher than the gate potential of the driver transistor 5022. When an analog video signal is used, it is possible to supply current to the light-emitting element 5024 in accordance with the video signal and perform analog grayscale driving.

Note that in the display device of one embodiment of the present invention, a pixel configuration is not limited to that shown in FIG. 34C. For example, a switch, a resistor, a capacitor, a sensor, a transistor, a logic circuit, or the like may be added to the pixel circuit shown in FIG. 34C.

In the case where any of the above-described transistors is used for the circuit shown in FIGS. 34A to 34C, the source electrode (the first electrode) is electrically connected to the low potential side and the drain electrode (the second electrode) is electrically connected to the high potential side. Further, the potential of the first gate electrode may be controlled by a control circuit or the like and the potential described above as an example, e.g., a potential lower than the potential applied to the source electrode, may be input to the second gate electrode.

<Electronic Device>

The semiconductor device of one embodiment of the present invention can be used for display devices, personal computers, image reproducing devices provided with recording media (typically, devices which reproduce the content of recording media such as digital versatile discs (DVDs) and have displays for displaying the reproduced images), or the like. Other examples of electronic devices that can be equipped with the semiconductor device of one embodiment of the present invention are mobile phones, game machines including portable game consoles, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 35A to 35F illustrate specific examples of these electronic devices.

Figure 35A:
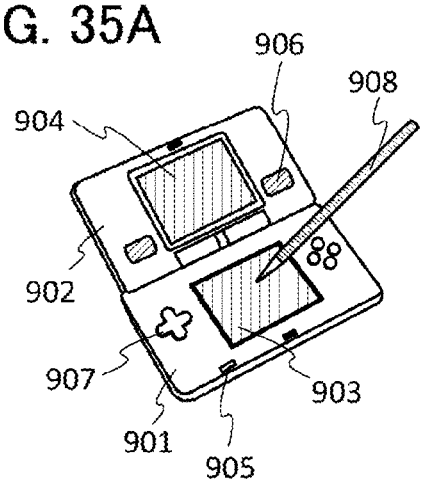
FIGS. 35A to 35F each illustrate an electronic device of one embodiment of the present invention.

FIG. 35A illustrates a portable game console including a housing 901, a housing 902, a display portion 903, a display portion 904, a microphone 905, a speaker 906, an operation key 907, a stylus 908, and the like. Although the portable game machine in FIG. 35A has the two display portions 903 and 904, the number of display portions included in a portable game console is not limited to this.

Figure 35B:
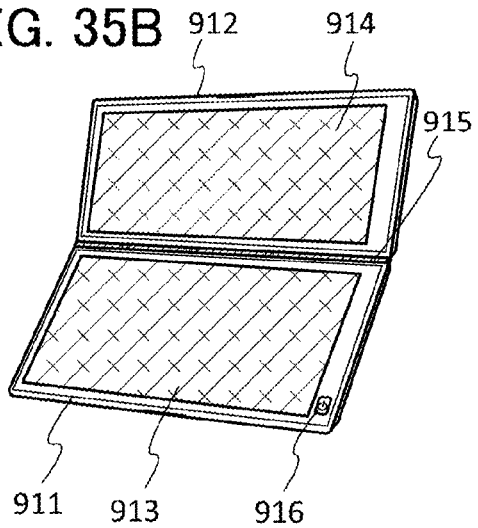

FIG. 35B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched depending on the angle between the first housing 911 and the second housing 912 at the joint 915. A display device with a position input function may be used as at least one of the first display portion 913 and the second display portion 914. Note that the position input function can be added by provision of a touch panel in a display device. Alternatively, the position input function can be added by provision of a photoelectric conversion element called a photosensor in a pixel portion of a display device.

Figure 35C:
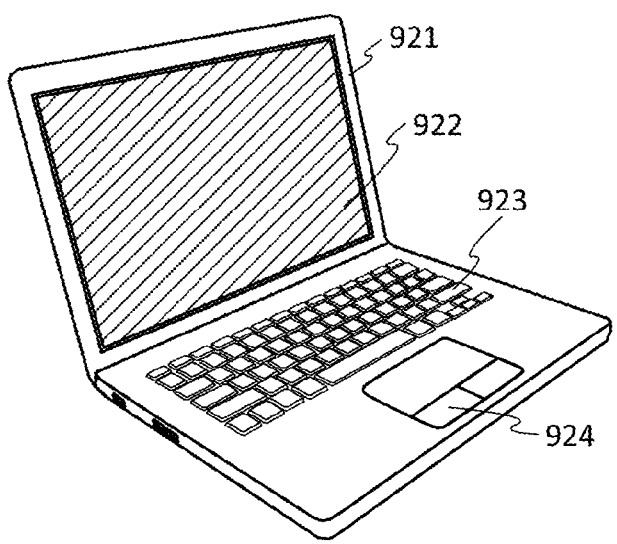

FIG. 35C illustrates a laptop personal computer, which includes a housing 921, a display portion 922, a keyboard 923, a pointing device 924, and the like.

Figure 35D:
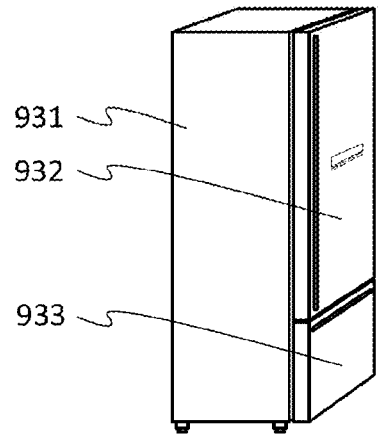

FIG. 35D illustrates an electric refrigerator-freezer including a housing 931, a door for a refrigerator 932, a door for a freezer 933, and the like.

Figure 35E:
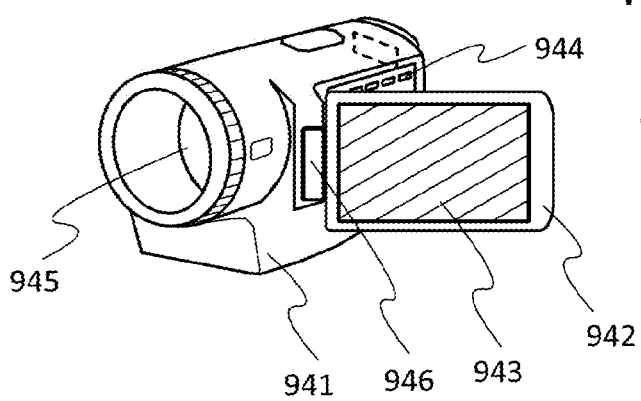

FIG. 35E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. An image displayed on the display portion 943 may be switched in accordance with the angle at the joint 946 between the first housing 941 and the second housing 942.

Figure 35F:
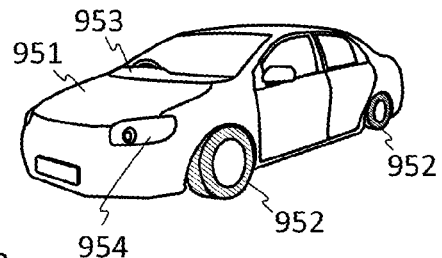

FIG. 35F illustrates an ordinary vehicle including a car body 951, wheels 952, a dashboard 953, lights 954, and the like.

This application is based on Japanese Patent Application serial no. 2015-012200 filed with Japan Patent Office on Jan. 26, 2015, and Japanese Patent Application serial no. 2015-012530 filed with Japan Patent Office on Jan. 26, 2015, the entire contents of which are hereby incorporated by reference.

What is claimed is:

1. A method for manufacturing a semiconductor device, comprising the steps of:
    forming a first insulator;
    forming a second insulator over the first insulator;
    forming an opening reaching the first insulator in the second insulator;
    forming a first conductor over the second insulator and the first insulator; forming a second conductor over the first conductor;
    forming a first conductor layer including the first conductor and the second conductor by removing the second conductor and the first conductor which are positioned above a top surface of the second insulator by chemical mechanical polishing;

forming a third insulator over the second insulator and the first conductor layer;

forming a first oxide semiconductor over the third insulator;

forming a second oxide semiconductor over the first oxide semiconductor;

forming an island-shaped oxide semiconductor layer including the first oxide semiconductor and the second oxide semiconductor by etching part of the first oxide semiconductor and the second oxide semiconductor;

forming a third conductor over the third insulator and the island-shaped oxide semiconductor layer;

forming a second conductor layer including the third conductor by etching part of the third conductor;

forming a fourth insulator over the third insulator and the second conductor layer;

dividing the second conductor layer into a third conductor layer and a fourth conductor layer by forming an opening reaching a surface of the third insulator and an opening reaching a surface of the island-shaped oxide semiconductor layer in the fourth insulator and the second conductor layer;

forming a third oxide semiconductor over the fourth insulator and the island-shaped oxide semiconductor layer;

forming a fifth insulator over the third oxide semiconductor;

forming a fourth conductor over the fifth insulator;

forming a fifth conductor layer including the fourth conductor by etching part of the fourth conductor;

etching part of the fifth insulator;

etching part of the third oxide semiconductor; and forming a sixth insulator over the fourth insulator and the fifth conductor layer, wherein the fifth insulator comprises a region thinner than the third conductor layer and the fourth conductor layer.

2. The method for manufacturing the semiconductor device according to claim 1, further comprising the steps of:

adding oxygen in plasma to the fourth insulator as excess oxygen by forming the sixth insulator over the fourth insulator and the fifth conductor layer;

transferring the excess oxygen to the second oxide semiconductor by heat treatment; and forming a seventh insulator over the sixth insulator.

3. The method for manufacturing the semiconductor device according to claim 1, wherein an amount of oxygen passing through the first conductor is less than an amount of oxygen passing through the second conductor.

4. The method for manufacturing the semiconductor device according to claim 1, further comprising the steps of:

forming a fifth conductor over the third conductor; and forming the second conductor layer by etching part of the third conductor and the fifth conductor, wherein an amount of oxygen passing through the fifth conductor is less than an amount of oxygen passing through the third conductor.

5. The method for manufacturing a semiconductor device according to claim 1, further comprising the steps of:

forming a sixth conductor over the fourth conductor;

forming a seventh conductor under the fourth conductor; and forming the fifth conductor layer by etching part of the fourth conductor, the sixth conductor, and the seventh conductor, wherein an amount of oxygen passing through the sixth conductor is less than an amount of oxygen passing through the fourth conductor, and wherein an amount of oxygen passing through the seventh conductor is less than an amount of oxygen passing through the fourth conductor.

6. The method for manufacturing a semiconductor device according to claim 1, wherein an amount of oxygen passing through the sixth insulator is less than an amount of oxygen passing through the third insulator, the fourth insulator, and the fifth insulator.

7. The method for manufacturing a semiconductor device according to claim 1, wherein a surface of the fourth insulator is planarized by chemical mechanical polishing treatment.

* * * * *